(12) United States Patent
Wang et al.

(10) Patent No.: US 11,644,692 B2
(45) Date of Patent: *May 9, 2023

(54) LOUDSPEAKER

(71) Applicant: SHENZHEN SHOKZ CO., LTD., Guangdong (CN)

(72) Inventors: Yueqiang Wang, Shenzhen (CN); Yongjian Li, Shenzhen (CN); Haofeng Zhang, Shenzhen (CN); Yunbin Chen, Shenzhen (CN); Fen You, Shenzhen (CN); Lei Zhang, Shenzhen (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 90 days.

This patent is subject to a terminal disclaimer.

(21) Appl. No.: 17/170,941

(22) Filed: Feb. 9, 2021

(65) Prior Publication Data

US 2021/0168481 A1    Jun. 3, 2021

Related U.S. Application Data

(63) Continuation of application No. PCT/CN2019/102378, filed on Aug. 24, 2019.

(30) Foreign Application Priority Data

Aug. 24, 2018 (CN) ............ 201810975515.1
Jan. 5, 2019 (CN) ............ 201910009904.3
Jan. 5, 2019 (CN) ............ 201920031804.6

(51) Int. Cl.
*H04R 1/10* (2006.01)
*G02C 11/00* (2006.01)
(Continued)

(52) U.S. Cl.
CPC .......... *G02C 11/10* (2013.01); *G02C 5/14* (2013.01); *G02C 5/22* (2013.01); *G02C 5/2254* (2013.01);
(Continued)

(58) Field of Classification Search
CPC . H04R 1/02; H04R 1/028; H04R 1/04; H04R 1/06; H04R 1/10; H04R 1/1008;
(Continued)

(56) References Cited

U.S. PATENT DOCUMENTS 4,902,120 A    2/1990  Weyer
7,289,767 B2  10/2007  Lai
(Continued)

FOREIGN PATENT DOCUMENTS

CN    2639920 Y     9/2004
CN  102141688 A     8/2011
(Continued)

OTHER PUBLICATIONS

International Search Report in PCT/CN2019/102394 dated Nov. 28, 2019, 8 pages.
(Continued)

*Primary Examiner* — Norman Yu
(74) *Attorney, Agent, or Firm* — Metis IP LLC

(57) ABSTRACT

The present disclosure relates to a loudspeaker. The loudspeaker may include an earphone core, an auxiliary function module, and a flexible circuit board. The earphone core may be configured to convert an electric signal into a vibration signal. The auxiliary function module may be configured to receive an auxiliary signal and execute an auxiliary function. The flexible circuit board may be configured to electrically connect to an audio signal wire and an auxiliary signal wire of an external control circuit, and electrically connect the audio signal wire and the auxiliary signal wire with the
(Continued)

earphone core and the auxiliary function module via the flexible circuit board, respectively. The loudspeaker in the present disclosure may simplify the wire routing and improve sound quality.

18 Claims, 23 Drawing Sheets

(51) Int. Cl.
    *G02C 5/22*     (2006.01)
    *H04R 1/02*     (2006.01)
    *H04R 9/06*     (2006.01)
    *H04R 1/06*     (2006.01)
    *H04R 9/02*     (2006.01)
    *G02C 5/14*     (2006.01)
    *G02C 11/06*     (2006.01)
    *H04R 1/28*     (2006.01)
    *H05K 1/02*     (2006.01)
    *H04R 25/00*     (2006.01)
    *H04R 1/04*     (2006.01)
    *H05K 1/18*     (2006.01)

(52) U.S. Cl.
    CPC ............. *G02C 11/06* (2013.01); *H04R 1/02* (2013.01); *H04R 1/028* (2013.01); *H04R 1/04* (2013.01); *H04R 1/06* (2013.01); *H04R 1/10* (2013.01); *H04R 1/1008* (2013.01); *H04R 1/1033* (2013.01); *H04R 1/1041* (2013.01); *H04R 1/1075* (2013.01); *H04R 1/1083* (2013.01); *H04R 1/28* (2013.01); *H04R 9/02* (2013.01); *H04R 9/025* (2013.01); *H04R 9/06* (2013.01); *H04R 25/65* (2013.01); *H05K 1/028* (2013.01); *H05K 1/189* (2013.01); *H04R 2460/13* (2013.01); *H05K 2201/05* (2013.01)

(58) Field of Classification Search
    CPC .. H04R 1/1033; H04R 1/1041; H04R 1/1075; H04R 1/1083; H04R 1/28; H04R 9/02; H04R 9/025; H04R 9/06; H04R 25/65; H04R 2460/13; H05K 1/028; H05K 1/189; H05K 2201/05; G02C 11/10; G02C 5/14; G02C 5/22; G02C 5/2254; G02C 11/06
    USPC .................................... 381/334, 409
    See application file for complete search history.

(56) References Cited

U.S. PATENT DOCUMENTS

| | | | |
|---|---|---|---|
| 9,674,597 B1* | 6/2017 | O'Connell | H04R 5/033 |
| 2003/0060676 A1* | 3/2003 | Ball | H04R 25/606 |
| | | | 600/25 |
| 2005/0275714 A1* | 12/2005 | Ishikawa | A61B 5/117 |
| | | | 348/14.02 |
| 2008/0013041 A1 | 1/2008 | Chou | |
| 2008/0164934 A1* | 7/2008 | Hankey | H01R 13/2428 |
| | | | 439/39 |
| 2008/0240486 A1* | 10/2008 | Garcia | H04R 1/1075 |
| | | | 381/380 |
| 2008/0260188 A1* | 10/2008 | Kim | H04R 7/02 |
| | | | 181/167 |
| 2010/0046783 A1* | 2/2010 | Huang | H04R 1/1075 |
| | | | 381/380 |
| 2011/0200204 A1 | 8/2011 | Horigome et al. | |
| 2011/0293120 A1* | 12/2011 | Kolton | H04R 31/003 |
| | | | 381/184 |
| 2011/0316611 A1* | 12/2011 | Gustavsson | H04R 1/1041 |
| | | | 327/516 |
| 2014/0253867 A1 | 9/2014 | Jiang et al. | |
| 2015/0256918 A1* | 9/2015 | Yuen | H04R 1/1033 |
| | | | 381/378 |
| 2015/0257662 A1 | 9/2015 | Lee et al. | |
| 2016/0234613 A1 | 8/2016 | Westerkull | |
| 2016/0246076 A1 | 8/2016 | Wei | |
| 2016/0286302 A1* | 9/2016 | Huang | H04R 1/1008 |
| 2017/0090201 A1 | 3/2017 | Guo | |
| 2020/0336824 A1 | 10/2020 | Zheng et al. | |
| 2020/0344542 A1 | 10/2020 | Liu et al. | |

FOREIGN PATENT DOCUMENTS

| | | |
|---|---|---|
| CN | 201984240 U | 9/2011 |
| CN | 202364340 U | 8/2012 |
| CN | 203786416 U | 8/2014 |
| CN | 204374548 U | 6/2015 |
| CN | 105007551 A | 10/2015 |
| CN | 204887455 U | 12/2015 |
| CN | 205103503 U | 3/2016 |
| CN | 205301727 U | 6/2016 |
| CN | 205720956 U | 11/2016 |
| CN | 205793159 U | 12/2016 |
| CN | 205961389 U | 2/2017 |
| CN | 206061075 U | 3/2017 |
| CN | 106937221 A | 7/2017 |
| CN | 106954150 A | 7/2017 |
| CN | 106954151 A | 7/2017 |
| CN | 106954153 A | 7/2017 |
| CN | 106974645 A | 7/2017 |
| CN | 206365029 U | 7/2017 |
| CN | 106997107 A | 8/2017 |
| CN | 206387972 U | 8/2017 |
| CN | 206421112 U | 8/2017 |
| CN | 206640748 U | 11/2017 |
| CN | 206920741 U | 1/2018 |
| CN | 107948881 A | 4/2018 |
| CN | 207424414 U | 5/2018 |
| CN | 108391188 A | 6/2018 |
| CN | 207443120 U | 6/2018 |
| CN | 207718105 U | 8/2018 |
| CN | 207720370 U | 8/2018 |
| CN | 108600920 A | 9/2018 |
| CN | 108776393 A | 11/2018 |
| CN | 108845436 A | 11/2018 |
| CN | 108873372 A | 11/2018 |
| CN | 109061902 A | 12/2018 |
| CN | 109495809 A | 3/2019 |
| CN | 208780924 U | 4/2019 |
| CN | 208780925 U | 4/2019 |
| CN | 208780932 U | 4/2019 |
| CN | 208847977 U | 5/2019 |
| CN | 208847981 U | 5/2019 |
| CN | 110022516 A | 7/2019 |
| CN | 209184747 U | 7/2019 |
| CN | 209267805 U | 8/2019 |
| JP | S59161928 A | 9/1984 |
| JP | 2006157318 A | 6/2006 |
| WO | 9623373 A1 | 8/1996 |
| WO | 2006023341 A2 | 3/2006 |
| WO | 2007070508 A2 | 6/2007 |
| WO | 2007133055 A1 | 11/2007 |
| WO | 2015115693 A1 | 8/2015 |

OTHER PUBLICATIONS

International Search Report in PCT/CN2019/102377 dated Dec. 3, 2019, 8 pages.
International Search Report in PCT/CN2019/102378 dated Nov. 6, 2019, 7 pages.
International Search Report in PCT/CN2019/102385 dated Nov. 18, 2019, 6 pages.
International Search Report in PCT/CN2019/102389 dated Nov. 28, 2019, 8 pages.
International Search Report in PCT/CN2019/102396 dated Nov. 27, 2019, 8 pages.

(56) References Cited

OTHER PUBLICATIONS

International Search Report in PCT/CN2019/102395 dated Nov. 27, 2019, 9 pages.
International Search Report in PCT/CN2019/102406 dated Nov. 26, 2019, 7 pages.
International Search Report in PCT/CN2019/102407 dated Nov. 8, 2019, 6 pages.
International Search Report in PCT/CN2019/102408 dated Nov. 6, 2019, 6 pages.
International Search Report in PCT/CN2019/102398 dated Oct. 31, 2019, 6 pages.
International Search Report in PCT/CN2019/102386 dated Nov. 25, 2019, 7 pages.
International Search Report in PCT/CN2019/102390 dated Nov. 22, 2019, 8 pages.
International Search Report in PCT/CN2019/102391 dated Nov. 22, 2019, 8 pages.
Written Opinion in PCT/CN2019/102391 dated Nov. 22, 2019, 12 pages.
Written Opinion in PCT/CN2019/102390 dated Nov. 22, 2019, 10 pages.
Written Opinion in PCT/CN2019/102396 dated Nov. 27, 2019, 10 pages.
Written Opinion in PCT/CN2019/102377 dated Dec. 3, 2019, 9 pages.
Written Opinion in PCT/CN2019/102378 dated Nov. 6, 2019, 13 pages.
Written Opinion in PCT/CN2019/102385 dated Nov. 18, 2019, 11 pages.
Written Opinion in PCT/CN2019/102389 dated Nov. 28, 2019, 9 pages.
Written Opinion in PCT/CN2019/102395 dated Nov. 27, 2019, 10 pages.
Written Opinion in PCT/CN2019/102394 dated Nov. 28, 2019, 9 pages.
Written Opinion in PCT/CN2019/102406 dated Nov. 26, 2019, 12 pages.
Written Opinion in PCT/CN2019/102407 dated Nov. 8, 2019, 10 pages.
Written Opinion in PCT/CN2019/102408 dated Nov. 6, 2019, 12 pages.
Written Opinion in PCT/CN2019/102398 dated Oct. 31, 2019, 9 pages.
Written Opinion in PCT/CN2019/102386 dated Nov. 25, 2019, 12 pages.

* cited by examiner

LOUDSPEAKER

CROSS-REFERENCE TO RELATED APPLICATION

This application is a Continuation of International Application No. PCT/CN2019/102378 filed on Aug. 24, 2019, which claims priority of Chinese Patent Application No. 201810975515.1 filed on Aug. 24, 2018, Chinese Patent Application No. 201910009904.3 filed on Jan. 5, 2019, and Chinese Patent Application No. 201920031804.6 filed on Jan. 5, 2019, the contents of each of which are hereby incorporated by reference in its entirety.

TECHNICAL FIELD

The present disclosure relates to the field of wiring technology of electronic products, and more specifically, relates to wiring of a loudspeaker.

BACKGROUND

With the development of loudspeaker technology, electronic products (e.g., earphones, MP3, etc.) have been widely used. Loudspeakers may have different product forms. For example, a loudspeaker may be integrated on glasses (e.g., sunglasses, swimming glasses, etc.) or fixed inside an ear or near the ear of a user through a special structure (e.g., an ear hook). As the functions of the products become more diverse, there may be more and more internal modules and wiring of the loudspeaker, and the wiring may be more and more complicated. The complicated wiring may greatly occupy an internal space of the product, and an unreasonable wiring distribution may cause wires to affect each other, which may affect the sound quality of the loudspeaker. Therefore, it may be necessary to provide a more efficient wiring technology, so as to simplify the wiring work of the loudspeaker and improve the sound quality of the loudspeaker.

SUMMARY

The present disclosure relates to a loudspeaker. The loudspeaker may include an earphone core, an auxiliary function module, and a flexible circuit board. The earphone core may be configured to convert an electric signal into a vibration signal. The auxiliary function module may be configured to receive an auxiliary signal and execute an auxiliary function. The flexible circuit board may be configured to electrically connect to an audio signal wire and an auxiliary signal wire of an external control circuit, and electrically connect the audio signal wire and the auxiliary signal wire with the earphone core and the auxiliary function module via the flexible circuit board, respectively.

According to some embodiments of the present disclosure, the flexible circuit board may at least include a plurality of first pads and a plurality of second pads. At least one first pad of the plurality of first pads may be electrically connected to the audio signal wire. The at least one first pad may be electrically connected to at least one second pad of the plurality of second pads via a first flexible lead on the flexible circuit board. The at least one second pad may be electrically connected to the earphone core via an external wire. At least another one first pad of the plurality of first pads may be electrically connected to the auxiliary signal wire and the auxiliary function module via a second flexible lead on the flexible circuit board.

According to some embodiments of the present disclosure, the auxiliary function module may be configured to implement one or more functions of an image function, a voice function, an auxiliary control function, and a switch control function. The auxiliary function module may at least include a first auxiliary function module and a second auxiliary function module.

According to some embodiments of the present disclosure, the flexible circuit board may at least include a main circuit board and a first branch circuit board. The first branch circuit board may be connected to the main circuit board away from the main circuit board and extend along one end of the main circuit board. The first auxiliary function module may be disposed on the main circuit board. The second auxiliary function module may be disposed on the first branch circuit board.

According to some embodiments of the present disclosure, a plurality of first pads may be disposed on the main circuit board and a plurality of second pads is disposed on the first branch circuit board.

According to some embodiments of the present disclosure, the flexible circuit board may further include a second branch circuit board. The second branch circuit board may be connected to the main circuit board away from the main circuit board, extend along the other end of the main circuit board, and be spaced apart from the first branch circuit board. The auxiliary function module may further include a third auxiliary function module. The third auxiliary function module may be disposed on the second branch circuit board.

According to some embodiments of the present disclosure, the plurality of first pads may be disposed on the main circuit board. The at least one second pad a plurality of second pads may be disposed on the first branch circuit board. Other second pads of the plurality of second pads may be disposed on the second branch circuit board.

According to some embodiments of the present disclosure, the fixing mechanism may include one or more of glasses, hats, headwear, rear hook, or other headwear products.

According to some embodiments of the present disclosure, the earphone core may include a magnetic circuit component, a vibration component, the external wire, and a bracket. The magnetic circuit component may be configured to provide a magnetic field. The vibration component may include a coil and an inner lead. The coil may be located in the magnetic field. The inner lead may be electrically connected to the coil. The coil may receive an audio current via the inner lead and convert the audio current into a mechanical vibration signal under an action of the magnetic field. The external wire may transmit the audio current to the coil. One end of the external wire may be electrically connected to the second pad and other end of the external wire may be electrically connected to the inner lead. The bracket may accommodate the magnetic circuit component and the vibration component. The bracket may have a wiring groove. The external wire and/or the inner lead line may be disposed inside the wiring groove.

According to some embodiments of the present disclosure, the inner lead and the external wire may be welded to each other. A welding position may be located inside the wiring groove.

According to some embodiments of the present disclosure, the vibration component may further at least include a first vibration transmission component and a second vibration transmission component. The first vibration transmission component may be disposed above the second vibration transmission component. The first vibration transmission component and the second vibration transmission component may form a composite vibration structure stacked up and down to generate at least two resonance peaks. The coil may be fixed under the second vibration transmission component.

According to some embodiments of the present disclosure, the first vibration transmission component may have greater elasticity relative to the second vibration transmission component. A thickness of the first vibration transmission component may be less than a thickness of the second vibration transmission component.

According to some embodiments of the present disclosure, the first vibration transmission component may include a first circular ring and at least two first supporting rods converging toward a center of the first circular ring. The second vibration transmission component may include a second circular ring and at least two second supporting rods converging toward a center of the second circular ring.

According to some embodiments of the present disclosure, the first supporting rod and the second supporting rod may be staggered.

According to some embodiments of the present disclosure, the first vibration transmission component may be made of stainless steel material.

According to some embodiments of the present disclosure, a core housing may be configured to accommodate the earphone core, the auxiliary function module, and the flexible circuit board. A fixing mechanism may be connected with the core housing and configured to support and maintain a position of the core housing. A battery assembly and a control circuit may be disposed in the fixing mechanism.

According to some embodiments of the present disclosure, the earphone core may include a vibration component. The vibration component may be connected to the core housing and configured to transmit the vibration signal to the core housing. The core housing may have a fitting surface in contact with the human body and be configured to press the fitting surface against the human body at a predetermined pressure to transmit the vibration signal to the human body.

According to some embodiments of the present disclosure, the fixing mechanism may include a pair of glasses, a hat, a headwear, a rear hook, and/or other headwear products.

According to some embodiments of the present disclosure, the fixing mechanism may be a rear hook. A rear hook wire may be disposed in the rear hook. One end of the rear hook wire may be electrically connected to the battery assembly and the other end of the rear hook wire may be electrically connected to the control circuit. The fixing mechanism may also include at least one ear hook. One end of the ear hook may be connected to the core housing and the other end of the ear hook may be connected to the rear hook. A plurality of ear hook wires may be disposed in the ear hook. The ear hook wire may include the audio signal wire and the auxiliary signal wire. The audio signal wire and the auxiliary signal wire may be configured to be electrically connected to the control circuit. The control circuit may be electrically connected to the battery assembly through the flexible circuit board to control the closing or opening of the current.

According to some embodiments of the present disclosure, the fixing mechanism may further include a circuit housing. The circuit housing may be disposed between the ear hook and the rear hook for accommodating the battery assembly or the control circuit.

According to some embodiments of the present disclosure, the fixing mechanism may be a pair of glasses. The fixing mechanism may include at least one rotating shaft. The rotating shaft may be configured to connect a glasses frame and a glasses temple. The glasses frame and the glasses temple may be configured to rotate around the rotating shaft. The rotating shaft may include a rotating shaft wiring channel along an axis. A connecting wire may be disposed in the fixing mechanism. The connecting wire may be an electrical connecting wire. The connecting wire may pass through the rotating shaft wiring channel and both ends of the connecting wire may extend into the glasses frame and the glasses temple, respectively.

According to some embodiments of the present disclosure, a control circuit and a battery assembly may be respectively accommodated in the glasses temple on both sides of the glasses. The connecting wires in the glasses frame may be electrically connected to the control circuit and the battery assembly. The connecting wires in the glasses temple may include the audio signal wire and the auxiliary signal wire.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The drawings described herein are used to provide a further understanding of the present disclosure and constitute a part of the present disclosure. The exemplary embodiments of the present disclosure and the description thereof are used to explain the present disclosure, and do not constitute a limitation to the present disclosure. In each figure, the same reference numerals indicate the similar parts.

DETAILED DESCRIPTION

Figure 1:
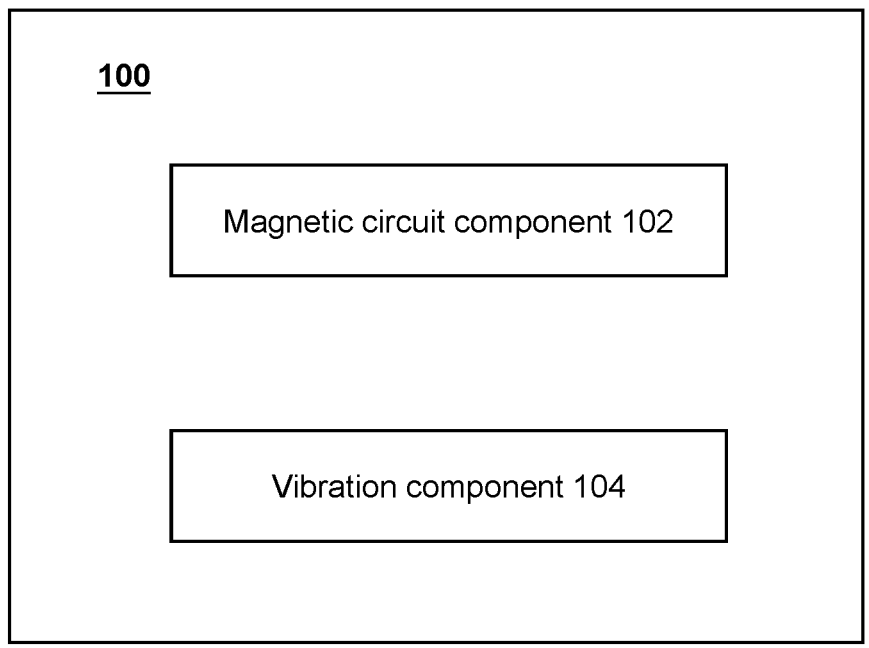
FIG. 1 is a block diagram illustrating a structure of an earphone core according to some embodiments of the present disclosure.

In order to illustrate the technical solutions related to the embodiments of the present disclosure, the drawings used to describe the embodiments are briefly introduced below. Obviously, drawings described below are only some examples or embodiments of the present disclosure. Those skilled in the art, without further creative efforts, may apply the present disclosure to other similar scenarios according to these drawings. It should be understood that the purposes of these illustrated embodiments are only provided to those skilled in the art to practice the application, and not intended to limit the scope of the present disclosure. Unless obviously obtained from the context or the context illustrates otherwise, the same numeral in the drawings refers to the same structure or operation.

As used in the disclosure and the appended claims, the singular forms "a," "an," and "the" may include plural referents unless the content clearly dictates otherwise. In general, the terms "comprise" and "include" merely prompt to include steps and elements that have been clearly identified, and these steps and elements do not constitute an exclusive listing. The methods or devices may also include other steps or elements. The term "based on" is "based at least in part on." The term "one embodiment" means "at least one embodiment;" the term "another embodiment" means "at least one other embodiment." Related definitions of other terms will be given in the description below. In the following, without loss of generality, the "loudspeaker" or "earphone" described in the present disclosure means "loudspeaker" or "earphone" with a loudspeaker component. For those skilled in the art, "loudspeaker" or "earphone" may also be replaced with other similar words, such as "player," "hearing-aid," or the like. In fact, the various implementations in the present disclosure may be easily applied to hearing devices other than the loudspeaker. For those skilled in the art, after understanding the basic principles of loudspeaker, it may be possible to make various modifications and changes in the form and details of the specific methods and operations of implementing loudspeaker without departing from the principles. In particular, an environmental sound collection and processing function may be added to the loudspeaker to enable the loudspeaker to implement the function of a hearing aid. For example, a microphone may collect environmental sounds of a user/wearer, process the sounds using a certain algorithm and transmit the processed sound (or generated electrical signal) to a loudspeaker. That is, the loudspeaker may be modified to include the function of collecting the environmental sounds, and after a certain signal processing, the sound may be transmitted to the user/wearer via the loudspeaker, thereby implementing the function of the hearing aid.

The present disclosure discloses a wiring method for a loudspeaker. In some embodiments, the loudspeaker may include an earphone core, a core housing, and a fixing mechanism. The earphone core may be disposed in the core housing for generating sound signals. The fixing mechanism may be fixedly connected with the core housing for supporting and maintaining a position of the earphone core. The fixing mechanism may include, but is not limited to, one or more of ear hooks, glasses frames, hats, headwear, hearing aids, or other headwear products. The core housing may be fixed at a preset position by a fixing mechanism, so that the sound information generated by the earphone core may be stably transmitted to a human body. In some embodiments, multiple wires may be provided in the fixing mechanism, for example, multiple wires for transmitting signals such as audio signal wires, control wires, power wires, or auxiliary signal wires. In some embodiments, a control circuit and a battery assembly may be disposed on the fixing mechanism. The multiple wires may be electrically connected to the control circuit and the battery assembly. The earphone core may be disposed with inner leads and external wires. An external wire may be a transmission wire electrically connected to other components or wires in the fixing mechanism in the core housing. An inner lead may be a transmission wire that is electrically connected to the external wire on the earphone core to transmit signals to inner mechanism of the earphone core. The loudspeaker may realize the transmission of audio signals, control signals, electric signals, or auxiliary signals through electrical connections of the wires, external wires, and inner leads in the fixing mechanism.

FIG. 1 is a block diagram illustrating a structure of an earphone core according to some embodiments of the present disclosure.

The earphone core 100 may be a kind of energy conversion device, which converts received electric signals into sound. The sound may be transmitted to a human ear through air conduction or bone conduction. In some embodiments, the earphone core 100 may include an electric type (also called a moving coil type) loudspeaker, a moving iron type loudspeaker, a piezoelectric type loudspeaker, a pneumatic type loudspeaker, an electrode type loudspeaker, or a plasma loudspeaker, or the like, or any combination thereof. The earphone core 100 may convert electric signals into sound waves. For example, the earphone core 100 may be an electric type earphone core. A structure of the electric type earphone core may include an electromagnet, a coil, and a diaphragm. The coil may be connected to the diaphragm to drive the diaphragm to vibrate under signal current to generate sound waves.

In some embodiments, the earphone core 100 may at least include a magnetic circuit component 102 and a vibration component 104. The magnetic circuit component 102 may be configured to provide a magnetic field. The vibration component 104 may be configured to convert an electric signal input to the vibration component 104 into a mechanical vibration signal.

In some embodiments, the magnetic circuit component 102 may be configured to provide a magnetic field. The magnetic field may be used to convert a signal containing sound information into a vibration signal. In some embodiments, the sound information may include a video or audio file with a specific data format, data, or files that may be converted into sound through a specific manner. The signal containing sound information may be obtained from a storage component of the earphone core 100 or an external information generation, storage, or transmission system. The signal containing sound information may include an electrical signal, an optical signal, a magnetic signal, a mechanical signal, or the like, or any combination thereof. The signal containing sound information may be obtained from one signal source or a plurality of signal sources. The plurality of signal sources may be related or unrelated. In some embodiments, the earphone core 100 may obtain the signal containing sound information in a variety of different ways. The acquisition of the signal may be wired or wireless, and may be real-time or delayed. For example, the earphone core 100 may receive an electric signal containing sound information in a wired or wireless manner or directly obtain data from a storage medium (e.g., the storage component) to generate a sound signal. As another example, a hearing aid may include a component with a sound collection function, which picks up sounds in the environment, converts mechanical vibrations of the sounds into electric signals, and then obtains electric signals that meet specific requirements after processing the electric signals by an amplifier.

Figure 2:
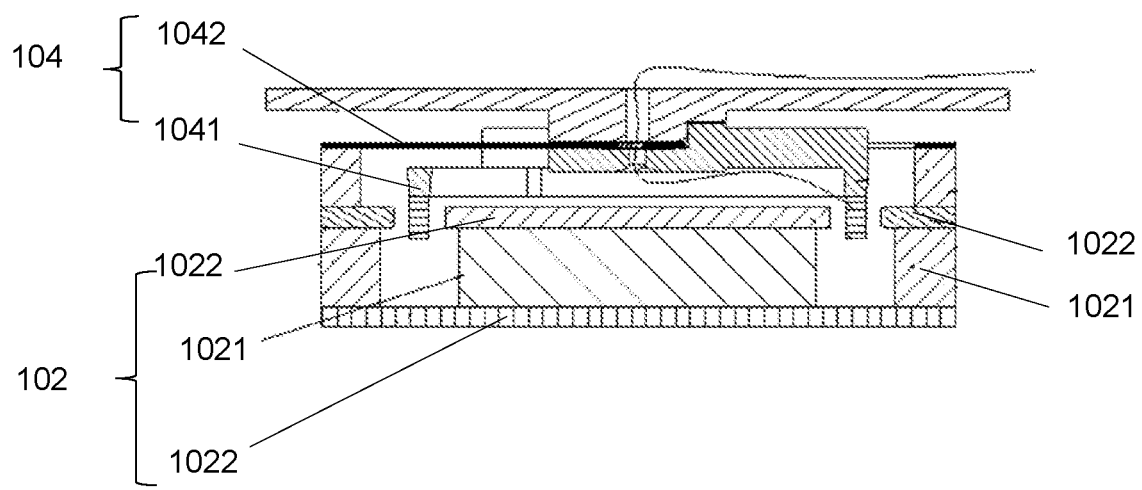
FIG. 2 is a schematic diagram illustrating an internal structure of an earphone core according to some embodiments of the present disclosure.

FIG. 2 is a schematic view illustrating an internal structure of an earphone core according to some embodiments of the present disclosure. As shown in FIG. 2, a magnetic circuit component 102 may include a magnetic element 1021 and a magnetic conductive element 1022. The magnetic element 1021 may refer to an element that generates a magnetic field, such as a magnet. The magnetic element 1021 may have a magnetization direction. The magnetization direction may refer to a direction of the magnetic field inside the magnetic element 1022. The magnetic element 1021 may include one or more magnets. In some embodiments, the magnet may include a metal alloy magnet, a ferrite, etc. The metal alloy magnet may include neodymium iron boron, samarium cobalt, aluminum nickel cobalt, iron-chromium cobalt, aluminum iron boron, iron-carbon aluminum, or the like, or any combination thereof. The ferrite may include barium ferrite, steel ferrite, manganese ferrite, lithium manganese ferrite, or the like, or any combination thereof.

The magnetic conductive element 1022 may be distributed on the upper and lower sides and/or around the magnetic element 1021. In some embodiments, the magnetic conductive element 1022 may be an annular concave structure. In some embodiments, there may be more than one magnetic conductive element 1022, which may be arranged on the upper and lower surfaces of the magnetic element 1021 or the periphery and bottom of the magnetic element 1021. In some embodiments, there may be a magnetic gap between the magnetic element 1021 and the magnetic conductive element 1022. For example, the magnetic conductive element 1022 may surround a sidewall of the magnetic element 1021 and maintain a certain gap with the magnetic element 1021 to form the magnetic gap. In some embodiments, a magnetic conductor may adjust a distribution of a magnetic field (e.g., the magnetic field generated by the magnetic element 1021). The magnetic conductor may include an element processed from soft magnetic materials. In some embodiments, the soft magnetic materials may include metal materials, metal alloys, metal oxide materials, amorphous metal materials, etc., such as iron, iron-silicon alloys, iron-aluminum alloys, nickel-iron alloys, iron-cobalt Series alloy, low carbon steel, silicon steel sheet, silicon steel sheet, ferrite, etc. In some embodiments, the magnetic conductor may be processed by casting, plastic processing, cutting processing, powder metallurgy, or the like, or any combination thereof. The casting may include sand casting, investment casting, pressure casting, centrifugal casting, etc. The plastic processing may include rolling, casting, forging, stamping, extrusion, drawing, or the like, or a combination thereof. The cutting processing may include turning, milling, planning, grinding, etc. In some embodiments, a processing manner of the magnetic conductor may include 3D printing, a computer numerical control (CNC) machine tool, etc.

At least a part of a vibration component 104 may be located in a magnetic field and generate a mechanical vibration. The generation of the mechanical vibration is accompanied by a conversion of energy. The earphone core 100 may use the magnetic circuit component 102 and the vibration component 104 to convert the signal containing sound information to the mechanical vibration. The conversion process may involve a coexistence and conversion of many different types of energy. For example, the electric signal may be directly converted into the mechanical vibration through a transducer to generate sound. As another example, the sound information may be contained in an optical signal and a specific transducer may realize a process of converting the optical signal into a vibration signal. Other types of energy that may be coexisted and converted during a working process of the transducer may include thermal energy, magnetic field energy, etc. An energy conversion mode of the transducer may include a moving coil type, an electrostatic type, a piezoelectric type, a moving iron type, a pneumatic type, an electromagnetic type, etc. A frequency response range and sound quality of the earphone core 100 may be affected by the vibration component 104. For example, in a transducer with the moving coil type, the vibration component 104 may include a wound cylindrical coil 1041 and one or more vibration bodies 1042 (e.g., a vibration plate). The cylindrical coil 1041 driven by a signal current may drive the vibration body 1042 to vibrate and produce sound in a magnetic field. An expansion and contraction of the material of the vibration body 1042, a deformation, size, and shape of folds in the vibration body 1042, a fixing way of the vibration body 1042, and a magnetic density of a permanent magnet, etc., may have a great influence on the sound quality of the earphone core 100. The vibration body 1042 of the vibration component 104 may be a mirror-symmetrical structure, a center-symmetric structure, or an asymmetrical structure. The vibration body 1042 may be disposed with an intermittent hole-like structure to make the vibration body generate larger displacement, which may improve the sensitivity of the loudspeaker and output power of vibration and sound. The vibration body may be a ring or a ring-like structure. A plurality of supporting rods converging to a center of the ring may be disposed in the ring. A count of the plurality of supporting rods may be two or more.

In some embodiments, the earphone core 100 may be an air conduction earphone core. The air conduction earphone core may receive an electric signal and convert the electric signal into a sound that is transmitted to the human ear through the air. In some embodiments, the earphone core 100 may be a bone conduction earphone core. The bone conduction earphone core may be used to receive the electric signal and convert the electric signal into a mechanical vibration signal. The human body may directly receive the mechanical vibration signal and transmit a sound wave through human bones, bone labyrinth, inner ear lymphatic fluid transmission, spiral organs, auditory nerve, and auditory center. The aforementioned vibration component 104 may also convert the electric signal into the mechanical vibration signal in the bone conduction earphone core. In some embodiments, the vibration component 104 may be a composite vibration structure to generate a plurality resonance peaks to improve the sound quality of the bone conduction earphone core.

Figure 3:
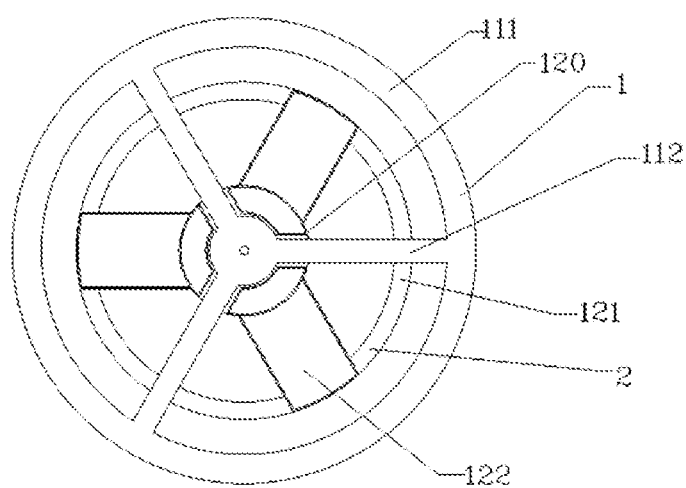
FIG. 3 is a schematic diagram illustrating a structure of a vibration component according to some embodiments of the present disclosure.

FIG. 3 is a schematic diagram illustrating a structure of a vibration component according to some embodiments of the present disclosure. As shown in FIG. 3, in some embodiments, the vibration component 104 may at least include a first vibration transmission component 1 and a second vibration transmission component 2. The first vibration transmission component 1 may be disposed above the second vibration transmission component 2. The vibration transmission component 1 and the second vibration transmission component 2 may form a composite vibration structure stacked up and down to generate two resonance peaks.

In some embodiments, the first vibration transmission component 1 may include a first circular ring 111 and at least two first supporting rods 112 converging toward a center of the first circular ring 111. In some embodiments, the first vibration transmission component may include three first supporting rods 112. The three first supporting rods 112 may converge toward the center of the first circular ring. A convergence center may be fixed to the center of the second vibration transmission component. In some embodiments, the second vibration transmitting member 2 may have a second circular ring 121 and at least two second supporting rods 122 converging toward a center of the second circular ring 121. In some embodiments, a center of the second vibration transmission component has a groove 120. A shape of the groove 120 may match the three first supporting rods, so that the center of the first vibration transmission component may be embedded in the groove. The first vibration transmission component and the second vibration transmission component may be assembled together. In some embodiments, a radius of the second circular ring may be smaller than a radius of the first circular ring. In some embodiments, the second vibration transmission component may have three second supporting rods 122. A second supporting rod may be thicker than a first supporting rod. In some embodiments, the first supporting rods 112 and the second supporting rods 122 may be staggered during assembly. In some embodiments, a first supporting rod 112 and a second supporting rod 122 may be at a certain angle, for example, 30 degrees, 60 degrees, etc., which may not be limited herein.

In some embodiments, a count of the first supporting rods 112 and a count of the second supporting rods 122 may not be limited. For example, when there are two first supporting rods 112, the two first supporting rods 112 may be disposed symmetrically or at a certain angle, for example, the two first supporting rods 112 may be disposed at 90 degrees. In some other embodiments, the first supporting rods 112/second supporting rods 122 may also be configured as four, five, or more spoke structures, which may not be limited herein.

It should be noted that the vibration component of the earphone core 100 may be configured as a structure including a plurality of vibration transmission components or a composite vibration structure formed by a combination of multiple groups of the first vibration transmission component 1 and the second vibration transmission component 2. The multiple groups of the first vibration transmission component 1 and the second vibration transmission component 2 may respectively correspond to different response frequency response ranges, such that the headphone vibration component with full-range, full-frequency response, and high-quality audio may be realized. For example, the composite vibration structure may be a multi-layered vibration structure formed by a plurality of vibration transmission components. The plurality of vibration transmission components may be made of different materials or have different radius and thicknesses. In some embodiments, the more a count of the vibration transmission components in the composite vibration structure, the more resonance peaks are obtained, which makes the frequency response curve more flatter and the sound wider.

In some embodiments, the first vibration transmission component 1 may be an elastic component. An elasticity of the elastic component may be determined by the material, thickness, and structure of the first vibration transmission component 1. In some embodiments, the material of the first vibration transmission component 1 may include, but is not limited to, steel (including but not limited to stainless steel, carbon steel, etc.), light alloy (such as but not limited to aluminum alloy, beryllium copper, magnesium alloy, titanium alloys, etc.), plastics (such as but not limited to high molecular weight polyethylene, blown nylon, engineering plastics, etc.), or other single or composite materials that can achieve the same performance. The composite materials may include, for example, but not limited to, reinforcing materials such as glass fibers, carbon fibers, boron fibers, graphite fibers, graphene fibers, silicon carbide fibers or aramid fibers, or composites of other organic and/or inorganic materials, such as glass fibers reinforced unsaturated polyester, various types of glass fiber reinforced plastic composed of epoxy resin or phenolic resin matrix.

In some embodiments, the first vibration transmission component 1 may be made of stainless steel. When a thickness of the first vibration transmission component 1 is 0.1-0.2 mm and a width of each of three first supporting rods 112 of the first vibration transmission component 1 is 0.5-1.0 mm, a low-frequency resonance peak of the earphone core 100 may be 300-900 Hz. When a width of each of second supporting rods 122 of the second vibration transmission component 2 is 1.6-2.6 mm and a thickness of the second vibration transmission component 2 is 0.8-1.2 mm, a high-frequency resonance peak of the earphone core 100 may be 7500-9500 Hz. The structure of the first vibration transmission component 1 or the second vibration transmission component 2 may be not limited to a structure including three straight rods. As long as the vibration transmission component and the vibration plate have proper flexibility, cross rods, bending rods, or other rod-shaped structures are also suitable. In some embodiments, by changing the material and thickness of the first vibration transmission component 1 and the second vibration transmission component 2, and adjusting the width of the first/second supporting rod 122, low frequency or high frequency resonance peaks of the earphone core 100 satisfying different conditions may be obtained. In some embodiments, a low frequency resonance peak of the earphone core 100 may be 100-1000 Hz. In some embodiments, the low frequency resonance peak of the earphone core 100 may be 100-900 Hz. In some embodiments, the low frequency resonance peak of the earphone core 100 may be 200-800 Hz. In some embodiments, the low frequency resonance peak of the earphone core 100 may be 300-800 Hz. In some embodiments, the low frequency resonance peak of the earphone core 100 may be 400-700 Hz. In some embodiments, a high-frequency resonance peak of the earphone core 100 may be 4000-10000 Hz. In some embodiments, the high-frequency resonance peak of the earphone core 100 may be 4000-9500 Hz. In some embodiments, the high-frequency resonance peak of the earphone core 100 may be 5000-9000 Hz. In some embodiments, the high-frequency resonance peak of the earphone core 100 may be 5500-8000 Hz. In some embodiments, the high-frequency resonance peak of the earphone core 100 may be 6000-7000 Hz. In some embodiments, a frequency difference between the low-frequency resonance peak and the high-frequency resonance peak of the earphone core 100 may be not less than 5000 Hz. In some embodiments, the frequency difference may be not less than 6000 Hz. In some embodiments, the frequency difference may be not less than 7000 Hz. In some embodiments, the frequency difference may be not less than 8000 Hz. In some embodiments, the frequency difference may be not less than 10000 Hz. In some embodiments, the frequency difference may be not less than 12000 Hz.

Figure 4:
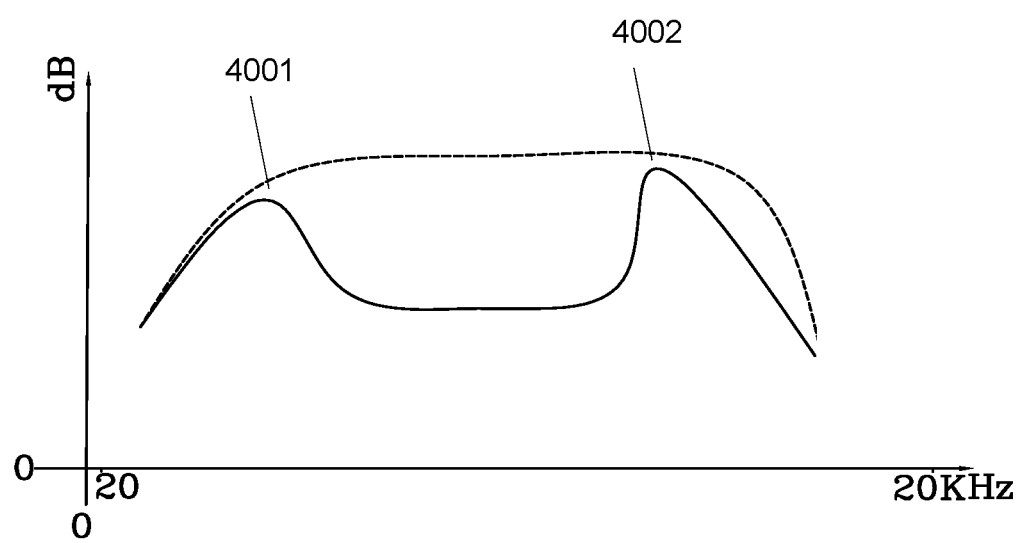
FIG. 4 is a schematic diagram illustrating a frequency response of a composite vibration structure in an earphone core according to some embodiments of the present disclosure.

FIG. 4 is a schematic diagram illustrating a frequency response of a composite vibration structure in an earphone core according to some embodiments of the present disclosure. As shown in FIG. 4, the composite vibration structure composed of the first vibration transmission component 1 and the second vibration transmission component 2 may generate two resonance peaks including a resonance peak 4001 and a resonance peak 4002. A frequency response curve donated as a dashed line in FIG. 4 may be fitted, which is a flat frequency response in an ideal state. A range of these resonance peaks may be within a frequency response range that the ear may hear, which broadens the resonant response range of the loudspeaker, and the ideal sound will be obtained. In some embodiments, positions of the resonance peaks may be changed by adjusting a size and/or material of the first vibration transmission component 1 and the second vibration transmission component 2. For example, the low frequency resonance peak may be located at a position with a lower frequency or the high frequency resonance peak may be located at a position with a higher frequency.

In some embodiments, the earphone core may further include a bracket for fixing a magnetic circuit component 102 and a vibration component 104 on a core housing. In particular, one or more vibration bodies 1042 may be used as the bracket to fix the magnetic circuit component 102 and the vibration component 104 on the core housing. In some embodiments, the earphone core 100 may further include an inner lead. One end of the inner lead may be electrically connected to an external wire and the other end of the inner lead may be electrically connected to a coil in the vibration component 104, which may transmit current containing audio information to the coil. In some embodiments, a wiring groove may be disposed inside the core housing. The external wire and/or the inner lead may be partially disposed in the wiring groove. More details regarding a structure of the wiring groove and a specific connection mean of the external wire and the inner lead may refer to FIGS. 16-19 and relevant descriptions thereof.

Figure 5:
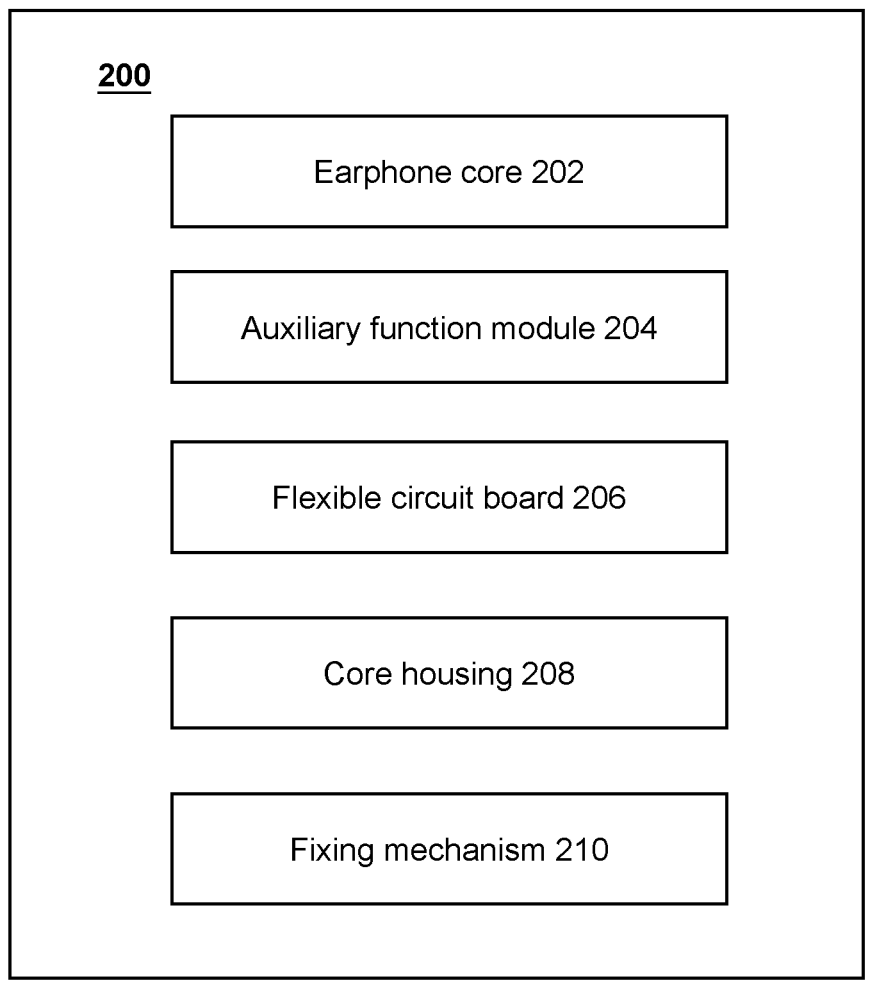
FIG. 5 is a block diagram illustrating a structure of a loudspeaker according to some embodiments of the present disclosure.

FIG. 5 is a block diagram illustrating a structure of a loudspeaker according to some embodiments of the present disclosure.

The loudspeaker 200 may at least include an earphone core 202, an auxiliary function module 204, and a flexible circuit board 206. In some embodiments, the earphone core 202 may have the same or similar structure and function as the earphone core 100. The earphone core 202 may receive audio electric signals and convert the audio electric signals into sound signals. The flexible circuit board 206 may provide electrical connections between different modules/components. For example, the flexible circuit board 206 may provide electrical connections between the earphone core 202, an external control circuit, and the auxiliary function module 204. The flexible circuit board 206 may be a circuit board with a certain flexibility, which may be bent. For example, the flexible circuit board 206 may be a flexible copper clad laminate made of polyimide or polyester film as a substrate.

In some embodiments, the auxiliary function module 204 may be configured to receive auxiliary signals and perform auxiliary functions. The auxiliary function module may be a module different from the earphone core for receiving the auxiliary signals and performing the auxiliary functions. For example, an auxiliary function of the loudspeaker 200 may include receiving sound from a user and/or environment through a microphone and controlling the turn on or turn off of a sound signal through a button. An auxiliary function module corresponding to the auxiliary function of the loudspeaker 200 may include the microphone, the button, etc., which may be set according to actual needs. An auxiliary signal may be an electric signal, an optical signal, an acoustic signal, and a vibration signal related to the auxiliary function, or the like, any combination thereof.

In some embodiments, the auxiliary function module 204 may implement an image function, a voice function, an auxiliary control function, and a switch control function, or the like, any combination thereof. The auxiliary function module may at least include a first auxiliary function module and a second auxiliary function module. The first auxiliary function module and the second auxiliary function module may be disposed at different positions on the loudspeaker, respectively receive the auxiliary signals, and respectively electrically connected to the flexible circuit board 206. In some embodiments, the first auxiliary function module and the second auxiliary function module may be two auxiliary function modules with the same or different functions. For example, the first auxiliary function module and the second auxiliary function module may be two microphones at different positions set in the loudspeaker 200, which are respectively used to collect sounds from the user and/or the environment. As another example, the first auxiliary function module may be the switch control function module for controlling playback of sound signals and the second auxiliary function module may be a voice function module (e.g., a microphone) for receiving and identifying a user and/or ambient sound. For a further example, the first auxiliary function module may be the switch control function module and the second auxiliary function module may be an image function module.

In some embodiments, the auxiliary function module may include an image switching function module. For example, a separate display screen may be disposed in the loudspeaker 200. The display screen may be expanded or contracted, located in front of the eyes, and output images through the image switching function module. As another example, the loudspeaker 200 may be glasses with the earphone core installed and image information may be projected on lenses of the glasses by the image switching function module. In some embodiments, a specific purpose of the image switching function module may include obtaining instructions, processing image creation, image analysis, and displaying graphical interfaces, application interfaces, and various image information signals. For example, when a user sees a building, the image switching function module may receive an instruction from a control unit to display prompt information such as a name and a type of the building to the user. As another example, when the user sees a book, the image switching function module may receive an instruction from the control unit to display price information, evaluation information, etc., of the book to the user. For a further example, the image switching function module may receive an instruction from the control unit to display location information of nearby friends, or messages sent by friends, etc.

In some embodiments, the auxiliary function module may include a sound collection function module, such as a microphone. A specific purpose of the sound collection function module may include collecting voice input signals. The voice input signals may include a user's voice input signal and an environmental noise signal. In some embodiments, the user may be a current user of the loudspeaker. The voice input signals of the user may be a voice input during a voice call, when a voice message is sent, or when a voice command is sent to the loudspeaker. The environmental noise may be any sound other than the user's voice input. For example, the environmental noise may be voices of other people. As another example, the environmental noise may be sounds of vehicles in the environment.

In some embodiments, the auxiliary function module may include other function modules, such as one or more switch control modules on the loudspeaker 200 that are used to control the loudspeaker or peripheral devices. A switch control module may be any button on the loudspeaker 200. In some embodiments, the switch control module on the loudspeaker 200 may include, but is not limited to, a volume adjustment button, a song switching button, an indicator light control button, a power switch, a camera button, a display adjustment button, an application switching button, a browsing page-turning button, and lock screen buttons, etc. In some embodiments, the same switch control module may implement switch control of multiple functions. For example, the same switch control module may implement a volume adjustment control and a browsing page turning control. When the user is reading or browsing text, a volume adjustment button may be used to turn a page.

The loudspeaker 200 may further include a core housing 208 for accommodating the earphone core 202, the auxiliary function module 204, and the flexible circuit board 206. When the loudspeaker 200 is a bone conduction earphone, an inner wall of the core housing 208 may be directly or indirectly connected to the vibration component in the earphone core. When the user wears the bone conduction earphone, an outer wall of the core housing 208 may be in contact with the user and transmit the mechanical vibration of the vibration component to an auditory nerve through a bone, so that the human body may hear the sound.

In some embodiments, the flexible circuit board 206 may be a flexible printed circuit board (FPC) accommodated in the inner space of the core housing 208. The flexible circuit board 206 may have high flexibility and be adapted to the inner space of the core housing 208. Specifically, in some embodiments, the flexible circuit board 206 may include a first board and a second board. The flexible circuit board 206 may be bent at the first board and the second board so as to adapt to a position of the flexible circuit board in the core housing 208, or the like. More details may refer to descriptions in FIGS. 6-10.

In some embodiments, the loudspeaker 200 may transmit the sound through a bone conduction approach. An outer surface of the core housing 208 may have a fitting surface. The fitting surface may be an outer surface of the loudspeaker 200 in contact with the human body when the user wears the loudspeaker 200. The loudspeaker 200 may compress the fitting surface against a preset area (e.g., a front end of a tragus, a position of a skull, or a back surface of an auricle), thereby effectively transmitting the vibration signal (s) to the auditory nerve of the user through the bone and improving the sound quality of the loudspeaker 200. In some embodiments, the fitting surface may be abutted on the back surface of the auricle. The mechanical vibration signal(s) may be transmitted from the earphone core to the core housing and transmitted to the back of the auricle through the fitting surface of the core housing. The vibration signal (s) may then be transmitted to the auditory nerve by the bone near the back of the auricle. In this case, the bone near the back of the auricle may be closer to the auditory nerve, which may have a better conduction effect and improve the efficiency of transmitting the sound to the auditory nerve by the loudspeaker 200.

In some embodiments, the loudspeaker 200 may further include a fixing mechanism 210. The fixing mechanism 210 may be externally connected to the core housing 208 and used to support and maintain the position of the core housing 208. In some embodiments, a battery assembly and a control circuit may be disposed in the fixing mechanism 210. The battery assembly may provide electric energy to any electronic component in the loudspeaker 200. The control circuit may control any function component in the loudspeaker 200. The function component may include, but be not limited to, the earphone core, the button switch, the auxiliary function module, or the like. The control circuit may be connected to the battery and other functional components through the flexible circuit board or the wire.

In some embodiments, the fixing mechanism 210 may be a glasses frame, a hat, a headgear, other headwear accessories, or the like, or any combination thereof. For example, the fixing mechanism 210 may be a glasses frame. A cavity may be formed inside the glasses frame. The cavity may accommodate the battery assembly, the flexible circuit board, and the control circuit. In this case, the earphone core 202 may be located at the end of the glasses temple, which may be located near the ear and provide the sound signal(s) when the user wears the glasses.

Figure 6:
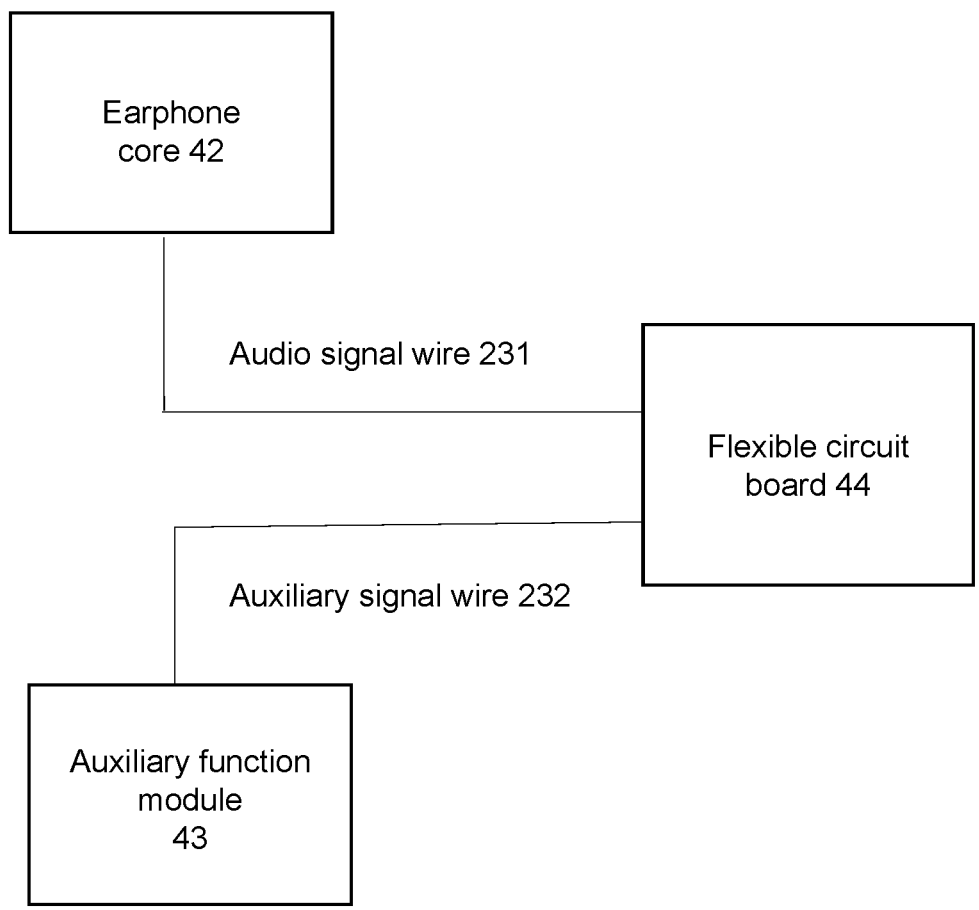
FIG. 6 is a schematic diagram illustrating inner wiring of a loudspeaker according to some embodiments of the present disclosure.
Figure 7:
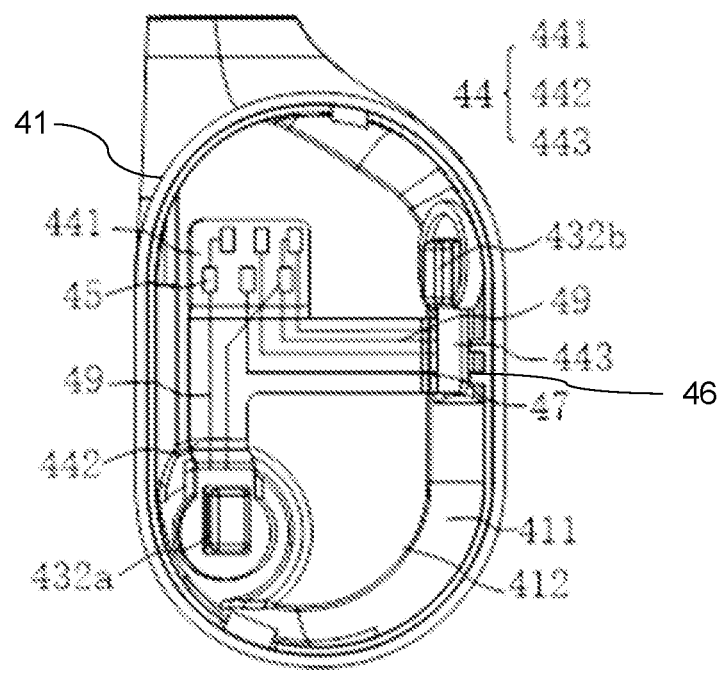
FIG. 7 is a schematic diagram illustrating a structure of a flexible circuit board located inside a core housing according to some embodiments of the present disclosure.
Figure 8:
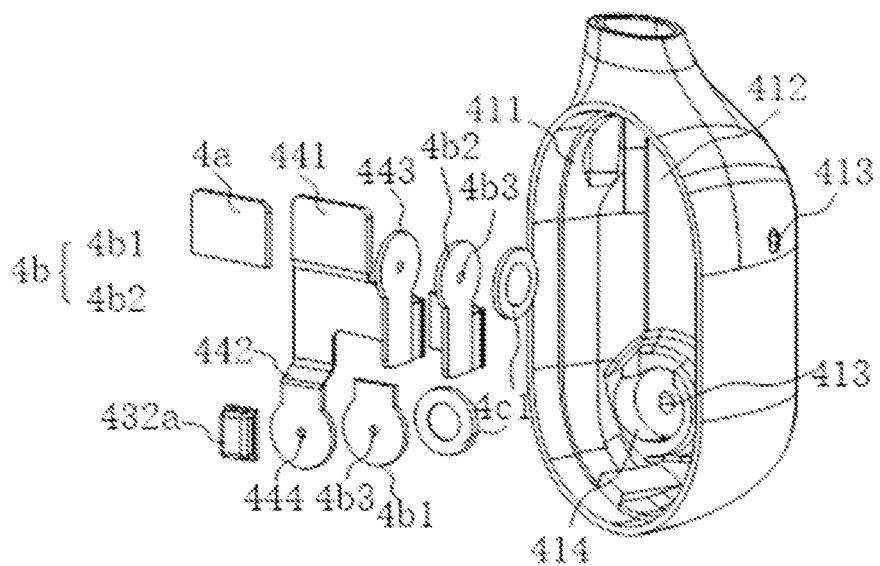
FIG. 8 is an exploded diagram illustrating a partial structure of a loudspeaker according to some embodiments of the present disclosure.
Figure 9:
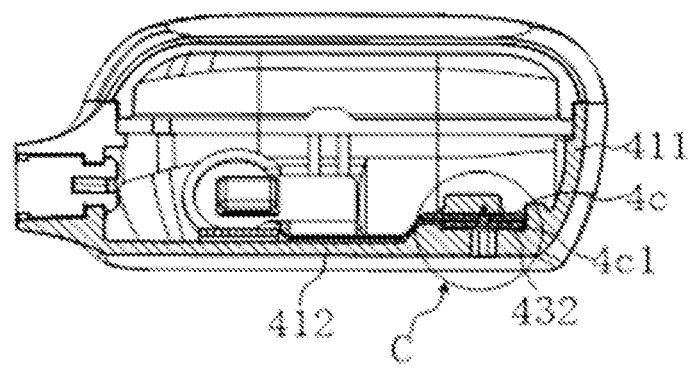
FIG. 9 is a sectional view illustrating a partial structure of a loudspeaker according to some embodiments of the present disclosure.

FIG. 6 is a schematic diagram illustrating inner wiring of a loudspeaker according to some embodiments of the present disclosure. FIG. 7 is a schematic diagram illustrating a structure of a flexible circuit board located inside a core housing according to some embodiments of the present disclosure.

Figure 11:
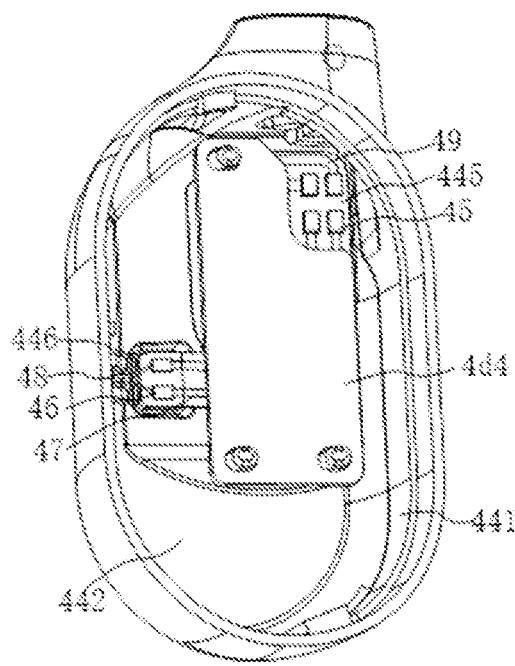
FIG. 11 is a sectional view illustrating a partial structure of a loudspeaker according to some embodiments of the present disclosure.
Figure 12:
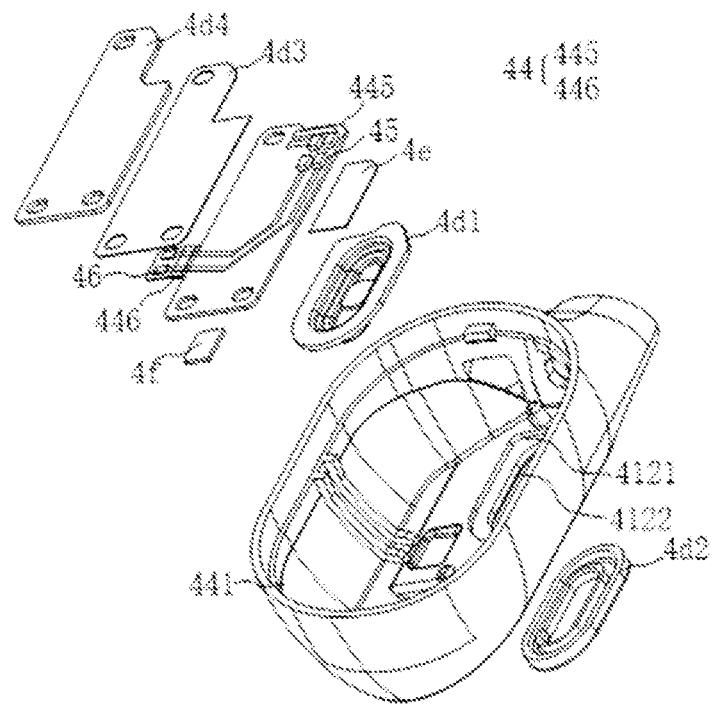
FIG. 12 is an exploded view illustrating a partial structure of a loudspeaker according to some embodiments of the present disclosure.
Figure 13:
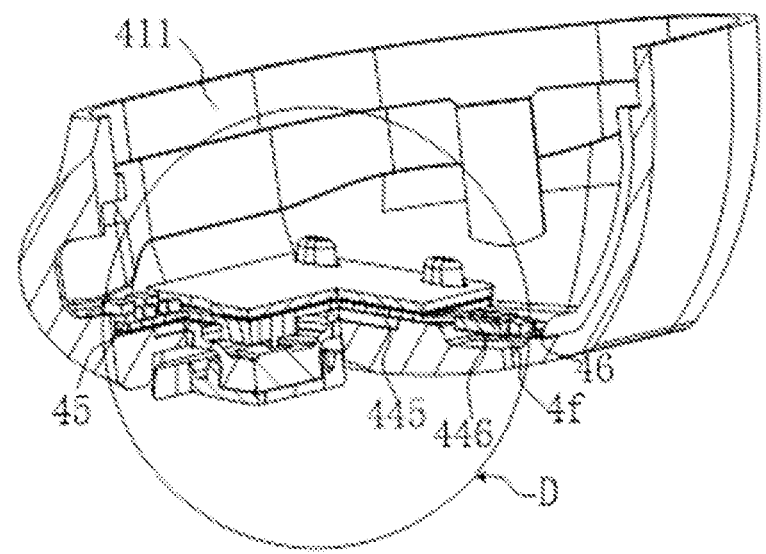
FIG. 13 is a sectional view illustrating a partial structure of a loudspeaker according to some embodiments of the present disclosure.
Figure 14:
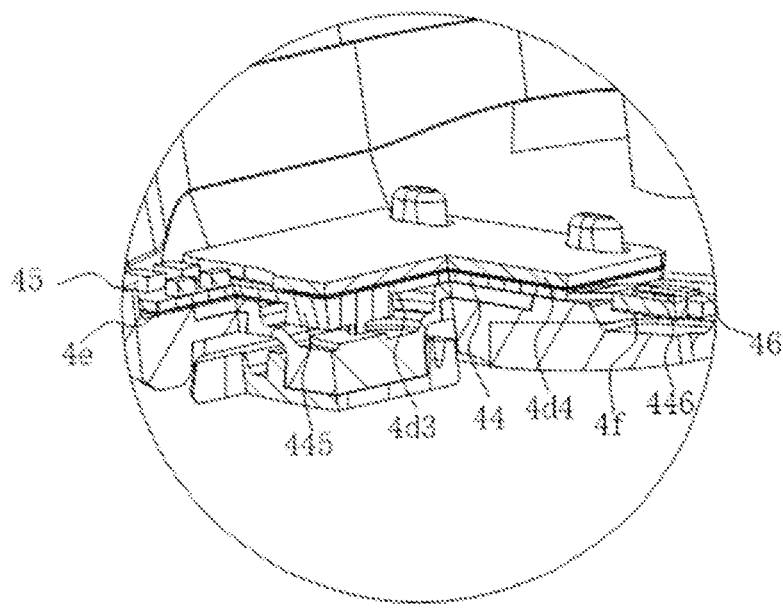
FIG. 14 is an enlarged view illustrating a part D of a loudspeaker in FIG. 12 according to some embodiments of the present disclosure.
Figure 15:
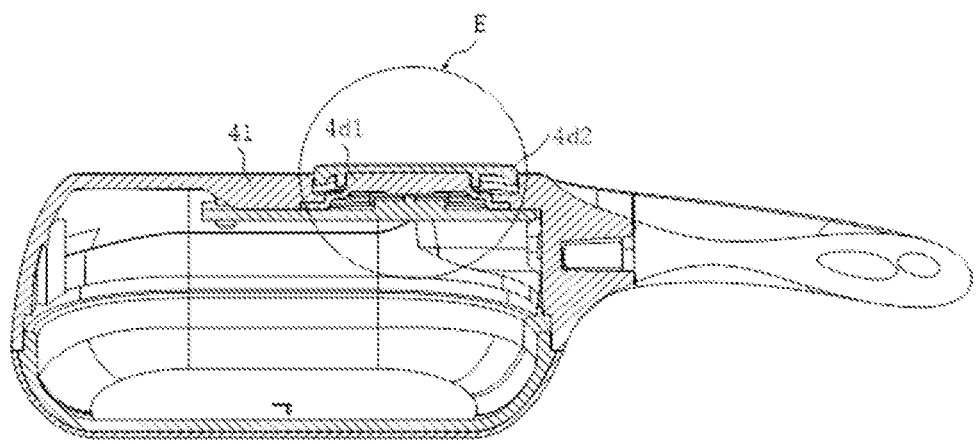
FIG. 15 is a sectional view illustrating a partial structure of a loudspeaker according to some embodiments of the present disclosure.
Figure 16:
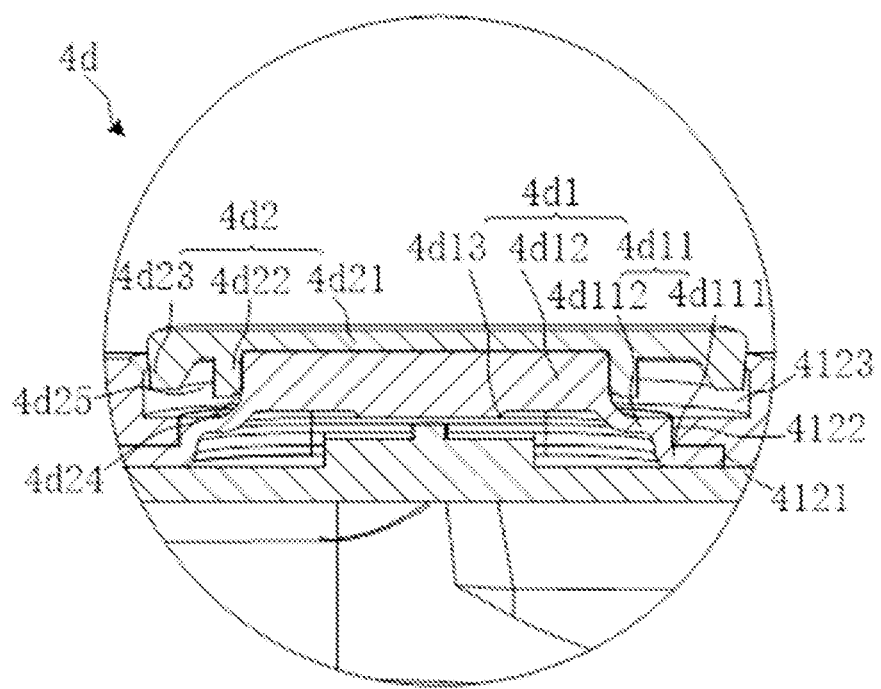
FIG. 16 is an enlarged view illustrating a part E of a loudspeaker in FIG. 14 according to some embodiments of the present disclosure.

In some embodiments, a plurality of pads may be disposed on the flexible circuit board. Different signal wires (e.g., an audio signal wire connected to the control circuit of the loudspeaker, or an auxiliary signal wire) may be electrically connected to different pads through different flexible leads. For example, the audio signal wire may be electrically connected to one pad and the earphone core may be connected to another pad. The two pads may be connected via a flexible lead, which may avoid numerous and complicated internal wires issues, which may occur when both the audio signal wire and other signal wires (e.g., the auxiliary signal wire) need to be connected to the earphone core or the other function modules through an individual wire respectively. As shown in FIGS. 7 and 11, a flexible circuit board 44 may at least include a plurality of first pads 45 and a plurality of second pads 46. The at least one of the first pads 45 may be electrically connected to the auxiliary signal wire 232 (as shown in FIG. 6). The at least first pad 45 may be electrically connected to at least one of the second pads through a first flexible lead 47 on the flexible circuit board 44. The at least one second pad may be electrically connected to an earphone core 42 (as shown in FIG. 6) via an external wire 48 (as shown in FIG. 11). At least another one of the first pads may be electrically connected to an auxiliary signal wire 232 (as shown in FIG. 6). The at least another first pad may be electrically connected to an auxiliary function module via an external wire 48 through a second flexible lead 49 on the flexible circuit board 44. In some embodiments, the at least one first pad 45 may be electrically connected to an auxiliary function module(s) 43 (as shown in FIG. 6). The at least one second pad 46 may be electrically connected to the earphone core 42 through the external wire 48. One of the at least one first pad 45 may be electrically connected to one of the at least one second pad through the first flexible lead 47, so that the external audio signal wire and the auxiliary signal wire may be electrically connected to the earphone core and a plurality of auxiliary function modules at the same time through the flexible circuit board, thereby simplifying a layout of the wiring.

In some embodiments, the audio signal wire(s) may be wire(s) electrically connected to the earphone core and transmitting audio signal(s) to the earphone core. The auxiliary signal wire(s) may be wire(s) electrically connected to the auxiliary function modules and performing signal transmission with the auxiliary function modules.

In some embodiments, as shown in FIG. 7, specifically, the plurality of pads 45 and two pads 46 may be disposed on the flexible circuit board 44. The two pads 46 and the plurality of pads 45 may be located on the same side of the flexible circuit board 44 and spaced apart. The two pads 46 may be connected to two corresponding pads 45 of the plurality of pads 45 through the flexible lead(s) 47 on the flexible circuit board 44. Further, a core housing 41 may also accommodate two external wires 48. One end of each of the external wires 48 may be welded to the corresponding pad 46 and the other end of each of the external wires 48 may be connected to the earphone core 42, so that the earphone core 42 may be connected to the pads 46 through the external wires 48. The auxiliary function modules may be mounted on the flexible circuit board 44 and connected to other pads of the plurality of pads 45 through the flexible lead(s) 49 on the flexible circuit board 44.

In some embodiments, wires may be disposed in the fixing mechanism 210 of the loudspeaker 200. The wires may at least include the audio signal wire(s) and the auxiliary signal wire(s). In some embodiments, there may be multiple wires in the fixing mechanism 210. Such wires may include at least two audio signal wires and at least two auxiliary signal wires. For example, the fixing mechanism 210 may be an ear hook. The ear hook may be connected to the core housing 41. The wires of the ear hook may be wires disposed in the ear hook. One end of a plurality of wires of the ear hook may be directly or indirectly welded to a control circuit board and the other end of the plurality of wires may enter the core housing 41 and be welded to a pad on the flexible circuit board 44.

As used herein, one end of each of the two audio signal wires of the plurality of wires in the ear hook, which may be located in the core housing 41, may be welded to the two pads 45 by two flexible leads 47, and the other end may be directly or indirectly connected to the control circuit board. The two pads 45 may be further connected to the earphone core 42 through the welding of the flexible lead(s) 49 and the two pads 46 and the welding of the two external wires 48 and the pads 46, thereby transmitting the audio signal(s) to the earphone core 42.

One end of each of at least two auxiliary signal wires in the core housing 41 may be welded to the pad 45 by the flexible lead(s) 49, and the other end may be directly or indirectly connected to the control circuit board so as to transmit the auxiliary signal(s) received and transformed by the auxiliary function module(s) to the control circuit 51.

In the approach described above, the flexible circuit board 44 may be disposed in the core housing 41, and the corresponding pads may be further disposed on the flexible circuit board 44. Therefore, the wires 23 may enter the core housing 41 and be welded to the corresponding pads, and further connected to the corresponding auxiliary function module(s) through the flexible leads 47 and the flexible leads 49 on the pads, thereby avoiding a plurality of wires 23 directly connected to the auxiliary function module(s) to make the wiring in the core housing 41 complicated. Therefore, the arrangement of the wirings may be optimized, and the space occupied by the core housing 41 may be saved. In addition, when a plurality of the wires in the ear hook are directly connected to the auxiliary function module(s), a middle portion of the wires in the ear hook may be suspended in the core housing 42 to easily cause vibration, thereby resulting in abnormal sounds to affect the sound quality of the earphone core. According to the approach, the wires in the ear hook may be welded to the flexible circuit board 44 and further connected to the corresponding auxiliary function module(s), which may reduce a situation that the wires are suspended from affecting the quality of the earphone core 42, thereby improving the sound quality of the earphone core 42 to a certain extent.

In some embodiments, the flexible circuit board may be further divided. The flexible circuit board may be divided into at least two regions. One auxiliary function module may be disposed on one of the at least two regions, so that at least two auxiliary function modules may be disposed on the flexible circuit board. Wiring between the audio signal wire(s) and the auxiliary signal wire(s) and the at least two auxiliary function modules and wiring between at least two auxiliary function modules may be implemented through the flexible circuit board. For example, the auxiliary function modules may be welded on pads of two regions. The auxiliary signal wires may be welded with one of the pads and two auxiliary function modules may be electrical connected via a flexible wire of the flexible circuit board. In some embodiments, the flexible circuit board may at least include a main circuit board and a first branch circuit board. The first branch circuit board may be connected to the main circuit board and extend away from the main circuit board along one end of the main circuit board. The auxiliary function module(s) may include at least a first auxiliary function module and a second auxiliary function module. The first auxiliary function module may be disposed on the main circuit board, and the second auxiliary function module may be disposed on the first branch circuit board. The plurality of first pads may be disposed on the main circuit board, and the second pads may be disposed on the first branch circuit board. In some embodiments, the first auxiliary function module may be a button switch. The button switch may be disposed on the main circuit board, and the first pads may be disposed corresponding to the button switch. The second auxiliary function module may be a microphone. The microphone may be disposed on the first branch circuit board, and the second pads corresponding to the microphone may be disposed on the first branch circuit board. The first pads corresponding to the button switch on the main circuit board may be connected to the second pads corresponding to the microphone on the first branch circuit board through the second flexible lead(s). The button switch may be electrically connected to the microphone, so that the button switch may control or operate the microphone.

In some embodiments, the flexible circuit board may further include a second branch circuit board. The second branch circuit board may be connected to the main circuit board. The second branch circuit board may extend away from the main circuit board along the other end of the main circuit board and be spaced from the first branch circuit board. The auxiliary function module(s) may further include a third auxiliary function module. The third auxiliary function module may be disposed on the second branch circuit board. The plurality of first pads may be disposed on the main circuit board. At least one of the second pads may be disposed on the first branch circuit board, and the other second pads may be disposed on the second branch circuit. In some embodiments, the third auxiliary function module may be a second microphone. The second branch circuit board may extend perpendicular to the main circuit board. The second microphone may be mounted on the end of the second branch circuit board away from the main circuit board. The number of pads may be disposed at the end of the main circuit board away from the second branch circuit board.

Figure 10:
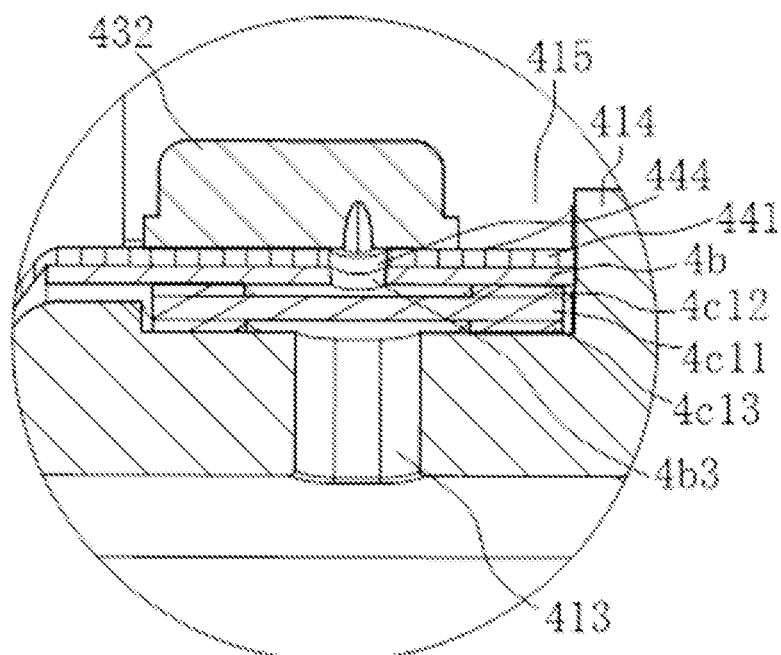
FIG. 10 is an enlarged view illustrating a part C of a loudspeaker in FIG. 8 according to some embodiments of the present disclosure.

Specifically, as shown in FIG. 7 and FIG. 10, the second auxiliary function module may be the first microphone 432a. The third auxiliary function module may be the second microphone 432b. As used herein, the first microphone 432a and the second microphone 432b may both be MEMS (micro-electromechanical system) microphone, which may have a small working current, relatively stable performance, and high voice quality. The two microphones 432 may be disposed at different positions of the flexible circuit board 44 according to actual needs.

As used herein, the flexible circuit board 44 may include a main circuit board 441, and a branch circuit board 442, and a branch circuit board 443 connected to the main circuit board 441. The branch circuit board 442 may extend in the same direction as the main circuit board 441. The first microphone 432a may be mounted on one end of the branch circuit board 442 away from the main circuit board 441. The branch circuit board 443 may extend perpendicular to the main circuit board 441. The second microphone 432b may be mounted on one end of the branch circuit board 443 away from the main circuit board 441. A plurality of pads 45 may be disposed on the end of the main circuit board 441 away from the branch circuit board 442 and the branch circuit board 443.

In some embodiments, the core housing 41 may include a peripheral side wall 411 and a bottom end wall 412 connected to one end surface of the peripheral side wall 411, so as to form an accommodation space with an open end. As used herein, an earphone core may be disposed in the accommodation space through the open end. The first microphone 432a may be fixed on the bottom end wall 412. The second microphone 432b may be fixed on the peripheral side wall 411.

In the embodiment, the branch circuit board 442 and/or the branch circuit board 443 may be appropriately bent to suit a position of a sound inlet corresponding to the microphone 432 on the core housing 41. Specifically, the flexible circuit board 44 may be disposed in the core housing 41 in a manner that the main circuit board 441 is parallel to the bottom end wall 412. Therefore, the first microphone 432a may correspond to the bottom end wall 412 without bending the main circuit board 441. Since the second microphone 432b may be fixed on the peripheral side wall 411 of the core housing 41, it may be necessary to bend the second main circuit board 441. Specifically, the branch circuit board 443 may be bent at one end away from the main circuit board 441 so that a board surface of the branch circuit board 443 may be perpendicular to a board surface of the main circuit board 441 and the branch circuit board 442. Further, the second microphone 432b may be fixed at the peripheral side wall 411 of the core housing 41 in a direction facing away from the main circuit board 441 and the branch circuit board 442.

In some embodiments, the first pads 45, the second pads 46, the first microphone 432a, and the second microphone 432b may be disposed on the same side of the flexible circuit board 44. The second pads 46 may be disposed adjacent to the second microphone 432b.

As used herein, the second pads 46 may be specifically disposed at one end of the branch circuit board 443 away from the main circuit board 441 and have the same direction as the second microphone 432b and disposed at intervals. Therefore, the second pads may be perpendicular to the direction of the first pads 45 as the branch circuit board 443 is bent. It should be noted that the branch circuit board 443 may not be perpendicular to the board surface of the main circuit board 441 after being bent, which may be determined according to the arrangement between the peripheral side wall 411 and the bottom end wall 412.

Further, another side of the flexible circuit board 44 may be disposed with a rigid support plate 4a and a microphone rigid support plate 4b for supporting the first pads 45. The microphone rigid support plate 4b may include a rigid support plate 4b1 for supporting the first microphone 432a and a rigid support plate 4b2 for supporting the second pads and the second microphone 432b together.

As used herein, the rigid support plate 4a, the rigid support plate 4b1, and the rigid support plate 4b2 may be mainly used to support the corresponding pads and the microphone 432, and thus may need to have certain strengths. The materials of the three may be the same or different. The specific material may be polyimide film (PI film), or other materials that may provide the strengths, such as polycarbonate, polyvinyl chloride, etc. In addition, the thicknesses of the three rigid support plates may be set according to the strengths of the rigid support plates, and actual strengths required by the first pads 45, the second pads 46, the first microphone 432a, and the second microphone 432b, and be not specifically limited herein.

The rigid support plate 4a, the rigid support plate 4b1, and the rigid support plate 4b2 may be three different regions of an entire rigid support plate, or three independent bodies spaced apart from each other, which may be not specifically limited herein.

In some embodiments, the first microphone 432a and the second microphone 432b may correspond to two microphone components 4c, respectively. In some embodiments, the structures of the two microphone components 4c may be the same. A sound inlet 413 may be disposed on the core housing 41. Further, the bond conduction loudspeaker may be further disposed with an annular blocking wall 414 integrally formed on the inner surface of the core housing 41 at the core housing 41, and disposed at the periphery of the sound inlet 413, thereby defining an accommodation space 415 connected to the sound inlet 413.

Further, a microphone component 4c may further include a waterproof membrane assembly 4c1.

The waterproof membrane assembly 4c1 may be disposed in the accommodation space 415 and covers the sound inlet 413. The microphone rigid support plate 4b may be disposed in the accommodation space 415 and located on one side of the waterproof membrane module 4c1 away from the sound inlet 413, such that the waterproof membrane assembly 4c1 may be pressed on the inner surface of the core housing 41. Further, a sound inlet 4b3 corresponding to the sound inlet 413 may be disposed on the microphone rigid support plate 4b. Further, the microphone 432 may be disposed on one side of the microphone rigid support plate 4b away from the waterproof membrane assembly 4c1 and cover the sound inlet 4b3.

The waterproof membrane assembly 4c1 has the function of waterproof and sound-permeable, and is closely attached to the inner surface of the core housing 41 to prevent liquid outside the core housing 41 from entering the internal of the core housing 41 through the sound inlet 413 and affecting the performance of the microphone 432.

Axial directions of the sound inlet 4b3 and the sound inlet 413 may be overlapped or intersect at a certain angle according to the actual needs of the microphone 432, etc.

The microphone rigid support plate 4b may be disposed between the waterproof membrane assembly 4c1 and the microphone 432. On the one hand, the microphone rigid support plate 4b may press the waterproof membrane assembly 4c1, so that the waterproof membrane assembly 4c1 may be closely attached to the inner surface of the core housing 41. On the other hand, the microphone rigid support plate 4b has a certain strength, so as to support the microphone 432.

Specifically, the material of the microphone rigid support plate 4b may include polyimide film (PI) or other materials capable of supporting strength, such as polycarbonate, polyvinyl chloride, etc. In addition, a thickness of the microphone rigid support plate 4b may be set according to the strength of the microphone rigid support plate 4b and the actual strength required by the microphone 432, which is not specifically limited herein.

In some embodiments, the waterproof membrane assembly 4c1 may include a waterproof membrane main body 4c11 and an annular rubber pad 4c12. The annular rubber pad 4c12 may be disposed on one side of the waterproof membrane body 4c11 facing the microphone rigid support plate 4b, and further disposed on the periphery of the sound inlet 413 and the sound inlet 4b3.

The microphone rigid support plate 4b may be pressed against the annular rubber pad 4c12, so that the waterproof membrane assembly 4c1 and the microphone rigid support plate 4b are adhesively fixed together.

In some embodiments, the annular rubber pad 4c12 may be disposed between the waterproof membrane body 4c11 and the rigid support plate to form a sealed cavity that is connected to the microphone 432 only through the sound inlet 4b3, that is, the connection between the microphone rigid support plates 4b and the waterproof membrane assembly 4c1 does not leave a gap, so that a space around the annular rubber pad 4c12 between the waterproof membrane body 4c11 and the microphone rigid support plate 4b may be isolated from the sound inlet 4b3.

The waterproof membrane body 4c11 may specifically be a waterproof sound-permeable membrane, which is equivalent to a tympanic membrane of a human ear. When external sound enters through the sound inlet 413, the waterproof membrane body 4c11 may vibrate, which causes air pressure in the sealed cavity to change and the microphone 432 to emit sound.

Further, the air pressure in the sealed cavity changes due to the vibration of the waterproof membrane body 4c11. The air pressure needs to be controlled within an appropriate range. If the air pressure is too large or too small, the sound quality will be affected. In some embodiments, a distance between the waterproof membrane body 4c11 and the rigid support plate may be 0.1-0.2 mm, so that the air pressure changes in the sealed cavity caused by the vibration of the waterproof membrane body 4c11 may be within an appropriate range to, thereby improving the sound quality. Specifically, the distance may be 0.1 mm, 0.15 mm, 0.2 mm, etc.

In some embodiments, the waterproof membrane assembly 4c1 may further include an annular rubber pad 4c13 disposed on one side of the waterproof membrane body 4c11 facing the inner surface of the core housing 41 and overlapping with the annular rubber pad 4c12.

In this way, the waterproof membrane assembly 4c1 may be closely attached to the inner surface of the core housing 41 around the sound inlet 413, thereby reducing the loss of sound entering the sound inlet 413 and improving a conversion rate of the conversion from the sound to the vibration of the waterproof membrane body 4c11.

The annular rubber pad 4c12 and the annular rubber pad 4c13 may be double-sided tape, or sealant, etc.

In some embodiments, a sealant may be further coated on the periphery of the annular baffle wall 414 and the microphone 432 to further improve the sealing performance, thereby increasing the sound conversion rate and the sound quality.

In some embodiments, the flexible circuit board 44 may be disposed between a rigid support plate and the microphone 432. A sound input 444 may be disposed at a position corresponding to a sound input 4b3 of the microphone rigid support plate 4b, so that the vibration of the waterproof membrane body 4c11 caused by outside sound passes through the sound input 444 and further affects the microphone 432.

Further, the flexible circuit board 44 may further extend away from the microphone 432, so as to be connected to other functional components or wires to implement corresponding functions. Correspondingly, the microphone rigid support plate 4b may also extend out a distance with the flexible circuit board in a direction away from the microphone 432.

Correspondingly, the annular blocking wall 414 may be disposed with a gap matching the shape of the flexible circuit board 44 to allow the flexible circuit board 44 to extend out of the accommodation space 415. In addition, the gap may be further filled with a sealant to further improve the sealing.

As shown in FIGS. 11-16, the flexible circuit board 44 may include a main circuit board 445 and a branch circuit board 446. The branch circuit board 446 may extend along an extending direction perpendicular to the main circuit board 445. As used herein, the plurality of first pads 45 may be disposed at the end of the main circuit board 445 away from the branch circuit board 446. A button switch may be mounted on the main circuit board 445. The second pads 46 may be disposed at the end of the branch circuit boards 446 away from the main circuit board 445. The first auxiliary function module may be a button switch 431. The second auxiliary function module may be a microphone 432.

In some embodiments, a board surface of the flexible circuit board 44 and the bottom end wall 412 may be disposed in parallel and at intervals, so that the button switch may be disposed towards the bottom end wall 412 of the core housing 41.

Correspondingly, the button switch may be disposed on one side of the flexible circuit board 44 facing the bottom end wall 412. For ease of assembly, the pads 45 and the pads 46 may be disposed on one side of the flexible circuit board 44 away from the bottom end wall 412. Therefore, the pads 45, the pads 46, and the button switch may be respectively disposed on both sides of the flexible circuit board 44. It should be noted that the arrangement between the pads 45 and the pads 46 and the arrangement between the flexible lead 47 and the flexible lead 49 in the embodiments may be the same as the arrangement of the microphone 432 in the above embodiments, which is not be repeated herein.

A rigid support plate 4d3 that is used to support the button switch and keep the pads 45 exposed may be disposed on one side of the main circuit board 445 away from the button switch. A rigid support plate 4e that is used to support the pads 45 and keep the button switch exposed may be disposed on one side of the main circuit board 445 away from the pads 45. A rigid support plate 4f that is used to support the pads 46 may be disposed on one side of the branch circuit board 446 away from the pads 46.

The rigid support plate 4d3, the rigid support plate 4e, and the rigid support plate 4f may be made of the same material. The materials and functions of the rigid support plate 4d3, the rigid support plate 4e, and the rigid support plate 4f may be the same as that of the rigid support plate 4a, rigid support plate 4b1, and rigid support plate 4b2 in the above embodiments. More related details may refer to the above embodiments, which are not be repeated herein. Further, the thickness of the rigid support plate 4d3, the rigid support plate 4e, and the rigid support plate 4f may be determined according to their own strength and the supporting strength required by the corresponding button switch, pads 45, and pads 46.

The button switch 431 and the pads 45 may be disposed at intervals on both sides of the main circuit board 445, respectively. Correspondingly, the rigid support plate 4d3 corresponding to the button switch 431 and the rigid support plate 4e corresponding to the pads 45 may also be respectively disposed on both sides of the main circuit board 445, and further respectively bypass the button switch 431 and the pad 45, so that the rigid support plate 4d3 and the rigid support plate 4e have adjacent edges.

If the adjacent edges of the rigid support plate 4d3 and the rigid support plate 4e are spaced apart on the flexible circuit board 44, only the flexible circuit board 44 is disposed in a space between the adjacent edges. Since the strength of the flexible circuit board 44 is relatively small and the strength of the rigid support plate is relatively high, which makes it easy to break the flexible circuit board 44 when the flexible circuit board 44 in the space is repeatedly bent.

In some embodiments, the projections of the adjacent edges of the rigid support plate 4d3 and the rigid support plate 4e on the flexible circuit board 44 overlap with each other, so that there is no space or only part space between the adjacent edges of the rigid support plate 4d3 and the rigid support plate 4e, thereby reducing the occurrence of the above-mentioned breaking to protect the flexible circuit board 44.

A rigid support plate 4d4 may be further disposed on one side of the rigid support plate 4d3 away from the flexible circuit board 44. The rigidity of the rigid support plate 4d4 may be greater than that of the rigid support plate 4d3.

The rigid support plate 4d3 may correspond to the button switch 431. The button switch 431 is repeatedly pressed by the user during use. Therefore, the button switch 431 needs to be supported with higher strength. In some embodiments, the material of the rigid support plate 4d4 may be stainless steel or other materials with higher strength relative to the material of the rigid support plate 4d3. The rigid support plate 4d3 and the rigid support plate 4d4 may be formed together by hot pressing.

In some embodiments, a recessed area 4121 may be disposed on the inner surface of the core housing 41, specifically on the inner surface of the bottom end wall 412. A button hole 4122 may be disposed in the recessed area 4121 and used to communicate an inner and an outer surface of the core housing 41. The recessed area 4121 is formed by recessing the inner surface of the core housing 41 toward the outside of the core housing 41. The button hole 4122 may be further disposed in a middle part of the recessed area 4121 or other parts of the recessed area 4121 according to actual needs.

Further, the button module 4d may include an elastic bearing 4d1 and a button 4d2.

The elastic bearing 4d1 may include a bearing body 4d11 formed integrally and a support column 4d12. The bearing body 4d11 may be disposed in the recessed area 4121 and fixed to a bottom of the recessed area 4121. The bottom of the recessed area 4121 refers to an inner wall surface of the recessed area 4121 away from the inside of the core housing 41. The support column 4d12 may be disposed on one side of the bearing body 4d11 facing the outside of the core housing 41 and exposed from the button hole 4122.

The elastic bearing 4d1 may be made of a soft material, such as soft rubber, silica gel, etc., which may be the same material as a housing sheath 21 and a housing sheath 31. In order to improve the pressing feel, the button 4d2 may be made of hard plastic and disposed on a part of the support column 4d12 exposing from the button hole 4122. Specifically, the button 4d2 and the support column 4d12 may be fixed together by bonding, injection molding, and elastic abutment.

In the above embodiments, the elastic bearing 4d1 is disposed in the recessed area 4121 and fixed to the bottom of the recessed area 4121, and covers the button hole 4122 from the inner side of the core housing 41 through the bearing body 4d11, which separates the inside of the core housing 41 from the outside, so that the liquid outside the core housing 41 is difficult to enter the inside of the core housing 41 through the button hole 4122, thereby realizing a waterproofing and the protective effect the internal components of the core housing 41.

In some embodiments, the elastic bearing 4d1 may be fixed to the bottom of the recessed area 4121 through the bearing body 4d11 in a pasting manner. Specifically, adhesive, double-sided tape, etc. may be applied between the surface of the bearing body 4d11 facing the outside of the core housing 41 and the bottom of the recessed area 4121, so that the two are stuck together.

In some embodiments, the bearing body 4d11 may be fixed to the bottom of the recessed area 4121 by injection molding. A surface of the bearing body 4d11 facing the outside of the core housing 41 and the bottom of the recessed area 4121 of the core housing 41 may be integrally formed by injection molding, which may be formed by encapsulation. In the embodiments, the elastic bearing 4d1 and the bottom of the recessed area of the core housing 41 are integrally formed by injection molding, which makes the combination between the two stronger, increasing the bonding strength between the two, and improves the sealing of the core housing 41, so that the entire button module 4d is more stable and reliable and the waterproof effect of the core housing 41 is further improved.

In some embodiments, the bearing body 4d11 may include an annular fixing portion 4d111 and an elastic support portion 4d112. The annular fixing portion 4d111 may be disposed around the button hole 4122 and attached to and fixed to the bottom of the recessed area 4121, thereby fixing the elastic bearing 4d1 and the core housing 41 together.

The elastic support portion 4d112 may be connected to an inner ring surface of the annular fixing portion 4d111 and bulge toward the outside of the core housing 41 in a dome shape, so that the top to the bottom thereof has a certain height in a pressing direction of the button 4d2 and a size of the top along a direction perpendicular to the pressing direction is smaller than that of the bottom. The support column 4d12 may be disposed on the top of the elastic support portion 4d112. When the button 4d2 is pressed, the top of the elastic support portion 4d112 is pressed and moves toward a direction close to the bottom of the elastic support portion 4d112. Further, the button 4d2 is driven to move in a direction of the button hole 4122 until the button switch 431 is triggered.

It should be noted that due to an overall structure of the bone conduction loudspeaker is small, the connections between the components of the bone conduction loudspeaker is relatively tight, a pressing stroke between the button 4d2 and the button switch 431 is small, which reduces the touch feeling when the button 4d2 is presses. In the embodiments, since the elastic support portion 4d112 bulge toward the outside of the core housing 41 in the dome shape, a distance between the button 4d2 and the button switch 431 inside the core housing 41 may be increased, and further, the pressing stroke between the button 4d2 and the button switch 431 may be appropriately increased, thereby improving the touch feeling when the user presses the button 4d2.

Specifically, the bottom of the elastic support portion 4d112 may be fixed to the side wall surface of the button hole 4122, so that the top of the elastic support portion 4d112 is exposed from the button hole 4122 and the support column 4d12 disposed at an outer end of elastic support portion 4d112 facing the core housing 41 is completely exposed to the outside of the core housing 41 and further fixed with the button 4d2 on the outside of the core housing 41.

In some embodiments, a recessed area 4123 may be disposed on the outer surface of the core housing 41. The button hole 4122 may be further located in the recessed area 4123. That is, the recessed area 4121 and the recessed area 4123 are respectively located at two ends of the button hole 4122 and penetrated by the button hole 4122. Shapes and sizes of the recessed area 4121 and the recessed area 4123 may be set to be the same or different according to actual requirements. In addition, counts of recessed area 4121 and recessed area 4123 may be the same, which may be determined according to a count of button 4d2, and may be one or more. One or more button holes 4122 may be disposed in each of the recessed area 4121 and the recessed area 4123, which may be not specifically limited herein. In the embodiments, the count of the button 4d2 corresponding to the core housing 41 is one and the button 4d2 corresponds to one recessed area 4121 and one recessed area 4123.

The support column 4d12 is supported by the elastic support portion 4d112 to one side of the button hole 4122 facing the outside of the core housing 41 and located in the recessed area 4123. Further, the button 4d2 is disposed on one side of the elastic support portion 4d112 of the support column 4d12. In the embodiments, by providing the elastic support portion 4d112 and a height of the support column 4d12 along the pressing direction of the button 4d2, the button 4d2 is at least partially sunk in the recessed area 4123, so as to improve a space utilization rate and reduce the space occupied by button module 4d.

In some embodiments, the button 4d2 may include a button body 4d21 and an annular flange 4d22 and an annular flange 4d23 disposed on one side of the button body 4d21. The annular flange 4d22 and the annular flange 4d23 may be specifically disposed on an opposite side of a pressing surface of the button body 4d21.

Specifically, the annular flange 4d22 may be located in a middle area of the button body 4d21, the annular flange 4d23 may be located on an outer edge of the button body 4d21, and both the annular flange 4d22 and the annular flange 4d23 may be formed to protrude toward a direction away from the pressing surface of the button body 4d21, thereby forming a cylindrical accommodation space 4d24 surrounded by the annular flange 4d22 and an annular columnar accommodation space 4d25 surrounded by the annular flange 4d22 and the annular flange 4d23. Protrusion heights of the annular flange 4d22 and the annular flange 4d23 relative to the button body 4d21 may be equal or unequal. In the embodiments, a protrusion height of the annular flange 4d22 relative to the button body 4d21 is greater than a protrusion height of the annular flange 4d23 relative to the button body 4d21.

The support column 4d12 may be inserted inside the annular flange 4d22, that is, the support column 4d12 is accommodated in the accommodation space 4d24. Specifically, the support column 4d12 may be fixed together to the annular flange 4d22 by means of bonding, injection molding, or elastic abutment.

Further, an end surface of the annular flange 4d23 away from the button body 4d21 is sunk in the recessed area 4123, and spaced from the bottom of the recessed area 4123 when the elastic bearing 4d1 is in a natural state.

The bottom of the recessed area 4123 refers to an inner wall surface of the recessed area 4123 facing the inside of the core housing 41. Specifically, when the elastic bearing 4d1 is in a natural state, by pressing the pressing surface of the button 4d2, the top of the elastic support portion 4d112 of the elastic bearing 4d1 moves in a direction toward inside of the core housing 41, and trigger the button switch 431 before an end surface of the annular flange 4d23 away from the button body 4d21 touches the bottom of the recessed area 4123.

In some embodiments, the elastic bearing 4d1 may further include a contact head 4d13 for contacting the button switch 431. The contact head 4d13 may be disposed on the side of the bearing body 4d11 close to the inside of the core housing 41. Specifically, the contact head 4d13 may be disposed in a middle area of an inner wall surface of the top of the elastic support portion 4d112 facing the inside of the core housing 41, and protrude from the inner wall surface toward the inside of the core housing 41.

When the button 4d2 is pressed, the top of the elastic support portion 4d112 of the elastic bearing 4d1 moves in a direction toward the inside of the core housing 41, thereby driving the contact head 4d13 to move toward the button switch 431 inside the core housing 41, so that the button switch 431 is triggered by the contact head 4d13, thereby realizing corresponding functions. In this way, a pressing stroke of the button 4d2 may be reduced according to actual needs.

As described above, the vibration component may include a coil. The external wire may transmit an audio current to the coil in the vibration component. One end of the external wire may be connected to the inner lead of the earphone core, and the other end may be connected to the flexible circuit board of a loudspeaker. The bracket may have a wiring groove. At least a portion of the external wire and/or the inner lead may be disposed in the wiring groove. In some embodiments, the inner lead and the external wire may be welded to each other. A welding position may be located in the wiring groove. The external wire refers to a transmission wire in the core housing located outside the bracket and electrically connected with a wire in a fixing mechanism. The inner lead is a transmission wire located inside the bracket and electrically connected with the external wire to transmit the electrical signal to the coil.

Figure 17:
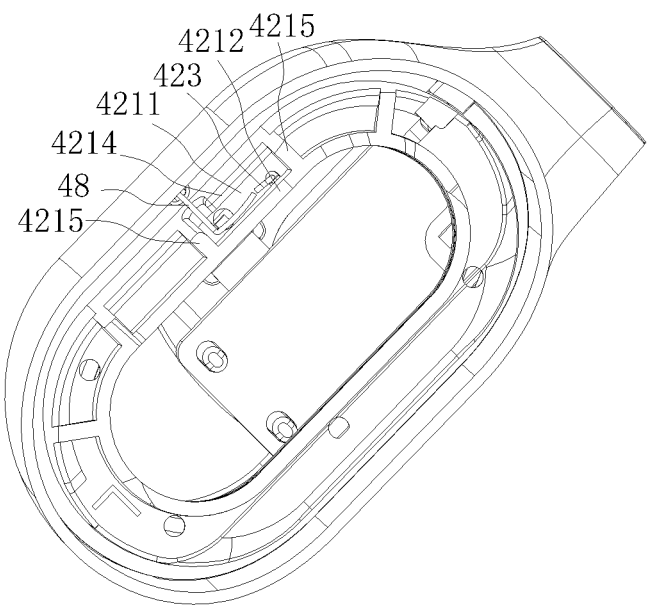
FIG. 17 is a schematic diagram illustrating a partial structure of a loudspeaker according to some embodiments of the present disclosure.
Figure 18:
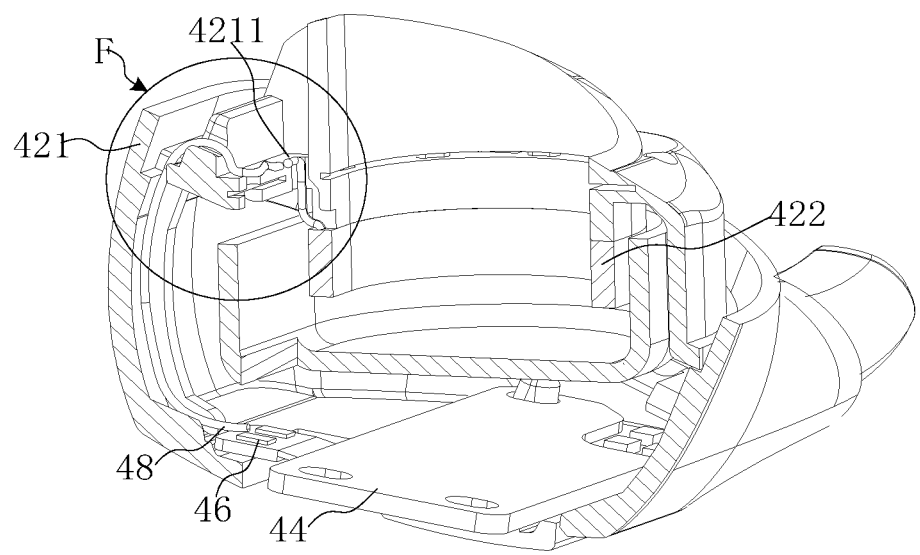
FIG. 18 is a cross-sectional view illustrating a partial structure of a loudspeaker according to some embodiments of the present disclosure.
Figure 19:
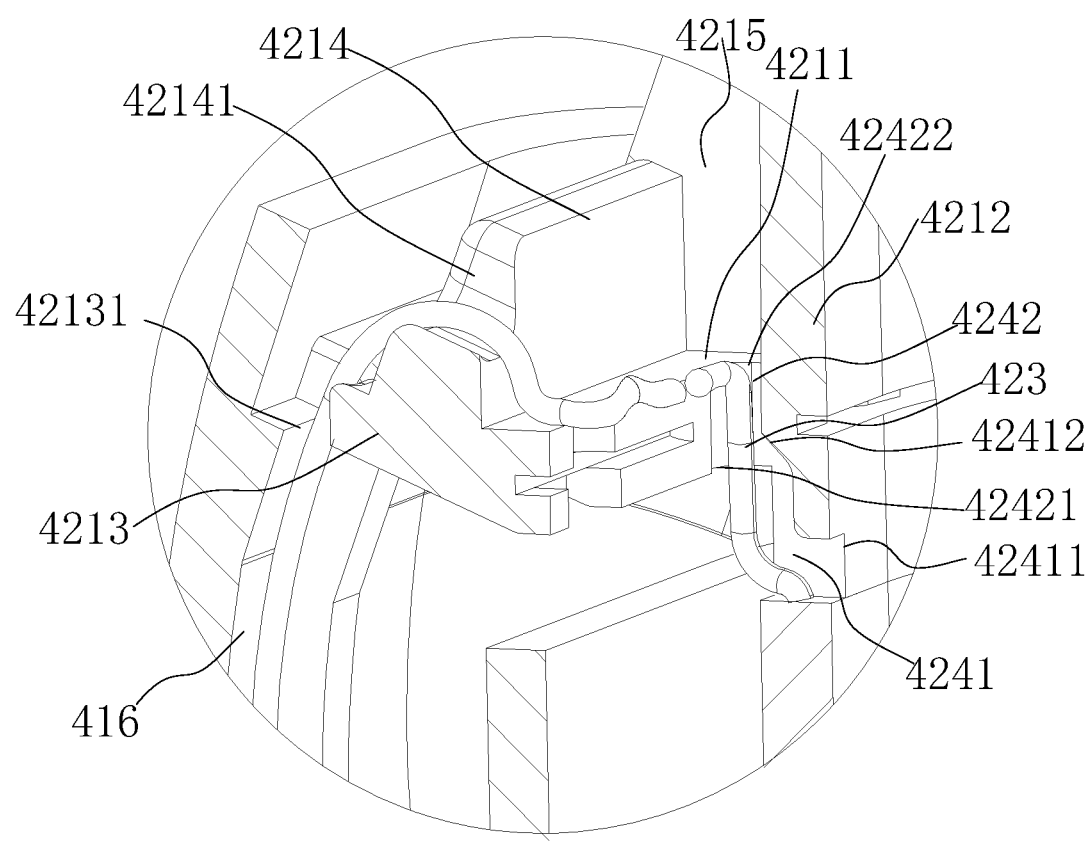
FIG. 19 is an enlarged view illustrating a part F of a loudspeaker in FIG. 17 according to some embodiments of the present disclosure.

Specifically, referring to FIGS. 17-19, an earphone core 42 may include a bracket 421, a coil 422, and an external wire 48. The bracket 421 may be used to support and protect the entire structure of the earphone core 42. In the embodiment, the bracket 421 may be disposed with a wiring groove 4211 used to accommodate a circuit of the earphone core 42.

The coil 422 may be disposed on the bracket 421 and have at least one inner lead 423. The inner lead(s) 423 may be connected to a main circuit in the coil 422 to lead out the main circuit and transmit an audio current to the coil 422 through the inner lead 423.

The external wire 48 may be connected to the inner lead(s) 423. Further, the external wire 48 may be connected to a control circuit 51 to transmit the audio current through the control circuit 51 to the coil 422 through the inner lead 423.

Specifically, during an assembly stage, the external wire 48 and the inner lead(s) 423 may need to be connected together by means of welding, or the like. Due to structural and other factors, after the welding is completed, a length of the wire may not be exactly the same as a length of a channel, and there may be an excess length part of the wire. And if the excess length part of the wire is not disposed reasonably, it may vibrate with the vibration of the coil 422, thereby making an abnormal sound and affecting the sound quality of the earphone core 42.

Further, at least one of the external wire 48 and the inner lead 423 may be wound and disposed in the wiring groove 4211. In an application scenario, the welding position between the inner lead 423 and the external wire 48 may be disposed in the wiring groove 4211, so that a portion of the external wire 48 and the inner lead 423 located near the welding position may be wound in the wiring groove 4211. In addition, in order to maintain stability, the wiring groove 4211 may be further filled with a sealant to further fix the wiring in the wiring groove 4211.

In the manner described above, the wiring groove 4211 may be disposed on the bracket 421, so that at least one of the external wire 48 and the inner lead 423 may be wound into the wiring groove 4211 to accommodate the excess length part of the wire, thereby reducing the vibration generated inside the channel, and reducing the influence of the abnormal sound caused by the vibration on the sound quality of the earphone core.

In some embodiments, the bracket 421 may include an annular main body 4212, a support flange 4213, and an outer blocking wall 4214. As used herein, the annular main body 4212, the support flange 4213, and the outer blocking wall 4214 may be integrally formed.

As used herein, the annular main body 4212 may be disposed inside the entire bracket 421 and used to support the coil 422. Specifically, a cross-section of the annular main body 4212 in a direction perpendicular to the radial direction of a ring of the annular main body 4212 may be consistent with the coil 422. The coil 422 may be disposed at an end of the annular main body 4212 facing the core housing. The inner side wall and the outer side wall of the annular main body 4212 may be flush with the inner side wall and the outer side wall of the coil 422, respectively, so that the inner side wall of the coil 422 and the inner side wall of the annular main body 4212 may be coplanar, and the outer side wall of the coil 422 and the outer side wall of the annular main body 4212 may be coplanar.

Further, the support flange 4213 may protrude on the outer side wall of the annular main body 4212 and extend along the outside of the annular main body 4212.

Specifically, the support flange 4213 may extend outward in a direction perpendicular to the outer side wall of the annular main body 4212. As used herein, the support flange 4213 may be disposed at a position between two ends of the annular main body 4212. In the embodiment, the support flange 4213 may protrude around the outer side wall of the annular main body 4212 to form an annular support flange 4213. In other embodiments, the support flange 4213 may also be formed by protruding at a portion of the outer side wall of the annular main body 4212 according to needs.

The outer blocking wall 4214 may be connected to the support flange 4213 and spaced apart from the annular main body 4212 along the side of the annular main body 4212. As used herein, the outer blocking wall 4214 may be sleeved on the periphery of the annular main body 4212 and/or the coil 422 at intervals. Specifically, the outer blocking wall 4214 may be partially sleeved around the periphery of the annular main body 4212 and the coil 422 according to actual needs, or partially sleeved around the periphery of the annular main body 4212. It should be noted that, in the embodiment, a portion of the outer blocking wall 4214 close to the wiring groove 4211 may be sleeved on a portion of the periphery of the annular main body 4212. Specifically, the outer blocking wall 4214 may be disposed on a side of the support flange 4213 away from the core housing. As used herein, the outer side wall of the annular main body 4212, the side wall of the support flange 4213 away from the core housing, and the inner side wall of the outer blocking wall 4214 may together define the wiring groove 4211.

In some embodiments, a wiring channel 424 may be disposed on the annular main body 4212 and the support flange 4213. The inner lead(s) 423 may extend inside the wiring groove 4211 via the wiring channel 424.

As used herein, the wiring channel 424 may include a sub-wiring channel 4241 on the annular main body 4212 and a sub-wiring channel 4242 on the support flange 4213. The sub-wiring channel 4241 may be disposed through the inner side wall and the outer side wall of the annular main body 4212. A wiring port 42411 communicating with one end of the sub-wiring channel 4241 may be disposed on a side of the annular main body 4212 near the coil 422. A wiring port 42412 communicating with the other end of the sub-wiring channel 4241 may be disposed on a side of the core housing near the support flange 4213 facing the core housing. The sub-wiring channel 4242 may penetrate the support flange 4213 in a direction towards the outside of the core housing. The wiring port 42421 communicating with the end of the sub-wiring channel 4242 may be disposed on a side of the support flange 4213 facing the core housing. The wiring port 42422 communicating with the other end of the sub-wiring channel 4242 may be disposed on a side away from the core housing. As used herein, the wiring port 42412 and the wiring port 42421 may communicate through a space between the support flange 4213 and the annular main body 4212.

Further, the inner lead(s) 423 may enter the wiring port 42411, extend along the sub-wiring channel 4241, exit from the wiring port 42412 to enter a region between the annular main body 4212 and the support flange 4213, further enter the sub-wiring channel 4242 from the wiring port 42421, and extend into the wiring groove 4211 after passing through the wiring port 42422.

In some embodiments, the top of the outer blocking wall 4214 may be disposed with a slot 42141. The external wire 48 may extend inside the wiring groove 4211 through the slot 42141.

As used herein, one end of the external wire 48 may be disposed on the flexible circuit board 44. The flexible circuit board 44 may be specifically disposed on an inner side of the earphone core 42 facing the core housing.

In the embodiment, the support flange 4213 may be further extended to a side of the outer blocking wall 4214 away from the annular main body 4212 to form an outer edge. Further, the outer edge may surround and abut on the inner side wall of the core housing. Specifically, the outer edge of the support flange 4213 may be disposed with a slot 42131, so that the external wire 48 on the inner side of the earphone core 42 facing the core housing may be extended to the outer side of the support flange 4213 facing the core housing through the slot 42131, and then to the slot 42141, and enter the wiring groove 4211 through the slot 42141.

Further, the inner side wall of the core housing may be disposed with a guide groove 416. One end of the guide groove 416 may be located on one side of the flexible circuit board 44 and the other end may communicate with the slot 42131 and extend in a direction towards the outside of the core housing, so that the external wire 48 extends from the flexible circuit board to a second wiring groove 3331 by passing through the guide groove 416.

In some embodiments, the bracket 421 may further include two side blocking walls 4215 spaced along the circumferential direction of the annular main body 4212 and connected to the annular main body 4212, the supporting flange 4213, and the outer blocking wall 4214, thereby defining the wiring groove 4211 between the two side blocking walls 4215.

Specifically, the two side blocking walls 4215 may be oppositely disposed on the support flange 4213 and protrude towards the outer side of the core housing along the support flange 4213. As used herein, a side of the two side blocking walls 4215 facing the annular main body 4212 may be connected to the outer side wall of the annular main body 4212. A side away from the annular main body 4212 may terminate at the outer side wall of the outer blocking wall 4214. The wiring port 42422 and the slot 42141 may be defined between the two side blocking walls 4215. Therefore, the inner lead(s) 423 exiting from the wiring port 42422 and the external wire 48 entering through the slot 42141 may extend into the wiring groove 4211 defined by the two side blocking walls 4215.

Figure 20:
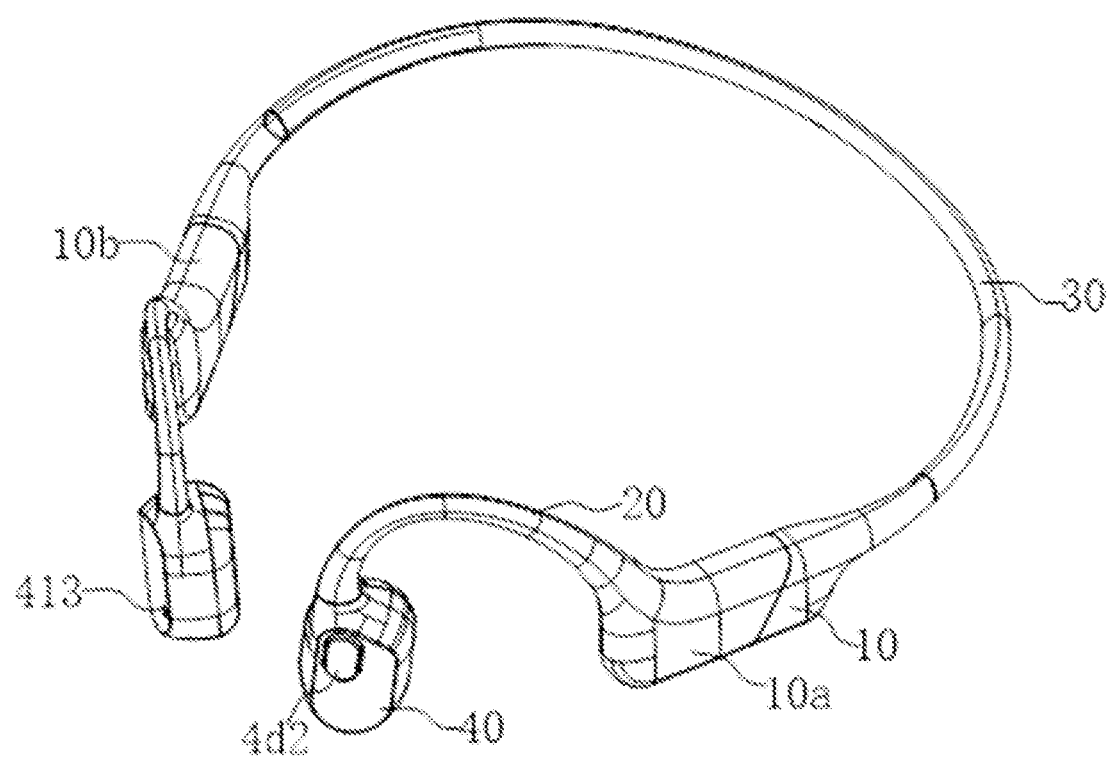
FIG. 20 is a schematic diagram illustrating a structure of a loudspeaker according to some embodiments of the present disclosure.
Figure 21:
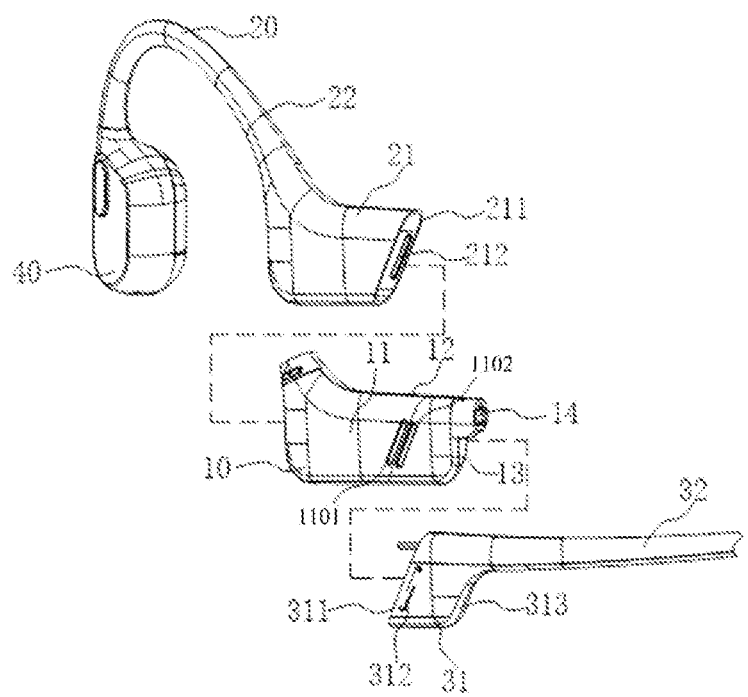
FIG. 21 is an exploded view illustrating a partial structure of a loudspeaker according to some embodiments of the present disclosure.
Figure 22:
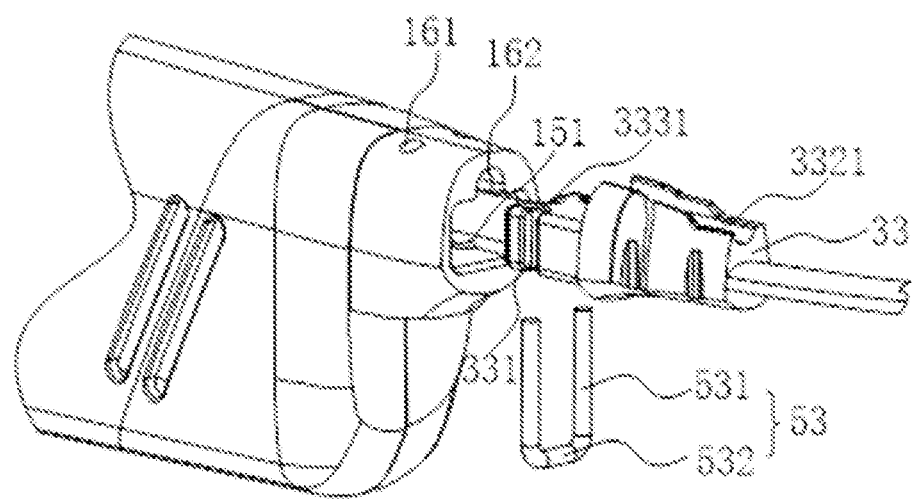
FIG. 22 is an exploded view illustrating a partial structure of a loudspeaker according to some embodiments of the present disclosure.
Figure 23:
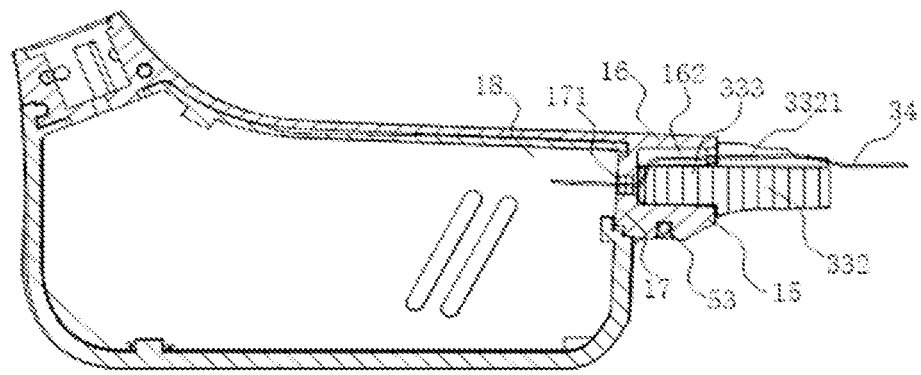
FIG. 23 is a sectional view illustrating a partial structure of a loudspeaker according to some embodiments of the present disclosure.
Figure 24:
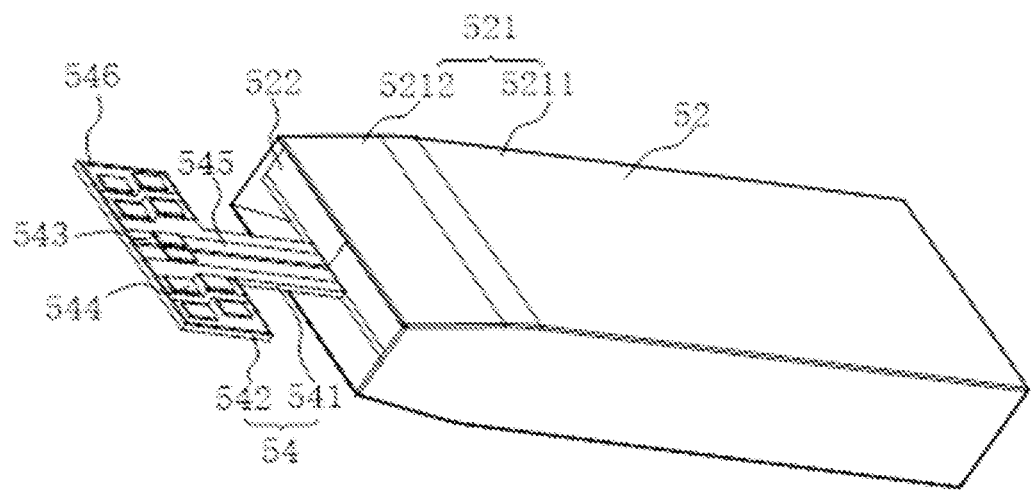
FIG. 24 is a schematic diagram illustrating a battery assembly of a loudspeaker according to some embodiments of the present disclosure.
Figure 25:
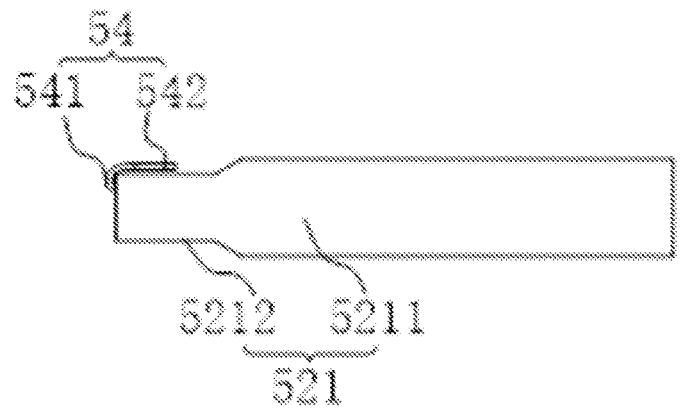
FIG. 25 is a schematic diagram illustrating a battery assembly of a loudspeaker according to some embodiments of the present disclosure.

FIG. 20 is a schematic diagram illustrating a structure of a loudspeaker according to some embodiments of the present disclosure.

As shown in FIG. 20, a fixing mechanism of the loudspeaker may include a rear hook 30 and at least one ear hook 20. One end of the ear hook 20 may be connected to a core housing 40 and the other end of the ear hook 20 may be connected to the rear hook 30. The rear hook 30 may be disposed with a rear hook wire. One end of the rear hook wire may be electrically connected to a battery assembly and the other end of the rear hook may be electrically connected to a control circuit. A plurality of ear hook wires may be disposed in the ear hook. The ear hook wires may include an audio signal wire and an auxiliary signal wire. The audio signal wire and the auxiliary signal wire may be electrically connected to the control circuit. The control circuit may be electrically connected to the battery assembly through a flexible circuit board. The ear hook wire may be electrically connected to the flexible circuit board in the core housing, and further electrically connected to an earphone core and an auxiliary function module through the flexible circuit board.

Specifically, referring to FIGS. 20-26, the loudspeaker may include a circuit housing 10, an ear hook 20, a rear hook 30, a loudspeaker assembly 40, a control circuit 51, a battery 52, etc. The circuit housing 10 may be configured to accommodate the control circuit 51 or the battery 52. The earphone core may be disposed in the core housing 40. The core housing 40 may be connected to the ear hook 20 and configured to accommodate the earphone core. Counts of the circuit housing 10, the core housing 40, and the ear hook 20 may respectively be two that correspond to a left side and a right side of the user, respectively. The core housing 40 and the circuit housing 10 are respectively disposed at both ends of the ear hook 20. The rear hook 30 may be further disposed at one end of the circuit housing 10 away from the ear hook 20.

In some embodiments, a housing sheath 21 may be injection molded on the ear hook 20. Specifically, the ear hook 20 may include a first elastic wire for supporting a shape of the ear hook 20. An ear hook sheath 22 may be injection molded on the periphery of the first elastic metal wire. The ear hook sheath 22 may further form, at a connection of the ear hook 20 and the circuit housing 10, a housing sheath 21 integrally formed with the ear hook sheath 22, that is, the housing sheath 21 may be located on one side of the ear hook sheath 22 facing the circuit housing 10.

Similarly, a housing sheath 31 may be injection molded on the rear hook 30. Specifically, the rear hook 30 may include a second elastic metal wire for supporting a shape of the rear hook 30. A rear hook sheath 32 may be injection molded on the periphery of the second elastic metal wire. The rear hook sheath 32 may further form, at a connection of the rear hook 30 and the circuit housing 10, a housing sheath 31 integrally formed with the rear hook sheath 32, that is, the housing sheath 31 may be located on one side of the rear hook sheath 32 facing the circuit housing 10.

It should be noted that the housing sheath 21, the ear hook sheath 22, the housing sheath 31, and the rear sheath 32 may all be made of soft materials with certain elasticity, such as soft silicone or rubber, etc., to provide better tactility for users to wear.

The circuit housing 10, the housing sheath 21, and the housing sheath 31 may be respectively molded so that a shape of an inner side wall of the housing sheath 21 and a shape of at least part of an outer side wall of the circuit housing 10 close to the ear hook 20 matches. Therefore, after the three are respectively formed, the housing sheath 21 may be sleeved on the periphery of the circuit housing 10 close to the ear hook 20 from one side of the circuit housing 10 facing the ear hook 20, and the housing sheath 31 may be sleeved on the periphery of the circuit housing 10 close to the rear hook 30 from one side of the circuit housing 10 facing the rear hook 30, so that the circuit housing 10 may be covered by the housing sheath 21 and the housing sheath 31 together.

It should be noted that, due to a high ambient temperature when the housing sheath 21 and the housing sheath 31 are molded, the high ambient temperature may cause certain damage to the control circuit 51 or the battery 52 contained in the circuit housing 10. Therefore, in the molding stage, the circuit housing 10, the housing sheath 21, and the housing sheath 31 are molded separately and then fitted together, instead of directly injecting the housing sheath 21 and the housing sheath 31 on the periphery of the circuit housing 10, thereby avoiding the damage to the control circuit 51 or the battery 52 caused by the high ambient temperature during integral injection molding, and reducing adverse effects on the control circuit 51 or the battery 52 during the molding phase.

In some embodiments, the circuit housing 10 may include a main side wall 11, an auxiliary side wall 12, and an end wall 13 connected to each other. The circuit housing 10 may be a flat housing. The flat circuit housing 10 may include the main side wall 11 with a larger area. When the user wears the bone conduction loudspeaker, two opposite main side walls 11 are respectively used to abut on a side wall of a head and a side wall opposite to the side wall and located away from the head. Both the auxiliary side wall 12 and the end wall 13 may be used to connect the two main side walls 11. The auxiliary side wall 12 may include two side walls facing an upper side and a lower side of the user's head when worn by the user. The end wall 13 may include side walls opposite to the circuit housing 10 and respectively close to one end of the ear hook 20 and one end of the rear hook 30. The side walls face a front side and a back side of the user's head when worn by the user. The main side wall 11, the auxiliary side wall 12, and the end wall 13 are connected to each other to form a circuit housing 10.

The housing sheath 21 may include an open end 211. The open end 211 may be sleeved on the circuit housing 10 from one side of the circuit housing 10 facing the ear hook 20, and cover an end wall 13 of circuit housing 10 facing the ear hook 20 and parts of the main side wall 11 and the auxiliary side wall 12 close to the ear hook 20. The housing sheath 31 may include an open end 311. The open end 311 may be sleeved on the circuit housing 10 from one side of the circuit housing 10 facing the rear hook 30, and cover the end wall 13 of the circuit housing 10 facing the rear hook 30 and parts of the main side wall 11 and the auxiliary side wall 12 close to the rear hook 30. In addition, the open end 211 and the open end 311 may be connected to each other on the main side wall 11 and the auxiliary side wall 12 of the circuit housing 10 to cover the circuit housing 10.

In some embodiments, the housing sheath 21 and the housing sheath 31 may not completely cover the entire circuit housing 10. For example, an exposed hole may be provided at a position corresponding to a button or a power interface, so as to expose the corresponding structure and to facilitate user operation.

After being sleeved on the periphery of the circuit housing 10, the housing sheath 21 and the housing sheath 31 may be further fixed on the circuit housing 10 by certain means, thereby fixing the circuit housing 10 with the housing sheaths corresponding to the circuit housing 10.

In some embodiments, a positioning protrusion 212 and a positioning protrusion 312 may be integrally formed on an inner surface of the housing sheath 21 and the housing sheath 31 corresponding to the main side wall 11, respectively. A positioning groove 1101 and a positioning groove 1102 may be respectively disposed on an outer surface of the main side wall 11.

A positioning protrusion 212 may be disposed on an inner side wall close to the open end 211. The positioning protrusion 212 may be an annular protrusion surrounding the inner side wall of the housing sheath 21 or a plurality of protrusions disposed on the inner side wall of the housing sheath 21 at intervals, etc., which may be set according to actual needs. In the embodiments, a count of the positioning protrusion 212 may be two that are respectively disposed on inner side walls of the housing sheath 21 corresponding to the two main side walls 11 of the circuit housing 10. Similarly, a count of a positioning protrusion 312 also may be two that are respectively disposed on the inner side walls of the housing sheath 31 corresponding to the two main side walls 11 of the circuit housing 10.

Specifically, after the housing sheath 21 and the housing sheath 31 are respectively sleeved on both sides of the circuit housing 10, the positioning protrusion 212 may be further inserted into the positioning groove 1101 and the positioning protrusion 312 may be inserted into the positioning groove 1102, so that the open end 211 of the housing sheath 21 and the open end 311 of the housing sheath 31 elastically abut together, thereby covering the circuit housing 10.

In some embodiments, an outer side wall 313 of an area of the housing sheath 31 covering the end wall 13 of the circuit housing 10 may be inclined with respect to the auxiliary side wall 12. Specifically, when the user wears the bone conduction loudspeaker, one side of the outer side wall 313 of the housing sheath 31 close to an upper side of the user's head may be inclined from one side of the outer side wall 313 of the housing sheath 31 close to a lower side of the user's head in a direction gradually away from the rear hook 30.

The positioning protrusion 212 and the positioning protrusion 312 may be disposed in a strip shape along the open end 211 and the open end 311, respectively, and inclined with respect to the auxiliary side wall 12. Further, a joint seam of the housing sheath 21 and the housing sheath 31 on the main side wall 11 of the circuit housing 10 may also be inclined with respect to the auxiliary side wall 12. Inclination directions of the positioning protrusion 212 and the positioning protrusion 312 and the joint seam of the housing sheath 21 and the housing sheath 31 on the main side wall 11 of the circuit housing 10 may be consistent as an inclination direction of the outer side wall 313 of the area of the housing sheath 31 covering the end wall 13 of the circuit housing 10, so that the bone conduction loudspeaker is more consistent in appearance.

In an application scenario, a covering area of one of the housing sheath 21 and the housing sheath 31 on the circuit housing 10 may be not less than one-half of a covering area of other one of the housing sheath 21 and the housing sheath 31 on the circuit housing 10. For example, the covering area of the housing sheath 21 on the circuit housing 10 may be not less than one-half of the covering area of the housing sheath 31 on the circuit housing 10, or the covering area of the housing sheath 31 on the circuit housing 10 may be not less than one-half of the covering area of the housing sheath 21 on the circuit housing 10. The covering area of the housing sheath 21 on the circuit housing 10, the covering area of the housing sheath 31 on the circuit housing 10, and a ratio between the covering area of the housing sheath 21 on the circuit housing 10 and the covering area of the housing sheath 31 on the circuit housing 10 may be set to other according to requirements, for example, each can be half, which may be not limited herein.

The circuit housing 10 and the rear hook 30 may be integrally formed or connected together by plugging, snapping, etc.

In some embodiments, the rear hook 30 may further include a connector end 33 disposed toward the circuit housing 10. The housing sheath 31 may be sleeved on outside of at least part of the connector end 33. Specifically, the connector end 33 may be injection molded on an end of the second elastic metal wire. The rear hook sheath 32 may be further injection molded on outside of the second elastic metal wire and part of the connector end 33. The housing sheath 31 may be integrally formed at the connector end 33, so that the housing sheath 31 is further sleeved on the periphery of an area of the connector end 33 that is not covered by the rear hook sheath 32.

Further, the circuit housing 10 is disposed with a socket 14 facing the rear hook 30. The socket 14 may be disposed on the end wall 13 of the circuit housing 10 close to the rear hook 30, and formed by extending from one side of the end wall 13 close to the auxiliary side wall 12 toward the rear hook 30.

The connector end 33 may be at least partially inserted into the socket 14. Slots 331 may be respectively disposed on opposite sides of the connector end 33 and perpendicular to an insertion direction of the connector end 33 with respect to the socket 14. Two slots 331 may be spaced and symmetrically disposed on both sides of the connector end 33. Further, the two slots 331 may both communicate with a corresponding side wall of the connector end 33 in a direction perpendicular to the insertion direction.

Correspondingly, through holes 151 corresponding to positions of the two slots 331 may be disposed on a side wall 15 defining the socket 14. The side wall 15 of the socket 14 may be disposed on the periphery of the socket 14, and in a wearing state, face a lower side of the user's head.

The bone conduction loudspeaker may further include a fixing member 53. The fixing member 53 may include two parallel pins 531 and a connecting portion 532 for connecting the pins 531. In this embodiment, the two pins 531 may be disposed in parallel, and the connecting portion 532 may be vertically connected and disposed on the same side of the two pins 531, thereby forming a U-shaped fixing member 53.

Further, a pin 531 may be inserted into a slot 331 from an outer side wall of the side wall 15 of the socket 14 through a through hole, thereby blocking the connecting portion 532 from the outside of the socket 14 and realizing the connection and fixing of the circuit housing 10 and the rear hook 30.

In some embodiments, a through hole 161 opposite to a through hole 151 may be disposed on a side wall 16 defining the socket 14 opposite to the side wall 15. The pin 531 may be further inserted into the through hole 161 through the slot 331. The side wall 16 may be the auxiliary side wall 12 of the circuit housing 10 close to one side of the socket 14. When the bone conduction loudspeaker is in the wearing state, the auxiliary side wall 12 faces an upper side of the user's head.

In the embodiments, the pin 531 is inserted into the slot 331 through the through hole 151, and further inserted into the through hole 161 through the slot 331, that is, the pin 531 may completely penetrate and connect two opposite side walls of the connector end 33 of the rear hook 30 and the connector end 33 together, so that the connection between the circuit housing 10 and the rear hook 30 is more stable.

In some embodiments, the connector end 33 may be further divided into a first connector section 332 and a second connector section 333 along an insertion direction of the connector end with respect to the socket 14. A cross section of the first connector section 332 may be larger than a cross section of the second connector section 333 in a cross-sectional direction perpendicular to the insertion direction of the connector end 33 with respect to the socket 14.

Specifically, the rear hook sheath 32 may be injection molded on the first connector section 332 of the connector end. The housing sheath 31 may be integrally molded at the connection between the first connector section 332 and the second connector section 333. Further, the slot 331 may be disposed on the second connector section 333. The second connector section 333 may be inserted into the socket 14. The connector end 33 may be exposed to the outside of the socket 14.

In some embodiments, a first wiring groove 3321 may be disposed on the first connector section 332 along the insertion direction of the connector end 33 with respect to the socket 14. A second wiring groove 3331 that extends perpendicular to the insertion direction and penetrates through at least one outer side surface may be disposed on an outer end surface of the second connector section 333 away from the first connector section 332. Specifically, the first wiring groove 3321 may be disposed on one side of the first connector section 332 close to the auxiliary side wall 12 that defines the socket 14 and penetrate through two ends of the first connector section 332 along the insertion direction of the connector end 33 with respect to the socket 14. The second wiring groove 3331 may penetrate through two outer side surfaces of the second connector section 333 perpendicular to an extension direction of the second wiring groove 3331.

In addition, a wiring groove 162 may be disposed on an inner side wall of the socket 14. One end of the wiring groove 162 may communicate with the first wiring groove 3321 and the other end of the wiring groove 162 may communicate with the second wiring groove 3331. The wiring groove 162 may be formed by recessing an inner wall of the side wall 16.

Further, the circuit housing 10 may include an inner partition wall 17 disposed inside the housing to form an accommodation cavity 18 spaced apart from the socket 14. Specifically, the main side wall 11, the auxiliary side wall 12, and the end wall 13 of the circuit housing 10 may jointly constitute an accommodation space. The arrangement of the inner partition wall 17 may separate the accommodation space into two parts that are an accommodation cavity 18 and the socket 14. A wiring hole 171 may be further disposed on the inner partition wall 17 to connect the socket 14 and the accommodation cavity 18 through the wiring hole 171.

The bone conduction loudspeaker may be further disposed with a rear hook wire 34. The rear hook wire 34 may pass through the rear hook 30 and two ends of the rear hook wire 34 may be respectively connected to the control circuit 51 and the battery 52. Specifically, the rear hook wire 34 may pass through the first wiring groove 3321, the wiring groove 162, and the second wiring groove 3331 sequentially from the rear hook 30, and enter the accommodation cavity 18 through the wiring hole 171 to be connected with the control circuit 51 or the battery 52.

In some embodiments, the circuit housing 10 may include a first circuit housing 10a and a second circuit housing 10b. The bone conduction loudspeaker may further include a flexible circuit board 54. The flexible circuit board 54 and the battery 52 may be jointly accommodated in the accommodation cavity 18 of the first circuit housing 10a. The flexible circuit board 54 may be a flexible printed circuit (FPC). The battery 52 may be disposed with a positive terminal and a negative terminal.

Specifically, the flexible circuit board 54 may include a first board 541 and a second board 542. One end of the first board 541 may be fixed to the battery 52 and the other end of the first board 541 may be connected to the second board 542. The flexible circuit board 54 may be a whole body, and the first board 541 and the second board 542 are two areas of the whole body. The second board 542 may be disposed with pads and flexible wiring connecting the pads. The first board 541 may only be disposed with flexible wiring for connecting the corresponding pads on the second board 542 to battery 52. Since only flexible wiring is disposed on the first board 541, the first board 541 may be bent. As shown in FIG. 6, a position of the flexible circuit board 54 may be adjusted according to requirements.

A plurality of pads may be disposed on the second board 542 at intervals. The plurality of pads may include two pads 543 and a plurality of pads 544. Furthermore, the first board 541 and the second board 542 may be disposed with two continuous flexible wires 545. The two pads 543 may be respectively electrically connected to the positive terminal and the negative terminal of the battery 52 by the two flexible wires 545.

In addition, the plurality of pads 544 may be divided into at least two groups. A count of pads 544 in each group may be set according to requirements. For example, the count of pads 544 in each group may be two, and two pads 544 may be electrically connected to each other by a flexible wire 546 disposed on the second board 542. The two pads 544 in each group may be respectively connected to functional elements through wires, and then two corresponding functional elements are connected together by the flexible wire 546.

In the above manner, on the one hand, the pads for circuit switching are all set on the second board 542 of the flexible circuit board 54 and connected to the battery 52 through the first board 541 of the flexible circuit board 54, so that the first board 541 may be bent according to space requirements to place the second board 542, thereby optimizing the space utilization of the accommodation cavity 18 of the first circuit housing 10a and improving a space utilization rate. On the other hand, the two pads 543 may be directly connected to the positive and negative terminals of the battery 52 through the flexible wire 545 on the flexible circuit board 54 without the need to set additional pads to lead the positive and negative terminals of the battery 52 out, which may reduce the count of pads and simplify the structure and process.

In some embodiments, the first board 541 may be set to be foldable, so that the second board 542 is attached to a side surface of the battery 52 and the first board 541 and the battery 52 are stacked, thereby greatly reducing the space occupied by the battery 52 and the flexible circuit board 54.

Specifically, the battery 52 may include a battery cell 521. The battery cell 521 may include a body region 5211 and a sealing region 5212. The body region 5211 and the sealing region 5212 are laid flat. A thickness of the body region 5211 may be greater than a thickness of the sealing region 5212, so that a side surface of the sealing region 5212 and a side surface of the body region 5211 are disposed in steps.

Specifically, the side surfaces of the sealing region 5212 and the body region 5211 in a thickness direction of the battery cell 521 are disposed in a stepped manner, so that the second board 542 can utilize a space formed by the body region 5211 and the sealing region 5212 of the cell 521 without the need to provide a separate space for the flexible circuit board 54, thereby further improving the space utilization rate.

In some embodiments, the battery 52 may further include a hard circuit board 522. The hard circuit board 522 may be disposed on a side surface of the sealing region 5212 of the battery core 521. Specifically, the positive terminal and the negative terminal of the battery 52 may be disposed on the hard circuit board 522. A protection circuit (not shown) may be further disposed on the hard circuit board 522 to protect the battery 52 from overload.

In the embodiments, an end of the first board 541 away from the second board 542 is attached and fixed to the hard circuit board 522, so that the two flexible wires on the first board 541 and the positive terminal and the negative terminal on the hard circuit board 522 are connected. Specifically, the first board 541 and the rigid circuit board 522 may be directly pressed together during the production stage.

Further, shapes of the first board 541 and the second board 542 may be set according to actual conditions. In the embodiments, a shape of the first board 541 may match a shape of the sealing region 5212 of the battery cell 521, and both may be elongated rectangles. A shape of the second board 542 may also be rectangular and the second board 542 may be disposed on one end of the first board 541 in a length direction of the first board 541 and perpendicular to the first board 541 along the length direction. Further, the first board 541 may be connected to a middle area of the second board 542 in the length direction, so that the first board 541 and the second board 542 are disposed in a T shape.

Further, on the second board 542, the pads 543 and the pads 544 may be disposed in multiple ways. For example, the all pads may be disposed at intervals along a straight line or in other shapes.

In the embodiments, the two pads 543 may be disposed in a middle area of the second board 542 at intervals along a length direction of the second board 542. The plurality of pads 544 may be further distributed on both sides of the two pads 543 along the length direction of the second board and the pads 544 in each group may be disposed adjacently.

In the embodiments, the pads 544 in each group may be disposed at intervals along a width direction of the second board 542 and staggered from each other along the length direction of the second board 542, so that the pads 544 in each group may be set at intervals in a stepped manner. In this way, on the one hand, it is possible to avoid the formation of a flush space between adjacent two groups of pads 544, thereby making an intensity distribution on the second board 542 uniform, reducing the occurrence of bending between the adjacent two groups of pads 544 and the probability of the second board 542 breaking due to bending, so as to prevent the second board 542 from breaking. On the other hand, it can increase a distance between the pads, facilitate welding, and reduce short circuits between different pads.

The present disclosure also provides a battery assembly. In some embodiments, the battery assembly may include the battery 52 and the flexible circuit board 54 in the foregoing embodiments. The battery assembly in the embodiments may be applied to devices such as earphones, MP3, etc., which require circuit switching at the battery 52. For example, the battery assembly in the embodiments may be applied to the bone conduction loudspeaker in the present disclosure.

Further, in the embodiments of the bone conduction loudspeaker in the present disclosure, the rear hook 30 may be connected to one end of the first circuit housing 10*a*, a plurality of rear hook wires 34 may be provided, the ear hook 20 may be connected to the other end of the first circuit housing 10*a*, and a plurality of ear hook wires 23 may be provided.

Each group of pads 544 may include two pads 544. An ear hook wire 23 and a rear hook wire 34 corresponding to the ear hook wire 23 may be respectively electrically connected to the two pads 544 in the same group of pads 544, further connected to the flexible leads 546 of the two pads 544 in each group, so that a functional element connected to the rear hook wire 34 and a functional element connected to the ear hook wire 23 may be connected together.

In some embodiments, the core housing 41 may further contain an auxiliary function module (not shown) such as a button switch 431. In addition, the control circuit 51 may be contained in the second circuit housing 10*b*. The second board 542 may include four groups of pads 544.

The ear hook wire 23 may include two audio signal wires 231, that is a first ear hook wire 2311 and a second ear hook wire 2312 connected to the earphone core 42. The rear hook wire 34 may include a first rear hook 341 and a second rear hook wire 342 connected to the control circuit 51 and used to transmit audio signals to the earphone core 42. Further, the first ear hook wire 2311 and the first rear hook wire 341, the second ear hook wire 2312 and the second rear hook wire 342 may be respectively connected to different pads in different groups of the two groups of pads 544. Specifically, the first ear hook wire 2311 and the first rear hook wire 341 may be respectively connected to two pads 544 in the same group of pads 544. The second ear hook wire 2312 and the second rear hook wire 342 may be respectively connected to two pads 544 in another group of pads 544. Therefore, the earphone core 42 and the control circuit 51 may be electrically connected together to realize the transmission of the audio signals.

In addition, the ear hook wire 23 may further include at least two auxiliary signal wires 232, for example, a third ear hook wire 2321 and a fourth ear hook wire 2322 connected to the button switch 431. Correspondingly, the rear hook wire 34 may also include a third rear hook wire 343 and a fourth rear hook wire 344 connected to the control circuit 51 and used to transmit button signals to the button switch 431. Further, the third ear hook wire 2321 and the third rear hook wire 343, the fourth ear hook wire 2322 and the fourth rear hook wire 344 may be respectively connected to different pads 544 in different groups of the two groups of pads 544. The two groups of pads 544 may be different from the above-mentioned two groups of pads 544 for transmitting the audio signals to the earphone core 42. Specifically, the third ear hook wire 2321 and the third rear hook wire 343 may be respectively connected to two pads 544 in the same group of pads 544. The fourth ear hook wire 2322 and the fourth rear hook wire 344 may be respectively connected to two pads 544 in another group of pads 544. Therefore, the button switch 431 and the control circuit 51 may be electrically connected together to realize the transmission of the button signals.

Further, the rear hook wire 34 may further include a fifth rear hook wire 345 and a sixth rear hook wire 346 connected to the control circuit 51 and used to supply power to the control circuit 51. The fifth rear hook wire 345 and the sixth rear wire 346 may be respectively connected to two pads 543, thereby connecting the battery 52 and the control circuit 51 together.

Figure 27:
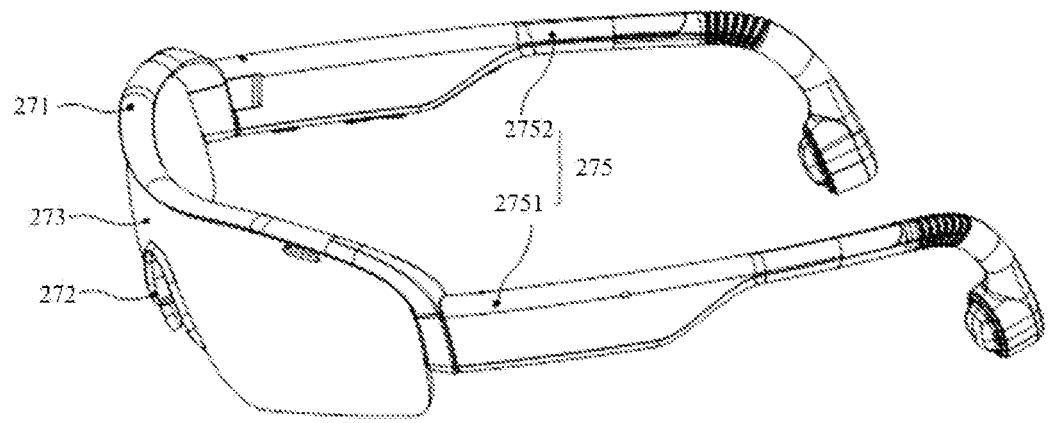
FIG. 27 is a schematic diagram illustrating a structure of a loudspeaker according to some embodiments of the present disclosure.

FIG. 27 is a schematic diagram illustrating a structure of a loudspeaker according to some embodiments of the present disclosure.

In some embodiments, a fixing mechanism may be a glass. The fixing mechanism may have at least one rotating shaft. The rotating shaft(s) may be used to connect a glasses frame and a glasses temple. The glasses frame and the glasses temple may rotate around the rotating shaft. The rotating shaft may have a rotating shaft wiring channel disposed along an axis. A connection wire may be disposed in the fixing mechanism. The connection wire may be an electrical connection wire. The connection wire may pass through the rotating shaft wiring channel. Two ends of the connection wire may extend into the glasses frame and the glasses temple, respectively. In some embodiments, the glasses temple at two sides may accommodate a control circuit and a battery component, respectively. The connection wire in the glasses frame may be electrically connect to the control circuit and the battery component. The connection wire may include an audio signal wire and an auxiliary signal wire. The connection wire may be electrically connected to a flexible circuit board in a core housing, and electrically connected to an earphone core and auxiliary function module(s) through the flexible circuit board.

In some embodiments, the glasses of the present disclosure may be glasses worn in people's daily life and at work to correct vision and protect eyes, or certain circuit structures and electronic components may be added into the glasses in order to further implement specific functions through the circuit structures and electronic components. Specifically, the glasses in the present disclosure may be smart glasses, virtual reality glasses, holographic glasses, augmented reality glasses, or glasses with other functional structures (e.g., glasses with a bone conduction earphone).

In some embodiments, as shown in FIG. 27, the glass may include a glasses frame 271, a nose pad 272, a glasses lens 273, and a glasses temple 275.

As used herein, the glasses frame 271 may be used to carry at least a portion of the glasses lens 273. The nose pad 272 may be used to support the glasses on the bridge of the nose of a user when the user wears the glasses.

The nose pad 272 may be disposed in the middle of the glasses frame 271 and integrally formed with the glasses frame 271. In the prior art, the glasses frame 271 and the nose pad 272 may be usually formed, respectively. The middle portion of the glasses frame 271 may be disposed with a structure connected to the nose pad 272. After molding, the nose pad 272 may be installed on the connection structure of the glasses frame 271. In the embodiment, the glasses frame 271 and the nose pad 272 may be integrally formed directly. Specifically, a corresponding mold may be used to implement the integral molding, for example, injection molding, or the like. In the embodiment, the glasses frame 271 and the nose pad 272 may not need to be further installed after the molding, thereby simplifying a manufacturing process of glasses.

In addition, the glasses lens 273 may also be integrally designed, and be fixed by the glasses frame 271 and the nose pad 272 in a clamping manner.

Further, the glasses frame 271 and the nose pad 272 may be respectively disposed with a structure for clamping the glasses lens 273. When the glasses are assembled, the integrally designed glasses lens 273 may be directly clamped to the integrally formed glasses frame 271 and nose pad 272 through the corresponding clamping structures.

In the embodiment, the glasses frame 271 and the nose pad 272 may be integrally formed, and the glasses lens 273 may also be integrally designed. Therefore, the entire structure of the glasses may be simple, and the manufacturing process of the glasses may be simplified.

Figure 28:
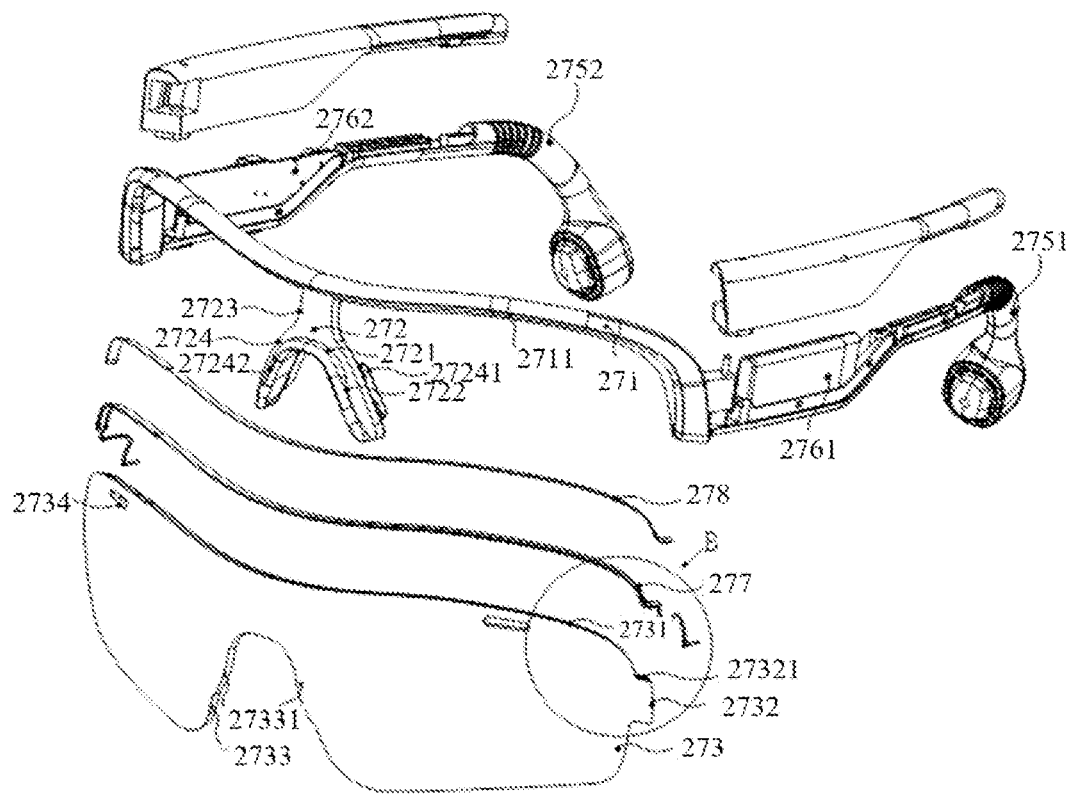
FIG. 28 is an exploded view illustrating a loudspeaker according to some embodiments of the present disclosure.
Figure 29:
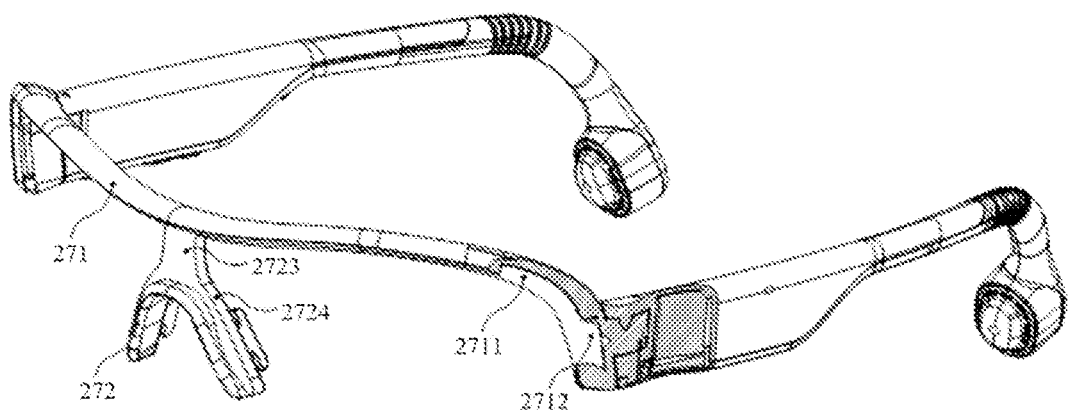
FIG. 29 is a sectional view illustrating a partial structure of a loudspeaker according to some embodiments of the present disclosure.

Referring to FIG. 28 and FIG. 29, FIG. 28 is an exploded view illustrating glasses according to some embodiments of the present disclosure. FIG. 29 is a sectional view illustrating a partial structure of glasses according to some embodiments of the present disclosure. In the embodiment, the glasses lens 273 may include a top-side edge 2731 and two outer edges 2732 connected to both ends of the top-side edge 2731 and disposed away from the nose pad 272. Each of the outer edges 2732 may be respectively disposed with a first buckle 27321. The glasses frame 271 may be disposed with a first mounting groove 2711 for receiving the top-side edge 2731 and at least a portion of the outer edges 2732, and a first buckle groove 2712 for receiving the first buckle 27321 and communicating with the first mounting groove 2711.

As used herein, when the glasses are in a wearing state, the top-side edge 2731 may be located on the upper side of the glasses lens 273, the outer edge may be located on both sides of the glasses lens 273 near ears of the user, and the top-side edge 2731 and the two outer edges 2732 may be connected to each other. The first mounting groove 2711 may be disposed on a side of the glasses frame 271 facing the glasses lens 273. A size of the first mounting groove 2711 may match the top-side edge 2731 and the two outer edges 2732 of the corresponding glasses lens 273, so that the glasses lens 273 may be mounted on the glasses frame 271 by mounting the top-side edge 2731 and at least the portion of the outer edge 2732 in the first mounting groove 2711.

Further, the first buckle 27321 may be formed by further extending at least a portion of the outer edge 2731 of the glasses lens 273 toward two sides away from the nose pad 272. The first buckle groove 2712 may be formed by recessing a position of the first mounting groove 2711 corresponding to the first buckling 27321 in a direction away from the glasses lens 273. As used herein, the shape and size of the first buckle groove 2712 may match the first buckle 27321, so that the glasses lens 273 may be further installed on the glasses frame 271 by clamping the first buckle 27321 into the first buckle groove 2712.

It should be noted that at least a portion of the outer edge 2732 may be located on the side of the first buckle 27321 away from the top-side edge 2731, so that the first buckle 27321 and a portion of the glasses lens 273 near the two sides of the edge of the glasses lens 273 may be accommodated inside the first mounting groove 2711. Therefore, the glasses lens 273 may be more firmly fixed on the glasses frame 271.

In some embodiments, the glasses lens 273 may further include an inner edge 2733 abutting on the nose pad 272. The nose pad 272 may be disposed with a second mounting groove 2721 for receiving the inner edge 2733.

It should be noted that the glasses lens 273 may include a left glasses lens and a right glasses lens. The inner edge 2733 of the glasses lens 273 may be disposed at a connection between the left glasses lens and the right glasses lens and a vicinity of the connection. Accordingly, the second mounting groove 2721 and the first mounting groove 2711 may be oppositely disposed so that the opposite sides of the glasses lens 273 may be respectively received and fixed in an accommodation space formed by the glasses frame 271 and the nose pad 272.

In some embodiments, two sides of the inner edge 2733 may be respectively disposed with a second buckle 27331. The nose pad 272 may be further disposed with a second buckle groove 2722 connected to the second mounting groove 2721 and used to receive the second buckle 27331.

As used herein, the inner edge 2733 may include two portions connected to each other, which may be respectively disposed on a side of the left glass lens facing the right glass lens and a side of the right glass lens facing the left glass lens. The nose pad 272 may also be divided into two portions, which may be respectively supported on the left and right nose bridges of the user when worn by the user. Accordingly, in the embodiment, the count of the second buckle groove 2722 and the second buckle 27331 may also be two. The shape and size of the second buckle 27331 may match the corresponding second buckle groove 2722 to install the second buckle 27331 in the corresponding second buckle groove 2722.

In addition, the glasses lens 273 may be disposed with the inner edge 2733 near both sides of the second buckle 27331, which may allow the vicinity of both sides of the second buckle 27331 to be installed in the second mounting groove 2721. Therefore, the glasses lens 273 may be more firmly fixed on the nose pad 272.

By the approach, the glasses lens 273 may be respectively mounted on the glasses frame 271 and the nose pad 272 through the top-side edge 2731, the outer edge 2732, the inner edge 2733, the first buckle 27321, and the second buckle 27331.

In an application scenario, the glasses lens 273 may be further disposed with vent holes 2734. Specifically, the count of the vent holes may be two, and respectively disposed on the left and right sides of the glasses lenses 273 near the top-side edge 2731. The arrangement of the vent holes 2734 may facilitate air circulation of the inner and outer sides of the glasses lens 273 when the user wears the glasses, thereby reducing a phenomenon of fogging of the glasses lens 273 caused by local overheating due to reasons such as user movement, etc.

Figure 30:
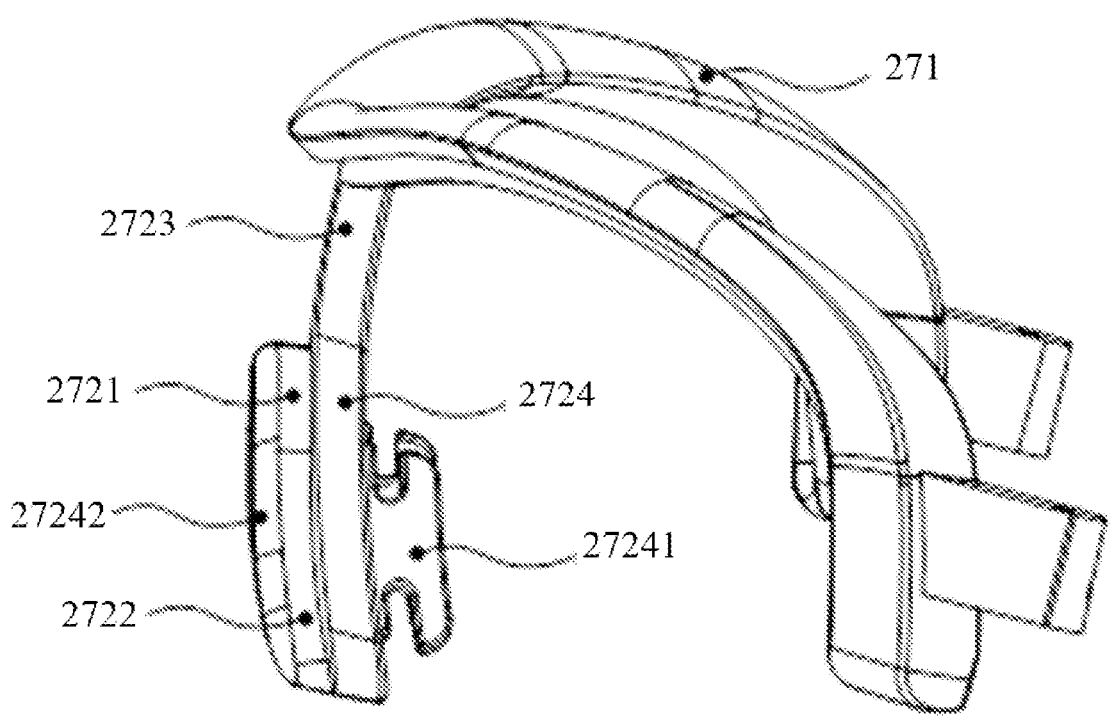
FIG. 30 is a schematic diagram illustrating structures of a glasses frame and a nose pad of a loudspeaker according to some embodiments of the present disclosure.
Figure 31:
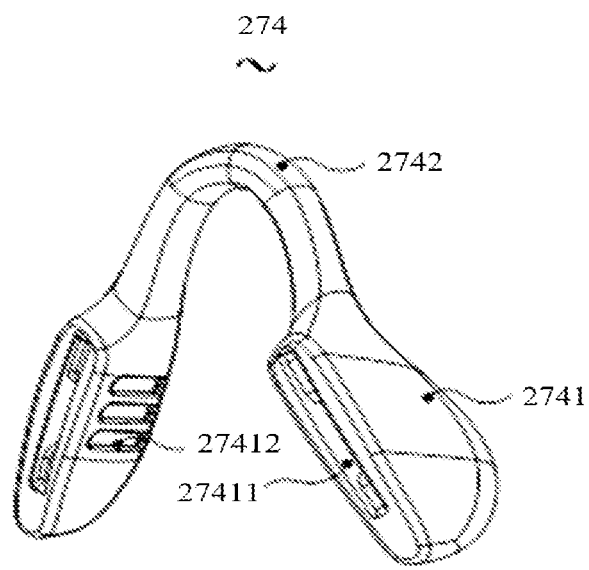
FIG. 31 is a structural diagram illustrating a structure of a nose pad cover in a loudspeaker according to some embodiments of the present disclosure.

Specifically, referring to FIG. 28, FIG. 30, and FIG. 31 together, FIG. 30 is a schematic diagram illustrating structures of a glasses frame and a nose pad according to some embodiments of the present disclosure. FIG. 31 is a schematic diagram illustrating a structure of a nose pad cover of glasses according to some embodiments of the present disclosure. In some embodiments, the nose pad 272 may include a connection portion 2723 connected to the glasses frame 271 on the side of the first mounting groove 2711 near the user or away from the user in the wearing state, and two support portions 2724 connected to the connection portion 2723 in an inverted Y-shaped manner on a side of the connection portion 2723 away from the glasses frame 271. The support portions 2724 may be used to support the glasses on the nose of the user when wearing.

In an application scenario, the connection portion 2723 may be integrally connected to the glasses frame 271. When the user wears the glasses, the connection portion 2723 may be disposed on a side of the first mounting groove 2711 close to the user.

A side of each of the support portions 2724 protruding toward the nose bridge of the user may be disposed with I-shaped hook(s) 27241. The glasses may further include nose pad cover(s) 274 detachably sleeved on the hook(s) 27241.

As used herein, the nose pad cover 274 may be made of soft rubber. Specifically, the count of the I-shaped hook(s) 27241 may be two, corresponding to the left and right nose bridges of the user, respectively. The nose pad cover 274 may include two cover bodies 2741 and a connecting portion 2742 connecting to the two cover bodies 2741. As used herein, the connecting portion 2742 may be connected with the nose bridge of the user. The cover bodies 2741 may be correspondingly disposed with I-shaped accommodation groove(s) 27411 matching the hook(s) 27241. Sides of the cover bodies 2741 facing the nose bridge of the user may further be disposed with an anti-slippery portion 27412 including a plurality of grooves. In the embodiment, the nose pad cover 274 may be detachably disposed, thereby facilitating cleaning and replacement of the nose pad cover 274.

Further, in an embodiment, sides of the two support portions 2724 back from the hook(s) 27241 may be protruded with strip shaped ribs 27242. The strip shaped ribs 27242 may cooperate with the two support portions 2724 to form the second mounting groove 2721 and the second buckle groove 2722.

As used herein, the strip shaped ribs 27242 may be protruded along edges of the two support portions 2724 away from the glasses lens 273, thereby forming the second mounting groove 2721 for receiving the inner edge 2733 of the glasses lens 273. At a position corresponding to the second buckle 27331 of the glasses lens 273, the strip shaped ribs 27242 may be further recessed to form the second buckle groove 2722.

Figure 26:
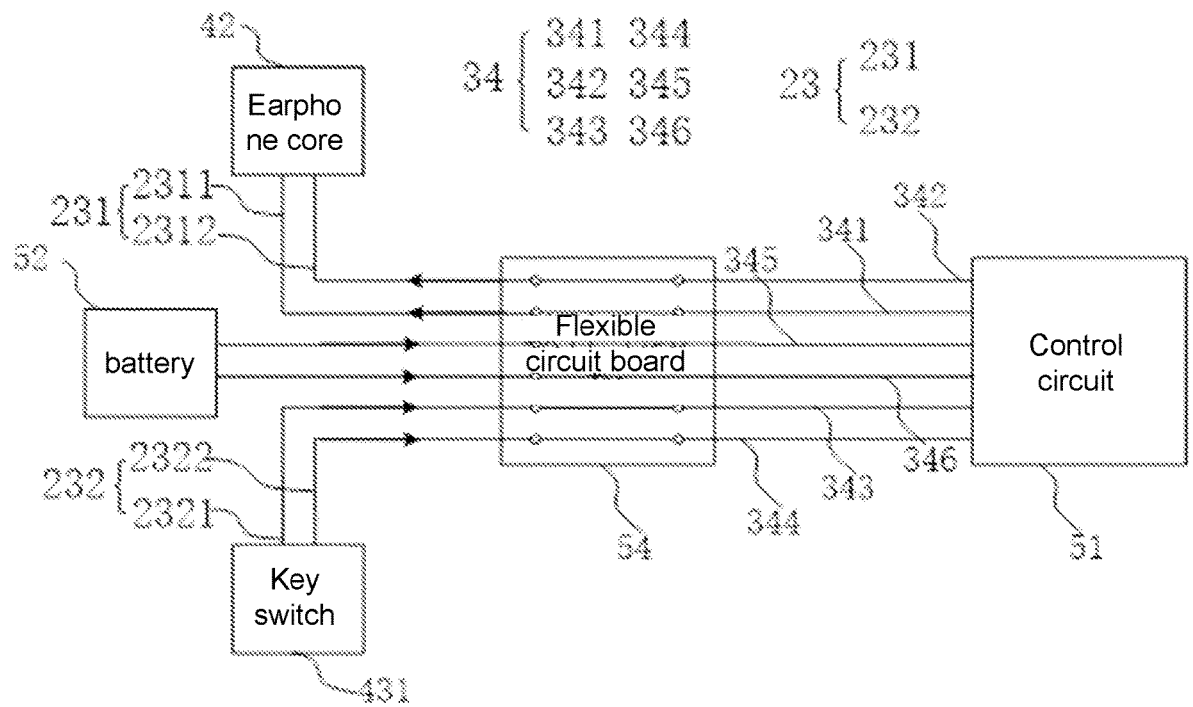
FIG. 26 is a schematic diagram illustrating wiring of a flexible circuit board at a battery in a loudspeaker according to some embodiments of the present disclosure.

Referring to FIG. 26 and FIG. 27 together, In some embodiments, the glasses may further include the glasses temple 275, function component(s) 276, and a connection wire 277. As used herein, the glasses temple 275 may include a first glasses temple 2751 and a second glasses temple 2752. The function component(s) 276 may include a first function component 2761 and a second function component 2762.

Specifically, the first glasses temple 2751 and the second glasses temple 2752 may be respectively connected to the glasses frame 271. The first function component 2761 and the second function component 2762 may be respectively disposed on the first glasses temple 2751 and the second glasses temple 2752. At least one cavity may be disposed on the two glasses temples 275 to accommodate the corresponding function components 276.

The connection wire 277 may be disposed inside the first mounting groove 2711 and between the bottom of the first mounting groove 2711 and the top-side edge 2731 of the glasses lens 273, and further extend to the first glasses temple 2751 and the second glasses temple 2752 to be electrically connected to the first function component 2761 and the second function component 2762.

In the embodiment, the function component(s) 276 respectively disposed in the two glasses temples 275 may need to be electrically connected through the connection wire 277 so that the glasses may implement a specific function. Specifically, in an application scenario, the first function component 2761 may be a battery component, and the second function component 2762 may be a control circuit component. The control circuit component may be connected to the battery component through the connection wire 277, so that the battery component may provide power to the control circuit component. Therefore, the control circuit component may implement the specific function.

In order to meet requirements of beauty and lightness of the glasses, the connection wire 277 may be disposed in the first mounting groove 2711 along the top-side edge 2731 of the glasses lens 273 and accommodated inside a space formed by the first mounting groove 2711 and the top-side edge 2731 of the glasses lens 273, so that the connection wire 277 may be neither exposed on the outer surface of the glasses nor occupy extra space. In an application scenario, the connection wire 277 may further extend along the outer edge 2732 of the glasses lens 273 inside the first mounting groove 2711.

Specifically, the glasses frame 271, the first glasses temple 2751, and the second glasses temple 2752 may be respectively disposed with a wiring channel communicated with each other, so that the connection wire 277 may enter the first glasses temple 2751 and the second glasses temple 2752 from the first mounting groove 2711 of the glasses frame 271 through the corresponding wiring channels, thereby connecting the first function component 2761 and the second function component 2762.

In the embodiment, the connection wire 277 may have an electrical connection function. In other embodiments, the connection wire 277 may also have a mechanical connection function.

In the embodiment, the first function component 2761 and the second function component 2762 may be respectively disposed on the first glasses temple 2751 and the second glasses temple 2752. The connection wire 277 electrically connecting the first function component 2761 and the second function component 2762 may be disposed inside the first mounting groove 2711 on the glasses frame 271 to receive the top-side edge 2731 of the glasses lens 273, so that the connection wire 277 may be disposed between the bottom of the first mounting groove 2711 and the top-side edge 2731 of the glasses lens, and further extend to the first glasses temple 2751 and the second glasses temple 2752. Therefore, the connection wire 277 may not be exposed, and extra space may not need for the arrangement of the connection wire 277, so that the beauty and lightness of the glasses may be maintained.

Figure 32:
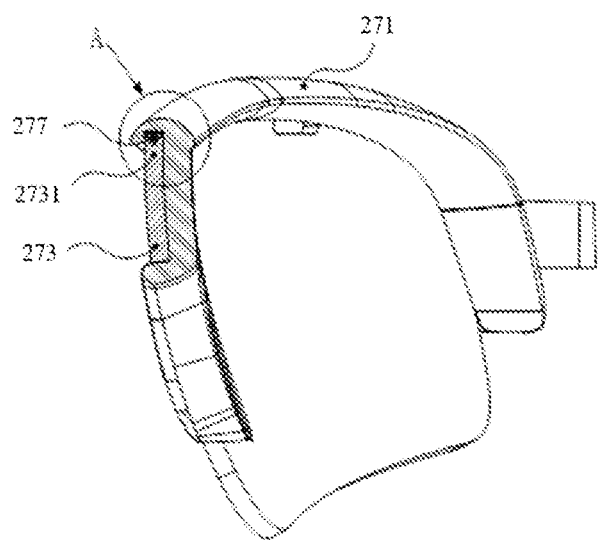
FIG. 32 is a partial sectional view illustrating a glasses frame and a glasses lens in a loudspeaker according to some embodiments of the present disclosure.
Figure 33:
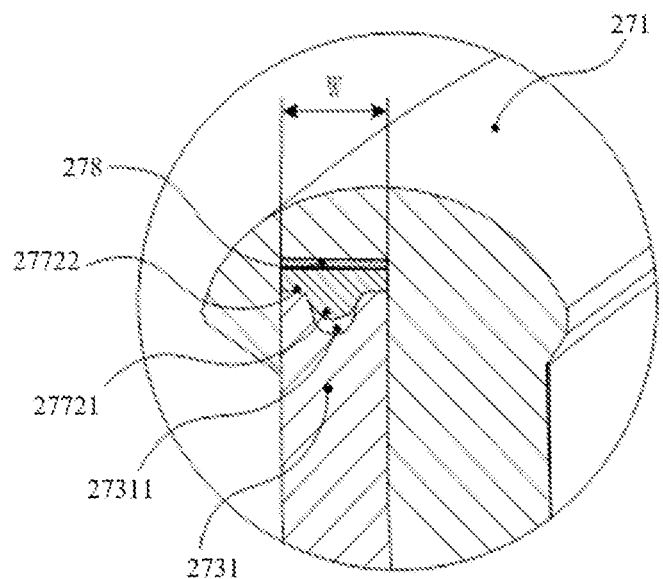
FIG. 33 is an enlarged view illustrating part A of a loudspeaker in FIG. 31 according to some embodiments of the present disclosure.
Figure 34:
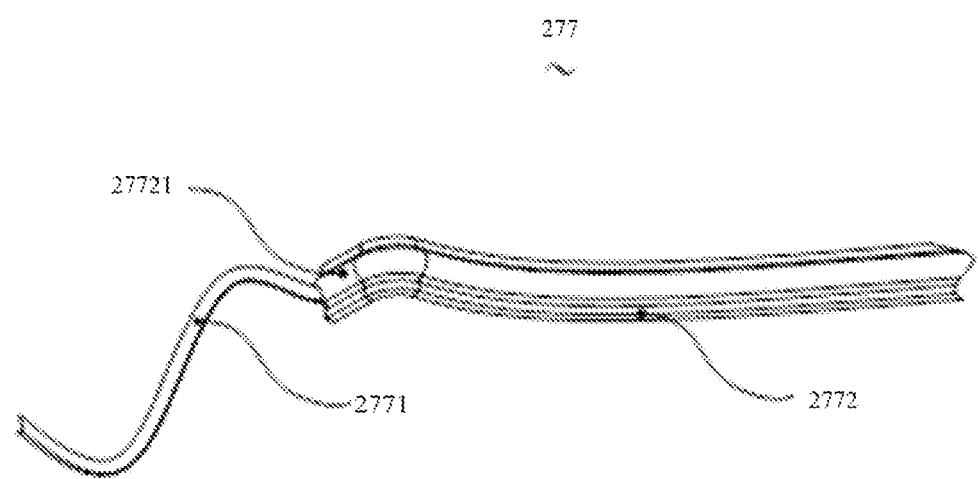
FIG. 34 is a partial structural diagram illustrating a connection wire in a loudspeaker according to some embodiments of the present disclosure.

Referring to FIG. 32, FIG. 33, and FIG. 34 together, FIG. 32 is a partial sectional view illustrating a glasses frame and a glasses lens according to some embodiments of the present disclosure. FIG. 33 is an enlarged view illustrating part A in FIG. 32. FIG. 34 is a partial structural diagram illustrating a connection wire in grasses according to some embodiments of the present disclosure. In the embodiment, the connection wire 277 may include a wire body 2771 and a wire protection cover 2772 wrapped around the periphery of the wire body 2771. A sectional shape of the wire protection cover 2772 may match a sectional shape of the first mounting groove 2711, so that the wire protection cover 2772 may be held in the first mounting groove 2711 in a surface contact manner.

As used herein, the wire protection cover 2772 may be made of soft rubber, so that the connection wire 277 may be bent to match the shape of the first mounting groove 2711. It may be easy to understand that the wire body 2771 may be thin. If the wire body 2771 is directly installed in the first mounting groove 2711, a contact area with the bottom of the first mounting groove 2711 may be small, and it is difficult to be firmly fixed therein. In the embodiment, the wire protection cover 2772 may be further wrapped around the periphery of the wire body 2771, which, on the one hand, may play a role of protecting the wire body 2771, and, on the other hand, increase the contact area between the connection wire 277 and the first mounting groove 2711 by adjusting the surface area of the wire protection cover 2772 to reliably fix the wire body 2771 inside the first mounting groove 2711.

Further, the sectional shape of the first mounting groove 2711 may be a shape to allow the wire protection cover 2772 to be held in the first mounting groove 2711 with a large area of surface contact. For example, the shape may be U-shaped, rectangular, or wavy, and be not specifically limited herein. Correspondingly, the shape of a side of the wire protection cover 2772 facing the bottom of the first mounting groove 2711 may correspond to the shape, so that the wire protection cover 2772 may be directly or indirectly fitted to the bottom of the first mounting groove 2711.

In an application scenario, further referring to FIG. 28, an adhesive layer 278 may be disposed between the wire protection cover 2772 and the glasses frame 271, so that the wire protection cover 2772 may be fixed in the first mounting groove 2711 through the adhesive layer 278.

As used herein, the adhesive layer 278 may be disposed on the bottom of the first mounting groove 2711, or further extended to both sides and disposed on a side wall near the bottom of the first mounting groove 2711, thereby making the adhesive layer 278 to wrap around the wire protection cover 2772 to more firmly fix the connection wire 277 inside the first mounting groove 2711.

Specifically, in the application scenario, a section of the first mounting groove 2711 may be rectangular. The bottom of the first mounting groove 2711 and a side of the wire protection cover 2772 facing the bottom of the first mounting groove 2711 may be both flat, and the adhesive layer 278 may be a double-sided adhesive layer disposed therebetween.

Further, In some embodiments, a side of the wire protection cover 2772 facing the top-side edge 2731 of the glass lens 273 may be disposed with a protruding portion 27721 corresponding to the wire body 2771. The top-side edge 2731 of the glasses lens 273 may be disposed with a clearance slot 27311 for receiving the protruding portion 27721.

Specifically, the section of the wire body 2771 may be circular. The wire protection cover 2772 may be flush with the wire body 2771 on the side of the wire body 2771 facing the bottom of the first mounting groove 2711. The side of the wire body 2771 facing away from the bottom of the first mounting groove 2711 may still present the shape of the wire body 2771, thereby forming the corresponding protruding portion 27721.

Further, the top-side edge 2731 of the glasses lens 273 may need to be further disposed inside the first mounting groove 2711. In the embodiment, the top-side edge 2731 may be further disposed with the clearance slot 27311 for receiving the protruding portion 27721, so that the connection wire 277 installed inside the first mounting groove 2711 may be at least partially accommodated in the clearance slot 27311 corresponding to the top-side edge 2731.

Further, the protruding portion 27721 may be located in a middle region of the wire protection cover 2772 along a width direction of the wire protection cover 2772 to form abutting portions 27722 on two sides of the protruding portion 27721. The two abutting portions 27722 may abut on the top-side edges 2731 on two sides of the clearance slot 27311, respectively. As used herein, the width direction of the wire protection cover 2772 may refer to a direction perpendicular to a direction of the wire protection cover 2772 along the first mounting groove 2711, specifically a direction indicated by W in FIG. 33.

It may be easy to understand that the depth of the first mounting groove 2711 may be limited. If the top-side edge 2731 of the glasses lens 273 is flush with the protruding portion 27721 of the connection wire 277, or a side of the wire protection cover 2772 and the wire body 2771 facing away from the bottom of the first mounting groove 2711 is flush with the wire body 2771, an insertion depth of the top-side edge 2731 of the glasses lens 273 in the first mounting groove 2711 may be reduced, which may disadvantage the stable installation of the glasses lens 273 in the glasses frame 271. In the embodiment, the top-side edge 2731 of the glasses lens 273 may avoid a portion of the connection wire 277 through the clearance slot 27311, so that the top-side edge 2731 may further extend towards the bottom of the first mounting groove 2711 relative to the clearance slot 27311 and abut on the abutting portions 27722 on the two sides of the protruding portion 27721. Therefore, the space occupied by the connection wire 277 in the first mounting groove 2711 may be reduced to a certain extent, so that the glasses lens 273 may be installed deeper inside the first mounting groove 2711, thereby improving the stability of the glasses lens 273 in the glasses frame 271.

In an application scenario, the glasses frame 271 may be thin, and at least a portion of the protruding portion 27721 may be exposed outside the first mounting groove 2711 to reduce the space of the glasses frame occupied by the connection wire 277, thereby reducing the depth of the first mounting groove 2711 and improving the stability of the glasses frame 271.

Figure 35:
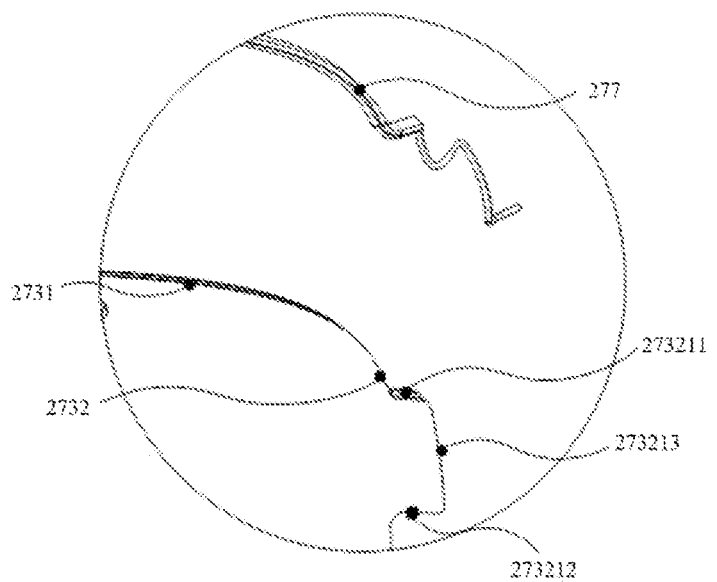
FIG. 35 is a partial structural schematic diagram illustrating part B of a loudspeaker in FIG. 27 according to some embodiments of the present disclosure.

As used herein, further referring to FIG. 28, FIG. 29, and FIG. 35, FIG. 35 is a partial structural diagram illustrating part B in FIG. 28 according to some embodiments of the present disclosure. In some embodiments, the first buckle 27321 may include a first sub-edge 273211, a second sub-edge 273212, and a third sub-edge 273213.

As used herein, the first sub-edge 273211 may be disposed adjacent to the top-side edge 2731. The second sub-edge 273212 may be disposed away from the top-side edge 2731 and opposite to the first sub-edge 273211. The third sub-edge 273213 may be connected to the first sub-edge 273211 and the second sub-edge 273212 on a side of the first sub-edge 273211 and the second sub-edge 273212 away from the glasses lens 273.

In the embodiment, the wire protection cover 2772 may further extend to the first buckle groove 2712 along the first sub-edge 273211.

In the way, the wire protection cover 2772 may be held in the first mounting groove 2711 and extend to the first buckle groove 2712 to be hidden in the glasses frame 271. Therefore, when a user disassembles the glasses lens 273 during use, the wire protection cover 2772 may not be exposed after the glasses lens 273 is disassembled to maintain the beauty of the glasses.

Further, when extending towards the first buckle groove 2712, the wire protection cover 2772 may end at a connection between the first sub-edge 273211 and the third sub-edge 273213. Certainly, the wire protection cover 2772 may also not end and continue to extend along the wire body 2771, as long as the wire protection cover 2772 is not exposed when the glasses lens 273 is disassembled.

Figure 36:
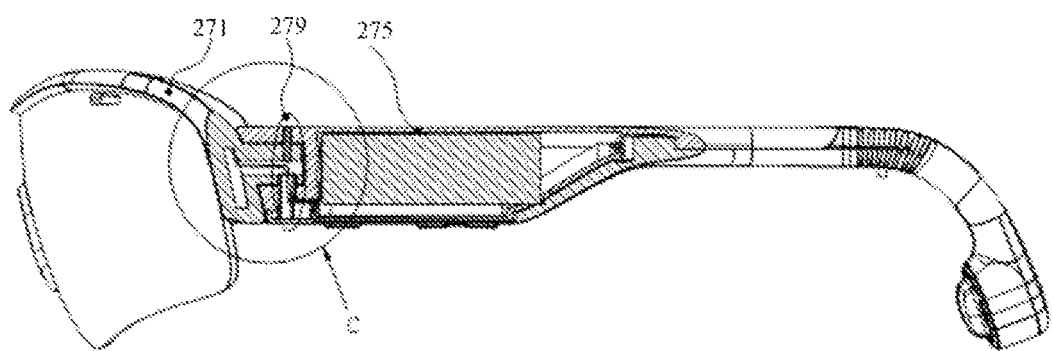
FIG. 36 is a sectional view illustrating a partial structure of a loudspeaker according to some embodiments of the present disclosure.
Figure 37:
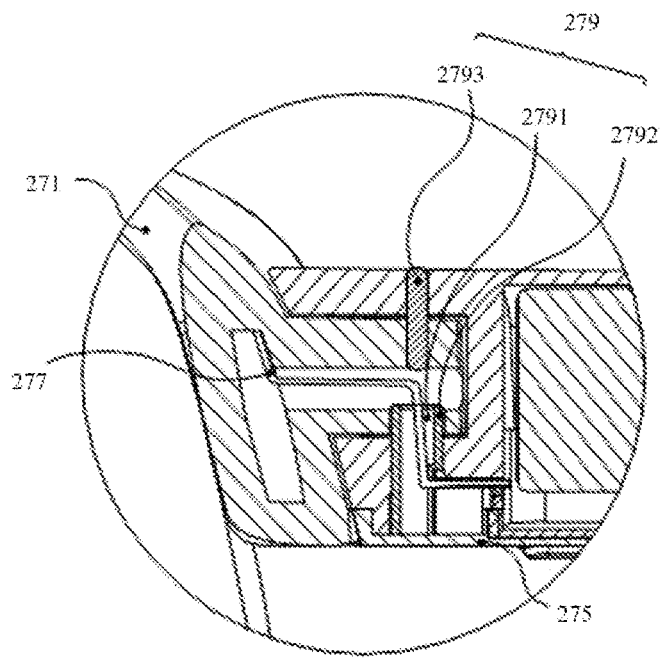
FIG. 37 is an enlarged view illustrating a part C of a loudspeaker in FIG. 35 according to some embodiments of the present disclosure.

Referring to FIG. 36 and FIG. 37 together, FIG. 36 is a sectional view illustrating a partial structure of glasses according to some embodiments of the present disclosure. FIG. 37 is an enlarged diagram illustrating a part C in FIG. 36. In the embodiment, the glasses may further include a rotating shaft 279.

As used herein, the count of the rotating shaft 279 may be two, and respectively used to connect the glasses frame 271 and the two glasses temples 275, so that the glasses frame 271 and the glasses temples 275 may rotate relative to the rotating shaft 279, respectively. As used herein, the rotating shaft 279 may be disposed with a rotating shaft wiring channel 2791 along an axial direction. The connection wire 277 may be pass through the shaft wiring channel 2791 and extend to the glasses frame 271 and the glasses temples 275, respectively.

Specifically, in the embodiment, after the connection wire 277 passes through the rotating shaft wiring channel 2791, one end of the connection wire 277 may directly extend to one of the glasses temples 275, and the other end of the connection wire 277 may enter the glasses frame 271 and further extend to another one of the glasses temples 275 along a first mounting groove 2711, thereby electrically connecting the two function components 276 located inside the two glasses temples 275, respectively.

In the embodiment, the connection wire 277 near the rotating shaft wiring channel may not include the wire protection cover 2772. The rotating shaft wiring channel 2791 may pass through the rotating shaft 279.

It may be easy to understand that relative positions of structures near the rotating shaft 279 may change when the glasses frame 271 and a glasses temple 275 are folded. At this time, if the connection wire 277 located at the connection between the glasses frame 271 and the glasses temple 275 is directly disposed around the periphery of the rotating shaft 279, the connection wire 277 herein may be compressed or pulled, even deformed or broken with the folding of the glasses frame 271 or the glasses temple 275, which may affect the stability of the connection wire 277 and shorten the service life of the connection wire 277.

In some embodiments, the rotating shaft 279 may be disposed with the shaft wiring channel 2791 along an axial direction. The connection wire 277 located at the connection between the glasses frame 271 and the glasses temple 275 may pass through the shaft wiring channel 2791. Therefore, when the glasses frame 271 and the glasses temple 275 are folded, the connection wire 277 located inside the rotating shaft wiring channel 2791 may only rotate to a certain amount with the rotation of the rotating shaft 279 to reduce the folding, compressing, or pulling of the connection wire 277, thereby protecting the connection wire 277 to a certain extent, improving the stability of the connection wire 277, and extending the service life of the connection wire 277.

As used herein, in some embodiments, an inner diameter of the rotation shaft wiring channel 2791 may be larger than an outer diameter of the connection wire 277. For example, the inner diameter of the shaft wiring channel 2791 may be twice the outer diameter of the connection wire 277. Accordingly, a binding effect of the inner side wall of the shaft wiring channel 2791 on the connection wire 277 may be reduced, thereby reducing the rotation amplitude of the connection wire 277 when the glasses frame 271 and the glasses temple 275 are folded.

Figure 38:
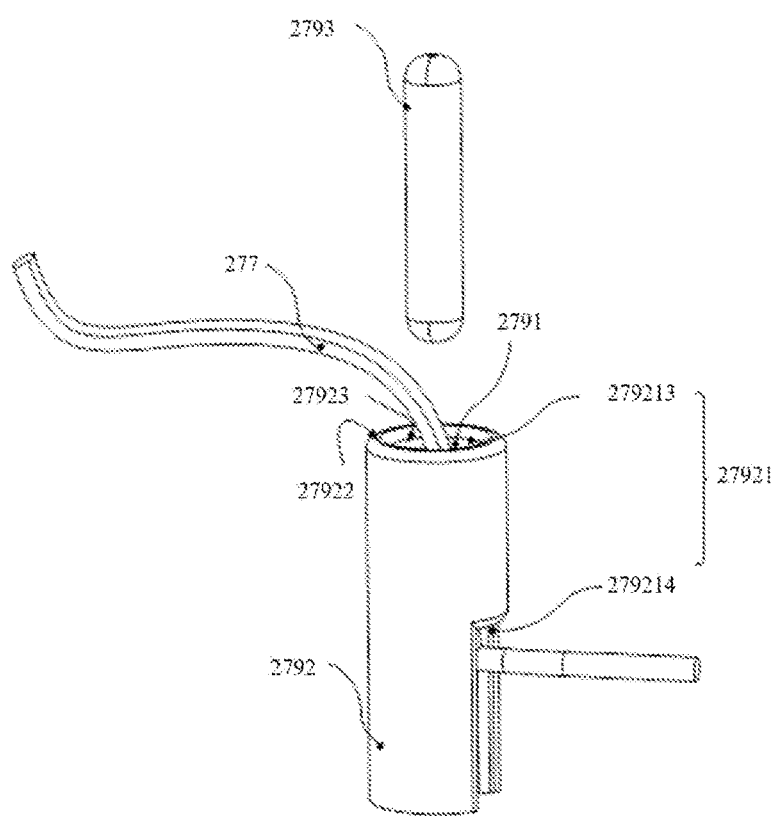
FIG. 38 is a schematic structural diagram illustrating a rotating shaft component and a connection wire in a loudspeaker according to some embodiments of the present disclosure.

Referring to FIG. 37 and FIG. 38 together, FIG. 38 is a schematic structural diagram illustrating a rotating shaft and a connection wire in glasses according to some embodiments of the present disclosure. In some embodiments, the rotating shaft 279 may include a first rotating shaft 2792. Two ends of the first rotating shaft 2792 may be respectively connected to the glasses frame 271 and the glasses temple 275. The rotating shaft wiring channel 2791 may be disposed along an axial direction of the first rotating shaft 2792. The shaft wiring channel 2791 may communicate with the outside through a wiring port 27921 disposed on at least one end surface of the first rotating shaft 2792. The connection wire 277 may extend to the glasses frame 271 or the glasses temple 275 through the wiring port 27921.

It should be noted that, in the embodiments, the first rotating shaft 2792 may be rotatably connected to one of the glasses frame 271 and the glasses temple 275, and fixedly connected to another, so that the glasses frame 271 and the glasses temples 275 may be rotatably connected around the first rotating shaft 2792.

Specifically, in the embodiments, the rotating shaft wiring channel 2791 may be disposed inside the first rotating shaft 2792, and further communicate with the outside through the wiring port 27921.

Specifically, the rotating shaft wiring channel 2791 may penetrate at least one end surface of the first rotating shaft 2792 to form the wiring port 27921 of the rotating shaft wiring channel 2791. Therefore, the connection wire 277 may extend from the shaft wiring channel 2791 through the at least one end surface of the first rotating shaft 2792, and then extend to the glasses frame 271 or the glasses temple 275. It may be easy to understand that the periphery of the end surface of the first rotating shaft 2792 may have a relatively large movement space. The connection wire 277 extending from the end surface of the first rotating shaft 2792 may be accommodated inside the movement space. If the first rotating shaft 2792 at the end surface is rotatably connected to the corresponding glasses frame 271 or glasses temple 275, when the glasses frame 271 and the glasses temple 275 are folded and rotated and the connection wire 277 near the wire opening 27921 on the end surface is twisted to a certain degree when with the rotation of the first rotating shaft 2792, the twisting may be appropriately buffered by the movement space and the twisting may be changed into movement, thereby further reducing the twisting degree of the connection wire 277 and improving the stability of connection wire 277.

Figure 39:
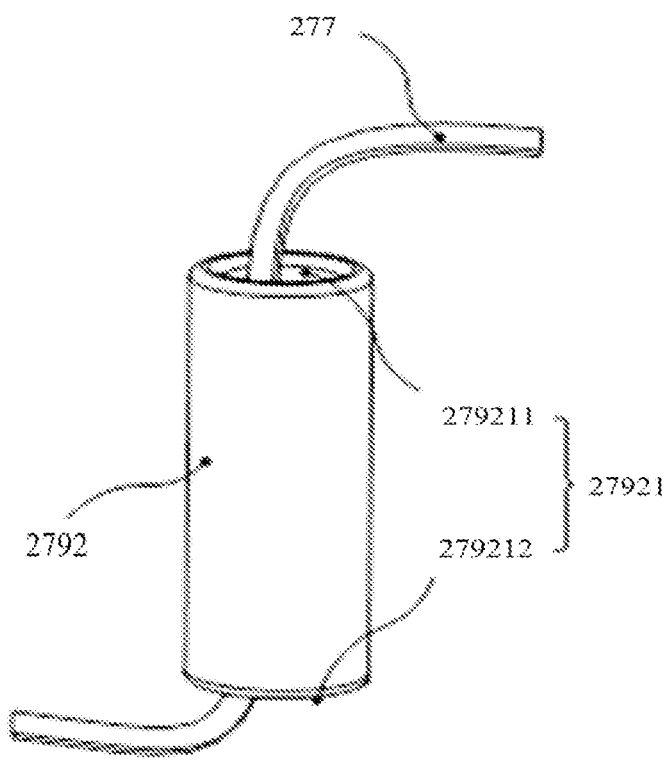
FIG. 39 is a schematic structural diagram illustrating a first rotating shaft in a loudspeaker according to some embodiments of the present disclosure.

Referring to FIG. 39, FIG. 39 is a schematic structural diagram illustrating a first rotating shaft in glasses according to some embodiments of the present disclosure. In some embodiments, the wiring port 27921 may include a first wiring port 279211 and a second wiring port 279212 respectively disposed on two ends of the first rotating shaft 2792. The rotating shaft wiring channel 2791 may communicate with the outside through the two wiring ports 27921, respectively, so that the connection wire 277 may pass through the two ends of the first rotating shaft 2792 and extend to the glasses frame 271 and the glasses temple 275 through the first wiring port 279211 and the second wiring port 279212, respectively.

In other words, in the application scenario, the connection wire 277 at the connection between the glasses frame 271 and the glasses temple 275 may be disposed inside the rotating shaft wiring channel 2791 in the first rotating shaft 2792, and extend from the rotating shaft wiring channel 2791 through the two ends of the first rotating shaft 2792, respectively. At this time, since large movement spaces exist on the periphery of two end surfaces of the first rotating shaft 2792, the connection wire 277 extending from the two end surfaces of the first rotating shaft 2792 may only move or twist slightly without deformation due to squeezing and pulling when the relative rotation occurs between the glasses frame 271 and the glasses temple 275.

Referring to FIG. 38, in the embodiments, the wiring port 27921 may include a first wiring port 279213 and a second wiring port 279214. As used herein, the first wiring port 279213 may be disposed on an end surface of the first rotating shaft 2792, and the second wiring port 279214 may be disposed on a side wall of the first rotating shaft 2792. Therefore, one end of the shaft wiring channel 2791 may penetrate the end surface of the first rotating shaft 2792 in an axial direction through the first wiring port 279213, and the other end may penetrate the side wall of the first rotating shaft 2792 through the second wiring port 279214, and then communicate with the outside. The connection wire 277 may extend to the glasses frame 271 and the glasses temple 275 through the first wiring port 279213 and the second wiring port 279214, respectively.

Similarly, a large movement space may be disposed near the end surface of the first rotating shaft 2792 of the first wiring port 279213. When a relative movement occurs between the glasses frame 271 and the glasses temple 275, the connection wire 277 near the first wiring port 279213 may only undergo a relative shift or a small twist.

In an application scenario, the first rotating shaft 2792 may be fixedly connected to one of the glasses frame 271 and the glasses temple 275 disposed near the second wiring port 279214, and rotatably connected to another of the glasses frame 271 and the glasses temple 275 disposed near the first wiring port 279213. That is, the first rotating shaft 2792 may be rotatably connected to one of the glasses frame 271 or the glasses temple 275 at the wiring port 27921 disposed on the end surface. The first rotating shaft 2792 may be fixedly connected to another of the glasses frame 271 or the glasses temple 275 at the wiring port 27921 disposed on the side wall.

In an application scenario, the first rotating shaft 2792 may be closed to the glasses frame 271 at the first wiring port 279213, and rotatably connected to the glasses frame 271. The first rotating shaft 2792 may be closed to the glasses temple 275 at the second wiring port 279214, and fixedly connected to the glasses temple 275.

It should be noted that, in the present disclosure scenario, the first rotating shaft 2792 is rotatably connected to the glasses frame 271, and the relative rotation between the glasses frame 271 and the glasses temple 275 may cause the relative movement of the connection wire 277 at the first wiring port 279213. However, since the first wiring port 279213 is disposed on the end surface of the first rotating shaft 2792, similar to the embodiments described above, the end surface of the first rotating shaft 2792 may have a large movement space. When the glasses frame 271 and the glasses temple 275 are folded and rotated and the connection wire 277 near the wire opening 27921 on the end surface is twisted to a certain degree when with the rotation of the first rotating shaft 2792, the twisting may be appropriately buffered by the movement space and the twisting may be changed into movement, thereby improving the stability of the connection wire and extending the service life of the connection wire.

In addition, the first rotating shaft 2792 may be fixedly connected to the glasses temple 275 at the second wiring port 279214. It may be easy to understand that the glasses temple 271 and the first rotating shaft 2792 may be synchronized when the relative rotation between the glasses frame 271 and the glasses temple 275 occurs. Therefore, the connection wire 277 in the shaft wiring channel 2791 may extend into the connection wire 277 of the glasses temple 275 through the second wiring port 279214 without twisting, compressing, or pulling. Therefore, at this time, the second wiring port 279214 may be disposed on the end surface of the first rotating shaft 2792 or on the side wall of the first rotating shaft 2792. The relative rotation between glasses frame 271 and glasses temple 275 may not cause the twisting, compressing, pulling, etc., of the connection wire 277 herein.

In other embodiments, if the first rotating shaft 2792 and the glasses temple 275 are rotatably connected at the second wiring port 279214, the relative rotation between thereof may allow the connection wire 277 to move, which may be constrained by the side wall of the first rotating shaft at the second wiring port 279214, so that the connection wire 277 may be compressed between the side wall of the first rotating shaft and the glasses temple 275.

If the first rotating shaft 2792 is near the glasses temple 275 at the first wiring port 279213 and rotatably connected to the glasses temple 275, the first rotating shaft 2792 may be near the glasses frame 271 at the second wiring port 279214 and fixedly connected to the glasses frame 271. For the same reason, when the glasses frame 271 and the glasses temple 275 are folded, the connection wire 277 inside the rotating shaft wiring channel 2791 and near the first wiring port 279213 and the second wiring port 279214 may be still only slightly twisted or moved.

Referring to FIG. 38, in some embodiments, the rotating shaft 279 may further include a second rotating shaft 2793 coaxial with and spaced from the first rotating shaft 2792.

In the embodiments, the second rotating shaft 2793 may be disposed on a side of the first rotating shaft 2792 near the first wiring port 279213. Certainly, in other embodiments, the second rotating shaft 2793 may also be disposed on a side of the first rotating shaft 2792 closed to the second wiring port 279214.

Figure 40:
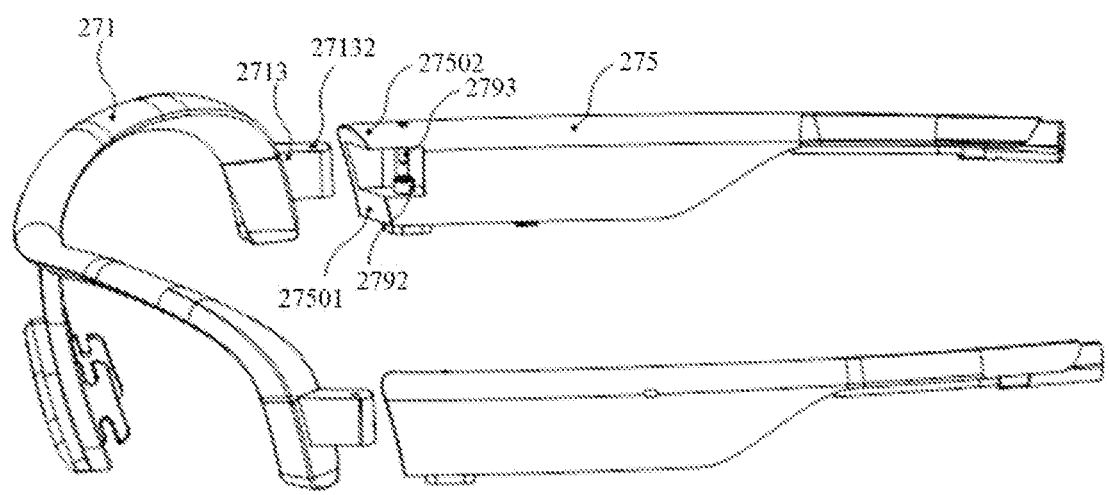
FIG. 40 is a partial exploded view illustrating a loudspeaker according to some embodiments of the present disclosure.

Referring to FIG. 40, FIG. 40 is a partial exploded view illustrating glasses according to some embodiments of the present disclosure. In some embodiments, the glasses frame 271 may include first lug(s) 2713. Specifically, a count of the first lug(s) 2713 may be two that may be respectively disposed at two ends of the glasses frame 271 connecting to the two glasses temples 275 and respectively protrude towards the corresponding glasses temples 275.

The glasses temple 275 may include a second lug 27501 and a third lug 27502 disposed at intervals. As used herein, the second lug 27501 and the third lug 27502 may both face an end of the glasses frame 271 and be connected to the glasses temple 275 at which the lugs are located. In addition, when the user wears the glasses, the second lug 27501 and the third lug 27502 may be connected to a side away from the head of the user, thereby making the glasses more overall and more beautiful in appearance. In an application scenario, the second lug 27501 and the third lug 27502 disposed at intervals may be formed by disposing a groove in the middle of an end of the glasses temple 275 facing the glasses frame 271.

Further, ends of the first rotating shaft 2792 and the second rotating shaft 2793 closed to each other may be both connected to the first lug 2713. Ends of the first rotating shaft 2792 and the second rotating shaft 2793 away from each other may be connected to the second lug 27501 and the third lug 27502, respectively, so as to maintain the first lug 2713 between the second lug 27501 and the third lug 27502.

As used herein, referring to FIG. 38 continuously, in some embodiments, the first wiring port 279213 may be disposed on an end surface of the first rotating shaft 2792 near the second rotating shaft 2793. The second wiring port 279214 may be disposed on a side wall of the first rotating shaft near the second lug 27501. The first rotating shaft may be rotatably connected to the first lug 2713 and fixedly connected to the second lug 27501.

Specifically, in the embodiment, one end of the connection wire 277 inside the rotating shaft wiring channel 2791 may extend from the first wiring port 279213 and pass through an interval between the first rotating shaft 2792 and the second rotating shaft 2793. Further, in an application scenario, the first lug 2713 may be disposed with a wiring channel communicating with the first wiring port 279213, so that the connection wire 277 may further enter the glasses frame 271 through the first lug 2713.

In addition, the other end of the connection wire 277 inside the rotating shaft wiring channel 2791 may extend from the second wiring port 279214. Further, in an application scenario, the third lug 27502 may be disposed with a wiring channel communicating with the second wiring port 279214, so that the connection wire 277 may further enter the glasses temple 275 through the wiring channel of the third lug 27502.

As used herein, the second wiring port 279214 may be a through-hole disposed on a side wall of the first rotating shaft 2792 and communicated with the rotating shaft wiring channel 2791 without penetrating an end of the first rotating shaft 2792. In the embodiments, the second wiring port 279214 may penetrate along the side wall of the first rotating shaft 2792 to an end of the first rotating shaft 2792 away from the first wiring port 279213. It may be easy to understand that, in the embodiments, the second wiring port 279214 may have a larger space. Therefore, when the connection wire 277 is moved due to some reasons, the restriction on the connection wire 277 may be further reduced, and the damage caused by a blocking of the side wall of the first rotating shaft 2792 may be further reduced.

Figure 41:
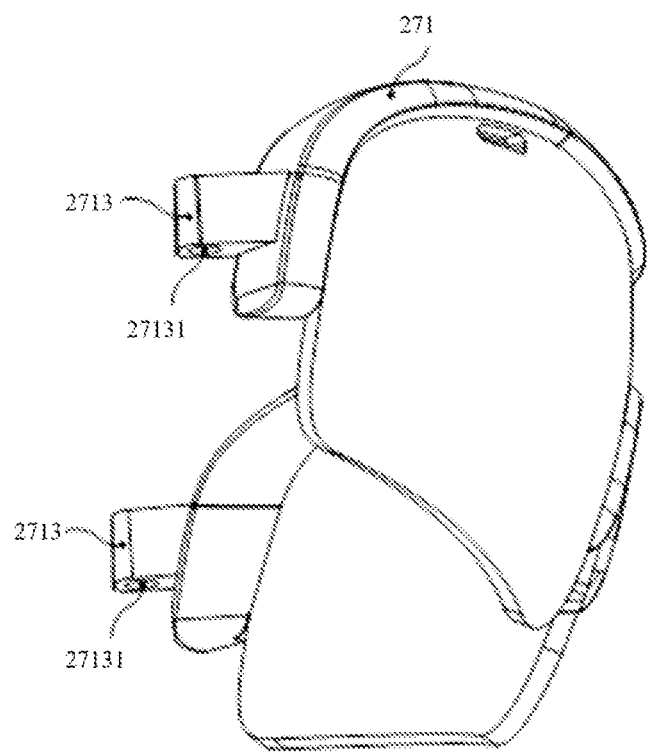
FIG. 41 is a schematic structural diagram illustrating a glasses frame and glasses lens in a loudspeaker according to some embodiments of the present disclosure.
Figure 42:
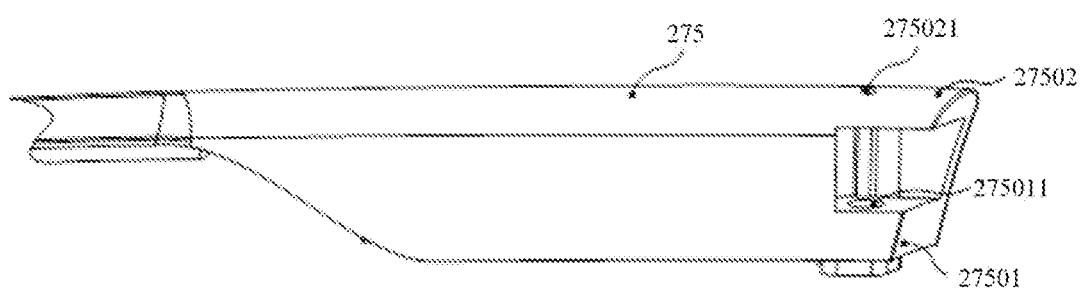
FIG. 42 is a schematic diagram illustrating a partial structure of a glasses temple in a loudspeaker according to some embodiments of the present disclosure.

Referring to FIG. 40, FIG. 41, and FIG. 42 together, FIG. 41 is a schematic structural diagram illustrating a glasses frame and glasses lens in glasses according to some embodiments of the present disclosure. FIG. 42 is a schematic diagram illustrating a partial structure of a glasses temple in glasses according to some embodiments of the present disclosures. In some embodiments, the first lug 2713 and the second lug 27501 may be coaxially disposed with a first accommodating hole 27131 and a second accommodating hole 275011, respectively. Sizes of the first accommodating hole 27131 and the second accommodating hole 275011 may be set to allow the first rotating shaft 2792 to be inserted into the first accommodating hole 27131 from the outside of the glasses temple 275 through the second accommodating hole 275011, such that the first rotating shaft 2792 may be in an interference fit with the second accommodating hole 275011 and in a clearance fit with the first accommodating hole 27131.

Specifically, the second accommodating hole 275011 may be a through-hole penetrating the second lug 27501. The first accommodating hole 27131 may correspond to the second accommodating hole 275011 and penetrate at least a part of the first lug 2713. As used herein, an inner diameter of the first accommodating hole 27131 may be larger than that of the second accommodating hole 275011. An outer diameter of the first rotating shaft 2792 may be between the first accommodating hole 27131 and the second accommodating hole 275011. Therefore, the first rotating shaft 2792 may be fixedly connected to the glasses temple 275 and rotatably connected to the glasses frame 271 so that the glasses frame 271 and the glasses temple 275 may be rotated around the first rotating shaft 2792 to be folded or unfolded.

Further, in some embodiments, the first lug 2713 and the third lug 27502 may be coaxially disposed with a third accommodating hole 27132 and a fourth accommodating hole 275021, respectively. Sizes of the third accommodating hole 27132 and the fourth accommodating hole 275021 may be set to allow the second rotating shaft 2793 to be inserted into the third accommodating hole 27132 from the outside of the glasses temple 275 through the fourth accommodating hole 275021, such that the second rotating shaft 2793 may be in an interference fit with the third accommodating hole 27132 and in a clearance fit with the fourth accommodating hole 275021, or the second rotating shaft 2793 may be in a clearance fit with the third accommodating hole 27132 and in an interference fit with the fourth accommodating hole 275021.

In the embodiments, the third accommodating hole 27132 and the fourth accommodating hole 275021 may be coaxially disposed with the first accommodating hole 27131 and the second accommodating hole 275011. As used herein, the third accommodating hole 27132 may penetrate at least a part of the first lug 2713. In an application scenario, the first accommodating hole 27131 and the third accommodating hole 27132 may be coaxially penetrated. Specifically, as described in the above embodiments, the first lug 2713 of the glasses frame 271 may be disposed with a wiring channel communicating with the first wiring port 279213. The first accommodating hole 27131 and the third accommodating hole 27132 may be respectively disposed on both sides of the wiring channel located inside the first lug 2713 and both penetrate the wiring channel. The fourth accommodating hole 275021 may penetrate the third lug 27502. As used herein, the outer diameter of the second rotating shaft 2793 may be between the inner diameters of the third accommodating hole 27132 and the fourth accommodating hole 275021. The inner diameter of the third accommodating hole 27132 may be larger than that of the fourth accommodating hole 275021. Alternatively, the inner diameter of the fourth accommodating hole 275021 may be larger than that of the third accommodating hole 27132. Therefore, the second rotating shaft 2793 may be fixedly connected to the glasses temple 275 and rotatably connected to the glasses frame 271, or the second rotating shaft 2793 may be fixedly connected to the glasses frame 271 and rotatably connected to the glasses temple 275, so that the glasses frame 271 and the glasses temple 275 may be rotated around the first rotating shaft 2792 to be folded or unfolded.

In some embodiments, the second rotating shaft 2793 may be a solid shaft with a diameter less than that of the first rotating shaft 2792. In the wearing state, the second rotating shaft 2793 may be located on the upper side of glasses temple 275, and the first rotating shaft may be located on the lower side of glasses temple 275.

It should be noted that, since the rotating shaft wiring channel 2791 may be disposed inside the first rotating shaft 2792, the outer diameter of the first rotating shaft 2792 may be larger, which may adversely satisfy aesthetic needs of the user. Therefore, in the embodiments, the second rotating shaft 2793 with a smaller outer diameter may be further disposed. When the user wears the glasses, the second rotating shaft 2793 may be disposed on an upper portion that is easily found, and the first rotating shaft 2792 may be disposed on a lower portion that is not easily observed. Since the outer diameter of the second rotating shaft 2793 is smaller, the overall aesthetic effect of the glasses may be improved to a certain extent.

Certainly, in other embodiments, the first rotating shaft 2792 and the second rotating shaft 2793 may also be other cases. For example, the second rotating shaft 2793 may also be a hollow shaft, and the diameter of the second rotating shaft 2793 may be larger than the diameter of the first rotating shaft 2792. Alternatively, in the wearing state, the second rotating shaft 2793 may be disposed on a lower side of the glasses temple 275, and the first rotating shaft 2792 may be disposed on an upper side of the glasses temple 275, etc., which may not be limited herein.

In addition, referring to FIG. 38, a connection between an end surface 27922 of the first rotating shaft 2792 for disposing the first wiring port 279213 and an inner wall surface 27923 of the first rotating shaft 2792 for defining the rotating shaft wiring channel 2791 may be arc-shaped. It may be easy to understand that, when the rotation between the glasses frame 271 and the glasses temple 275 through the rotating shaft 279 occurs, since the first rotating shaft 2792 and the glasses frame 271 are rotatably connected, the connection wire 277 at the first wiring port 279213 may be moved. In the embodiments, the connection between the end surface 27922 of the first rotating shaft 2792 and the inner wall surface 27923 may be arc-shaped. Therefore, when the connection wire 277 at the first wiring port 279213 moves and contacts with the first rotating shaft 2792, the connection wire 277 may be avoided to be cut if the connection is too sharp, thereby further protecting the connection wire 277.

In an application scenario, a connection between the end surface of the first rotating shaft 2792 for disposing the second wiring port 279214 and the inner wall surface 27923 of the first rotating shaft 2792 for defining the rotating shaft wiring channel 2791 may also be arc-shaped. Similarly, in this way, the connection wire 277 may be further protected.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, all aspects of the present disclosure may be performed entirely by hardware, may be performed entirely by software (including firmware, resident software, microcode, etc.), or may be performed by a combination of hardware and software. The above hardware or software can be referred to as "data block", "module", "engine", "unit", "component" or "system". Furthermore, aspects of the present disclosure may take the form of a computer program product embodied in one or more computer-readable media having computer-readable program code embodied thereon.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this disclosure method does not mean that the present disclosure object requires more features than the features mentioned in the claims. Rather, claimed subject matter may lie in less than all features of a single foregoing disclosed embodiment.

In some embodiments, numbers describing the number of components and attributes are used. Accordingly, in some embodiments, the numerical data used in the description and claims are approximate values, and the approximate values may change according to the required characteristics of individual embodiments. In some embodiments, the numerical data should consider the prescribed effective digits and adopt the method of general digit retention. Although the numerical ranges and data used to confirm the breadth of the range in some embodiments of the present disclosure are approximate values, in specific embodiments, the setting of such values is as accurate as possible within the feasible range.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A loudspeaker, comprising:
   an earphone core configured to convert an electric signal into a vibration signal;
   an auxiliary function module, including a switch or a microphone, configured to receive an auxiliary signal and execute an auxiliary function; and
   a flexible circuit board configured to electrically connect to an audio signal wire and an auxiliary signal wire of an external control circuit, and electrically connect the audio signal wire and the auxiliary signal wire with the earphone core and the auxiliary function module, respectively;
   a core housing configured to accommodate the earphone core, the auxiliary function module, and the flexible circuit board; and
   a fixing mechanism connected with the core housing and configured to support and maintain a position of the core housing, a battery assembly and a control circuit being disposed in the fixing mechanism;
   wherein:
   the fixing mechanism is a rear hook, a rear hook wire being disposed in the rear hook, one end of the rear hook wire being electrically connected to the battery assembly and the other end of the rear hook wire being electrically connected to the control circuit, and
   the fixing mechanism further includes at least one ear hook, one end of the ear hook being connected to the core housing and the other end of the ear hook being connected to the rear hook, a plurality of ear hook wires being disposed in the ear hook, the ear hook wire including the audio signal wire and the auxiliary signal wire, wherein the audio signal wire and the auxiliary signal wire are configured to be electrically connected to the control circuit, and the control circuit is electrically connected to the battery assembly through the flexible circuit board to control closing or opening of current.

2. The loudspeaker of claim 1, wherein:
   the flexible circuit board at least comprises a plurality of first pads and a plurality of second pads,
   at least one first pad of the plurality of first pads is electrically connected to the audio signal wire, the at least one first pad being electrically connected to at least one second pad of the plurality of second pads via a first flexible lead on the flexible circuit board,
   the at least one second pad is electrically connected to the earphone core via the external wire, and
   at least another one first pad of the plurality of first pads is electrically connected to the auxiliary signal wire and the auxiliary function module via a second flexible lead on the flexible circuit board.

3. The loudspeaker of claim 1, wherein:
   the auxiliary function module is configured to implement one or more functions of an image function, a voice function, an auxiliary control function, and a switch control function, and
   the auxiliary function module at least includes a first auxiliary function module and a second auxiliary function module.

4. The loudspeaker of claim 3, wherein:
   the flexible circuit board at least includes a main circuit board and a first branch circuit board,
   the first branch circuit board is connected to the main circuit board, away from the main circuit board, and extends along one end of the main circuit board,
   the first auxiliary function module is disposed on the main circuit board, and
   the second auxiliary function module is disposed on the first branch circuit board.

5. The loudspeaker of claim 4, wherein a plurality of first pads are disposed on the main circuit board and a plurality of second pads are disposed on the first branch circuit board.

6. The loudspeaker of claim 4, wherein:
   the flexible circuit board further includes a second branch circuit board,
   the second branch circuit board is connected to the main circuit board, away from the main circuit board, extends along the other end of the main circuit board, and is spaced apart from the first branch circuit board,
   the auxiliary function module further includes a third auxiliary function module, and
   the third auxiliary function module is disposed on the second branch circuit board.

7. The loudspeaker of claim 6, wherein:
   a plurality of first pads are disposed on the main circuit board,
   at least one second pad of a plurality of second pads is disposed on the first branch circuit board, and other second pads of the plurality of second pads are disposed on the second branch circuit board.

8. The loudspeaker of claim 1, wherein the earphone core includes: a magnetic circuit component configured to provide a magnetic field; a vibration component, the vibration component comprising a coil and an inner lead, the coil being located in the magnetic field, the inner lead being electrically connected to the coil, the coil receiving an audio current via the inner lead and converting the audio current into a mechanical vibration signal under an action of the magnetic field; the external wire that transmits the audio current to the coil, one end of the external wire being electrically connected to a second pad, other end of the external wire being electrically connected to the inner lead; and a bracket that accommodates the magnetic circuit component and the vibration component, the bracket including a wiring groove, and the external wire and/or the inner lead being disposed inside the wiring groove.

9. The loudspeaker of claim 8, wherein the inner lead and the external wire are welded to each other, a welding position being located inside the wiring groove.

10. The loudspeaker of claim 8, wherein the vibration component further at least includes a first vibration transmission component and a second vibration transmission component, wherein:
the first vibration transmission component is disposed above the second vibration transmission component,
the first vibration transmission component and the second vibration transmission component form a composite vibration structure stacked up and down to generate at least two resonance peaks, and
the coil is fixed under the second vibration transmission component.

11. The loudspeaker of claim 10, wherein:
the first vibration transmission component has greater elasticity relative to the second vibration transmission component, and
a thickness of the first vibration transmission component is less than a thickness of the second vibration transmission component.

12. The loudspeaker of claim 10, wherein:
the first vibration transmission component includes a first circular ring and at least two first supporting rods converging toward a center of the first circular ring, and the second vibration transmission component includes a second circular ring and at least two second supporting rods converging toward a center of the second circular ring.

13. The loudspeaker of claim 12, wherein the first supporting rod and the second supporting rod are staggered.

14. The loudspeaker of claim 1, wherein:
the earphone core includes a vibration component, wherein the vibration component is connected to the core housing and configured to transmit the vibration signal to the core housing, and
the core housing has a fitting surface in contact with a human body and configured to press the fitting surface against the human body at a predetermined pressure to transmit the vibration signal to the human body.

15. The loudspeaker of claim 1, wherein the fixing mechanism includes at least one of a pair of glasses, a hat, a headwear,
a rear hook, or other headwear products.

16. The loudspeaker of claim 1, wherein the fixing mechanism further includes a circuit housing, the circuit housing being disposed between the ear hook and the rear hook for accommodating the battery assembly or the control circuit.

17. The loudspeaker of claim 1, wherein:
the fixing mechanism is a pair of glasses,
the fixing mechanism includes at least one rotating shaft, the at least one rotating shaft being configured to connect a glasses frame and glasses temples, wherein the glasses frame and the glasses temples are configured to rotate around the rotating shaft, and the rotating shaft includes a rotating shaft wiring channel along an axis of the rotating shaft, and
a connecting wire is disposed in the fixing mechanism, the connecting wire being an electrical connecting wire, the connecting wire passing through the rotating shaft wiring channel, and both ends of the connecting wire extending into the glasses frame and the glasses temples, respectively.

18. The loudspeaker of claim 17, wherein:
the control circuit and the battery assembly are respectively accommodated in the glasses temples on both sides of the pair of glasses, the connecting wire in the glasses frame being electrically connected to the control circuit and the battery assembly, and
the connecting wire in the glasses temples include the audio signal wire and the auxiliary signal wire.

* * * * *